(12) United States Patent
Welch et al.

(10) Patent No.: US 7,519,246 B2
(45) Date of Patent: Apr. 14, 2009

(54) PHOTONIC INTEGRATED CIRCUIT (PIC) CHIPS

(75) Inventors: David F. Welch, Menlo Park, CA (US); Vincent G. Dominic, Fremont, OH (US); Fred A. Kish, Jr., Palo Alto, CA (US); Mark J. Missey, San Jose, CA (US); Radhakrishnan L. Nagarajan, Cupertino, CA (US); Atul Mathur, San Jose, CA (US); Frank H. Peters, San Jose, CA (US); Robert B. Taylor, Windsor Mill, MD (US); Matthew L. Mitchell, Bethesda, MD (US); Alan C. Nilsson, Mountain View, CA (US); Stephen G. Grubb, Ellicott City, MD (US); Richard P. Schneider, Mountain View, CA (US); Charles H. Joyner, Sunnyvale, CA (US); Jonas Webjorn, Redwood City, CA (US); Ting-Kuang Chiang, Saratoga, CA (US); Robert Grencavich, Kempton, PA (US); Vinh D. Nguyen, Bethlehem, PA (US); Donald J. Pavinski, Jr., Alburtis, PA (US); Marco E. Sosa, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 11/869,420

(22) Filed: Oct. 9, 2007

(65) Prior Publication Data

US 2008/0031626 A1  Feb. 7, 2008

Related U.S. Application Data

(60) Division of application No. 10/267,331, filed on Oct. 8, 2002, now Pat. No. 7,283,694, and a continuation of application No. 10/317,935, filed on Dec. 11, 2002, which is a continuation of application No. 10/267,331.

(60) Provisional application No. 60/328,207, filed on Oct. 9, 2001, provisional application No. 60/328,332, filed on Oct. 9, 2001, provisional application No. 60/328,568, filed on Oct. 9, 2001.

(51) Int. Cl.
  *G02B 6/12* (2006.01)
(52) U.S. Cl. ............................ 385/14; 398/91; 372/50; 372/26; 372/32
(58) Field of Classification Search ................... 385/14, 385/31, 37, 34, 33, 46; 372/50, 32, 30, 26; 398/91, 87, 9
See application file for complete search history.

(56) References Cited

U.S. PATENT DOCUMENTS 4,835,782 A  5/1989  Kaede et al.

(Continued)

FOREIGN PATENT DOCUMENTS

EP  0639876  2/1995

(Continued)

OTHER PUBLICATIONS

Green et al., "WDW Protocol-Transparent Distance Extension Using R2 Remodulation", IEEE Journal on Selected Areas in Communications, vol. 14(5), pp. 962-967, Jun. 1996.

(Continued)

*Primary Examiner*—James P Hughes
(74) *Attorney, Agent, or Firm*—W. Douglas Carothers, Jr.; Ross M. Carothers

(57) ABSTRACT

A photonic integrated circuit (PIC) chip comprising an array of modulated sources, each providing a modulated signal output at a channel wavelength different from the channel wavelength of other modulated sources and a wavelength selective combiner having an input optically coupled to received all the signal outputs from the modulated sources and provide a combined output signal on an output waveguide from the chip. The modulated sources, combiner and output waveguide are all integrated on the same chip.

19 Claims, 33 Drawing Sheets

U.S. PATENT DOCUMENTS

| | | | |
|---|---|---|---|
| 4,954,786 A | 9/1990 | Yamakawa et al. |
| 5,078,516 A | 1/1992 | Kapon et al. |
| 5,115,444 A | 5/1992 | Kirby et al. |
| 5,199,092 A | 3/1993 | Stegmueller |
| 5,288,659 A | 2/1994 | Koch et al. |
| 5,338,223 A | 8/1994 | Melatti et al. |
| 5,341,391 A | 8/1994 | Ishimura |
| 5,351,262 A | 9/1994 | Poguntke et al. |
| 5,394,489 A | 2/1995 | Koch |
| 5,418,183 A | 5/1995 | Joyner et al. |
| 5,428,225 A | 6/1995 | Silva et al. |
| 5,450,431 A | 9/1995 | Glance et al. |
| 5,483,372 A | 1/1996 | Green, Jr. |
| 5,488,507 A | 1/1996 | Nishimura |
| 5,530,580 A | 6/1996 | Thompson et al. |
| 5,536,085 A | 7/1996 | Li et al. |
| 5,550,666 A | 8/1996 | Zirngibl |
| 5,561,682 A | 10/1996 | Aoki et al. |
| 5,600,742 A | 2/1997 | Zirngibl |
| 5,612,968 A | 3/1997 | Zah |
| 5,617,234 A | 4/1997 | Koga et al. |
| 5,629,241 A | 5/1997 | Matloubian et al. |
| 5,631,768 A | 5/1997 | Bruno |
| 5,663,823 A | 9/1997 | Suzuki |
| 5,663,824 A | 9/1997 | Koch et al. |
| 5,673,141 A | 9/1997 | Gambini |
| 5,720,893 A | 2/1998 | Ben-Michael et al. |
| 5,745,270 A | 4/1998 | Kock |
| 5,745,613 A | 4/1998 | Fukuchi et al. |
| 5,784,183 A | 7/1998 | Aoki et al. |
| 5,787,106 A | 7/1998 | Tabuchi et al. |
| 5,790,729 A | 8/1998 | Pologe et al. |
| 5,798,859 A | 8/1998 | Colbourne et al. |
| 5,805,755 A | 9/1998 | Amersfoort et al. |
| 5,825,792 A | 10/1998 | Villeneuve et al. |
| 5,870,512 A | 2/1999 | Koch et al. |
| 5,889,906 A | 3/1999 | Chen |
| 5,891,748 A | 4/1999 | Sakata |
| 5,894,362 A | 4/1999 | Onaka et al. |
| 5,913,000 A | 6/1999 | Doerr et al. |
| 5,917,625 A | 6/1999 | Ogusu et al. |
| 5,946,331 A | 8/1999 | Amersfoort et al. |
| 5,949,562 A | 9/1999 | Kubota et al. |
| 5,960,014 A | 9/1999 | Li et al. |
| 5,963,686 A | 10/1999 | Zheng et al. |
| 6,005,995 A | 12/1999 | Chen et al. |
| 6,026,107 A | 2/2000 | Huang |
| 6,031,851 A | 2/2000 | Shimizu et al. |
| 6,055,078 A | 4/2000 | Chen et al. |
| 6,061,158 A | 5/2000 | DeLong |
| 6,101,210 A | 8/2000 | Bestwick et al. |
| 6,104,516 A | 8/2000 | Majima |
| 6,111,674 A | 8/2000 | Bhagavatula |
| 6,118,562 A | 9/2000 | Lee et al. |
| 6,120,190 A | 9/2000 | Leard et al. |
| 6,141,477 A | 10/2000 | Kitamura |
| 6,154,474 A | 11/2000 | Yoshida |
| 6,162,655 A | 12/2000 | Johnson et al. |
| 6,172,782 B1 | 1/2001 | Kobayashi |
| 6,174,748 B1 | 1/2001 | Jeon et al. |
| 6,181,849 B1 | 1/2001 | Lin et al. |
| 6,186,631 B1 | 2/2001 | Behringer et al. |
| 6,188,499 B1 | 2/2001 | Majima |
| 6,233,262 B1 | 5/2001 | Mesh et al. |
| 6,240,109 B1 | 5/2001 | Shieh |
| 6,261,857 B1 | 7/2001 | Alam et al. |
| 6,271,947 B1 | 8/2001 | Iannone et al. |
| 6,275,317 B1 | 8/2001 | Doerr et al. |
| 6,278,170 B1 | 8/2001 | Komatsu |
| 6,291,813 B1 | 9/2001 | Ackerman et al. |
| 6,301,031 B2 | 10/2001 | Li |
| 6,310,719 B1 | 10/2001 | Goldstein et al. |
| 6,323,987 B1 | 11/2001 | Rinaudo et al. |
| 6,369,923 B1 | 4/2002 | Kuo et al. |
| 6,424,439 B1 | 7/2002 | King |
| 6,466,707 B1 | 10/2002 | Dawes et al. |
| 6,501,773 B1 | 12/2002 | Volz et al. |
| 6,501,866 B2 | 12/2002 | Thomas |
| 6,512,864 B1 | 1/2003 | Lin et al. |
| 6,590,693 B2 | 7/2003 | Ash et al. |
| 6,613,596 B2 | 9/2003 | Bloemer et al. |
| 6,785,306 B2 | 8/2004 | Kai et al. |
| 6,904,205 B2 | 6/2005 | Beralo et al. |
| 6,985,648 B2 | 1/2006 | Kish, Jr. et al. |
| 7,043,109 B2 | 5/2006 | Kish, Jr. et al. |
| 7,058,246 B2 | 6/2006 | Joyner et al. |
| 7,062,114 B2 | 6/2006 | Webjorn et al. |
| 7,079,715 B2 | 7/2006 | Kish, Jr. et al. |
| 7,116,851 B2 | 10/2006 | Welch et al. |
| 7,158,699 B2 | 1/2007 | Welch et al. |
| 2002/0126386 A1 | 9/2002 | Jordan et al. |
| 2002/0171890 A1 | 11/2002 | Lin et al. |
| 2003/0095737 A1 | 5/2003 | Welch et al. |
| 2003/0099018 A1 | 5/2003 | Singh et al. |
| 2004/0067006 A1 | 4/2004 | Welch et al. |
| 2005/0063636 A1 | 3/2005 | Joyner et al. |
| 2005/0094926 A1 | 5/2005 | Kish, Jr. et al. |
| 2005/0094927 A1 | 5/2005 | Kish, Jr. et al. |
| 2005/0100345 A1 | 5/2005 | Kish, Jr. et al. |

FOREIGN PATENT DOCUMENTS

| | | |
|---|---|---|
| EP | 0671792 A1 | 9/1995 |
| JP | 58092289 | 6/1983 |
| WO | 0052789 | 9/2000 |
| WO | 01/17076 | 3/2001 |
| WO | 0116642 | 3/2001 |
| WO | 0118919 | 3/2001 |
| WO | 0124328 | 4/2001 |
| WO | 01/63962 | 8/2001 |
| WO | 0163963 | 8/2001 |

OTHER PUBLICATIONS

Sasaki et al., "Selective MOVPE Growth and Its Application to Semiconductor Photonic Integrated Circuits", Electronics & Communications in JP, vol. 76(4), pp. 1-11, Apr. 1, 1993.

Kudo et al., "1.55-mm Wavelength . . . EA-Modulator", IEEE Photonics Technology Letters, vol. 12(3), pp. 242-244, Mar. 2000.

Young et al., "A 16×1 Wavelength . . . Modulators", IEEE Photonics Technology Letters, vol. 5(8), pp. 908-910, Aug. 1, 1993.

Kameda et al., "A DBR Laser . . . Linewidth", IEEE Photonics Technology Letters, vol. 5(6), pp. 608-610, Jun. 1, 1993.

M Smit et al., "Photonic Integrated Circuits for Advanced Communication Networks", International Journal of Optoelectronics, vol. 12(1), pp. 25-30, 1998.

J. Park et al., "New Design for Low-Loss Star Couplers and Arrayed Waveguide Grating Devices", IEEE Photonics Technology Letters, vol. 14(5), pp. 651-653, May 2002.

Y. Yokoyama et al., "Multi-Wavelength Locker Integrated Wide-Band Wavelength-Selectable Light Source Module", NEC Research & Development, Paper 13, pp. 158-11, Feb. 2002.

Thomas L. Koch et al., "Semiconductor Lasers for Coherent Optical Fiber Communications", Journal of Lightwave Technology, vol. 8(3), pp. 274-293, Mar. 1990.

M. G. Young, "A 16×1 Wavelength Division Multiplexer with Integrated Distributed Bragg Reflector Lasers and Electroabsorption Modulators", IEEE Photonics Technology Letters, vol. 5, No. 8, pp. 908-910, Aug. 1993.

D.A. Ackerman, et al., "A Practical DBR Laser Based Wavelength Selectable DWDM Source", IEEE LEOS Newsletter, pp. 7-9, Oct. 2001.

M. G. Young et al., "Six Wavelength Laser Array With Integrated Amplifier and Modulator", Electronic Letters, vol. 32 (21), pp. 1835-1836, Oct. 12, 1995.

Chung-en Zah et al., "Multiwavelength DFB Laser Arrays With Integrated Combiner and Optical Amplifier for WDM Optical Networks", IEEE Journal of Selected Topics on Quantum Electronics, vol. 3(2), pp. 584-597, Apr. 1997.

H. Lee, et al., "Multichannel Wavelength Locking Using Transmission Peaks of an AWG for Multichannel Optical Transmission Systems", IEEE Photonics Technology Letters, vol. 10, No. 2, pp. 276-278, Feb. 1998.

Raybon et al., "Reconfigurable Optoelectronic Wavelength Translation Based on an Integrated Electroabsorption Modulated Laser Array", IEEE Photonics Technology Letters, vol. 10(2), pp. 215-217, Feb. 1998.

Masaki Kohtoku, et al., "Polarization Independent Semiconductor Arrayed Waveguide Gratings Using a Deep-Ridge Waveguide Structure", IEICE Trans. Electron., vol. E81-C, No. 8, pp. 1195-1204, Aug. 1998.

S. Menezo, et al., "10-Wavelength 200-Gz Channel Spacing Emitter Integrating DBR Lasers with a PHASAR on InP for WDM Applications", IEEE Photonics Technology Letters, vol. 11, No. 7, pp. 785-787, Jul. 1999.

Kudo et al., "1.55-µm Wavelength-Selectable Microarray DFB-LD's with Monolithically Integrated MMI Combiner, SOA, and EA-Modulator", IEEE Photonics Technology Letters, vol. 12(3), pp. 242-244, Mar. 2000.

K. Affolter, "Integrating Active Components Improves System Design", WDW Solutions, pp. 65-67, Jun. 2001.

D. Johnson et al., "Spot-Size-Converted Devices for Uncooled Passive Alignment", IEEE LEOS Newsletter, pp. 3-7, Aug. 2001.

Beck Mason, et al., "40-Gb/s Tandem Electroabsorption Modulator", IEEE Photonics Technology Letters, vol. 14, No. 1, pp. 27-29, Jan. 2002.

Y. Suzaki et al., "Multi-Channel Modulation in a DWDM Monolithic Photonic Integrated Circuit", 14th Indium Phosphide and Related Materials Conference Proceedings, pp. 681-683.

K. J. Park, et al., "A Multi-Wavelength Locker for WDM System", Conference on Optical Fiber Communication (OFC 2000), pp. WE 4-1 to WE 4-3, Wednesday, Mar. 8, 2000.

JDS Uniphase Product Bulletin, "Fabry-Perot Wavelocker", pp. 1-4, Nov. 2000.

K. Inoue, "Technique to Compensate Waveform Distortion in a Gain-Saturated Semiconductor Optical Amplifier Using a Semiconductor Saturable Absorber", Electronics Letters, Vo. 34(4), pp. 376-378, Feb. 1998.

M. Bouda, "Compact High-Power Wavelength Selectable Lasers for WDM Applications", Conference on Optical Fiber Communication, Technical Digest Series, vol. 1, pp. 178-180, Mar. 7-10, 2000.

John E. Johnson et al., "Fully Stabilized Electroabsorption-Modulated Tunable DBR Laser Transmitter for Long-Haul Optical Communications", IEEE Journal on Selected Topics in Quantum Electronics, vol. 7(2), pp. 168-177, Mar./Apr. 2001.

Zimgibl et al., "High Performance, 12 Frequency Optical Multichannel Controller", Electronics Letters, vol. 30(9), pp. 700-701, Apr. 28, 1994.

Amersfoort et al., "Low-Loss Phased-Array Based 4-Channel Wavelength Demultiplexer Integrated with Photodetectors", IEEE Photonics Technology Letters, vol. 6(1), Jan. 1994.

Kitamura et al., "Polarization-Insensitive Semiconductor Optical Amplifier Array Grown by Selective MOVPE", IEEE Photonics Technology Letters, vol. 6(2), Feb. 1994.

C. H. Joyner et al., "An 8-Channel Digitally Tunable Transmitter with Electroabsorption Modulated Output by Selective-Area Epitaxy", IEEE Photonics Technology Letters, vol. 7(9), pp. 1013-1015, Sep. 1995.

D. Wolfson, et al., "Detailed Theoretical Investigation of the Input Power Dynamic Range for Gain-Clamped Semiconductor Optical Amplifier Gates at 10Gb/s", IEEE Photonic Technology Letters, vol. 10(9), pp. 1241-1243, Sep. 1998.

Vreeburg et al., "A Low-Loss 16-Channel Polarization Dispersion Compensated PHASAR Demultiplexer", IEEE Photonics Technology Letters, vol. 10(3), pp. 382-384, Mar. 1998.

C. H. Joyner et al., "Low-Threshold Nine-Channel Waveguide Grating Router-Based Continuous Wave Transmitter", Journal of Lightwave Technology, vol. 17(4), pp. 647-651, Apr. 1999.

Moller et al., "Mode Stabilization Technique for the Multifrequency Laser", 25th Optical Fiber Communication Conference, Technical Digest, pp. 187-189, Mar. 7, 2000.

Sakano et al., "Tunable DFB Laser with a Striped Thin-Film Heater", IEEE Photonic Technology Letters, vol. 4(4), Apr. 1992.

K. Nakamura, et al., "Buried Heterostructure DFB Laser Integrated with Ridge Waveguide Electroabsorption Modulator with Over 20 GHz Bandwidth", European Conference on Optical Communications (ECOC '97), Conference Pub. No. 448, pp. 175-178, Sep. 22-25, 1997.

M. Kohtoku et al., "InP-Based 64-Channel Arrayed Waveguide Grating with 50 GHz Channel spacing and up to -20dB Crosstalk", Electronic Letters, vol. 33(21), pp. 1786-1787, Oct. 9, 1997.

R. A. Salvatore, et al., "Electroabsorption Modulated Laser for Long Transmission Spans", IEEE Journal of Quantum Electronics, vol. 38(5), pp. 464-476, May 2002.

P. A. Kirby, "Multichannel Wavelength-Switched Transmitters and Receivers—New Component Concepts for Broad-Band Networks and Distributed Switching Systems", Journal of Lightwave Technology, vol. 8(2), pp. 202-211, Feb. 1990.

Charles H. Henry, et al., "Four-Channel Wavelength Division Multiplexers and Bandpass Filters Based on Elliptical Bragg Reflectors", Journal of Lighwave Technology, vol. 8(5), pp. 748-755, May 1990.

J. B. D. Soole, et al., "Monolithic InP/InGaAsP/InP Grating Spectrometer for the 1.48-1.56 µm Wavelength Range", Applied Physics Letters, vol. 58(18), pp. 1949-1951, May 6, 1991.

M. Zingibl, et al., "Polarization Independent 8×8 Waveguide Grating Multiplexer on InP", Electronics Letters, vol. 29(2), pp. 201-202, Jan. 21, 1993.

M. A. Newkirk et al., "1.5 µm Multiquantum-Well Semiconductor Optical Amplifier with Tensile and Compressively Strained Wells for Polarization-Independent Gain", IEEE Photonics Technology Letters, vol. 4(4), pp. 406-408, Apr. 1993.

P. Doussiere, et al., "1.55 µm Polarization Independent Semiconductor Optical Amplifier with 25 dB Fiber to Fiber Gain", IEEE Photonics Technology Letters, vol. 6(2), pp. 170-172, Feb. 1994.

B. Glance, et al., "Applications of the Integrated Waveguide Grating Router", Journal of Lightwave Technology, vol. 12(6), pp. 957-962, Jun. 1994.

Lucas B. Soldano, et al., "Optical Multi-Mode Interference Devices Based on Self-Imaging: Principles and Applications", Journal of Lightwave Technology, vol. 13(4), pp. 615-627, Apr. 1995.

J. B. D. Soole, et al., "Polarization-Independent InP Arrayed Waveguide Filter Using Square Cross-Section Waveguides", Electronics Letters, vol. 32(4), pp. 323-324, Feb. 15, 1996.

H. Tanobe, et al., "Temperature Insensitive Arrayed Waveguide Gratings in InP Substrates", IEEE Photonic Technology Letters, vol. 10(2), pp. 235-237.

J. Sarathy, et al., "Polarization Insensitive Waveguide Grating Routers in InP", IEEE Photonics Technology Letters, vol. 10(12), pp. 1763-1765, Dec. 1998.

T. Coroy et al., "Active Wavelength Measurement system Using an InGaAs-InP Quantum-Well Electroabsorption Filtering Detector", IEEE Photonics Technology Letters, vol. 8, No. 12, pp. 1686-1688, Dec. 1996.

B. Pezeshki, et al., "12 nm Tunable WDM Source Using an Integrated Laser Array", Electronics Letters, vol. 36, No. 9, pp. 788-789.

D. Alfano, "System-on-chip Technology Adds Options for Laser Driver Control", WDM Solutions, pp. 43-48, Nov. 2001.

K. Inoue et al., "Signal Improvement Effect in O/E-E/O Conversion Using an Electro-Absorption (EA) Modulator", IEEE Photonics Technology Letters, vol. 9(1), pp. 109-111, Jan. 1997.

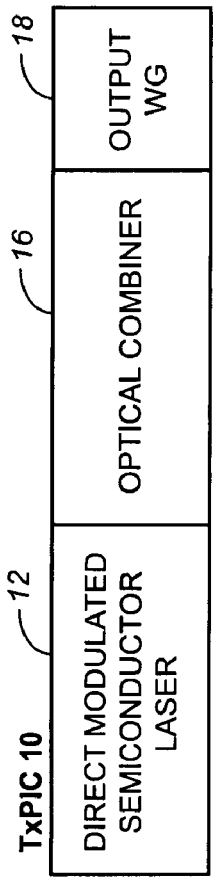
*FIG._1A*
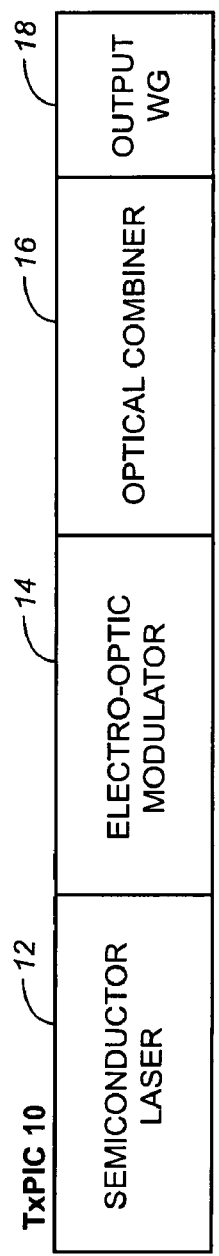
*FIG._1B*
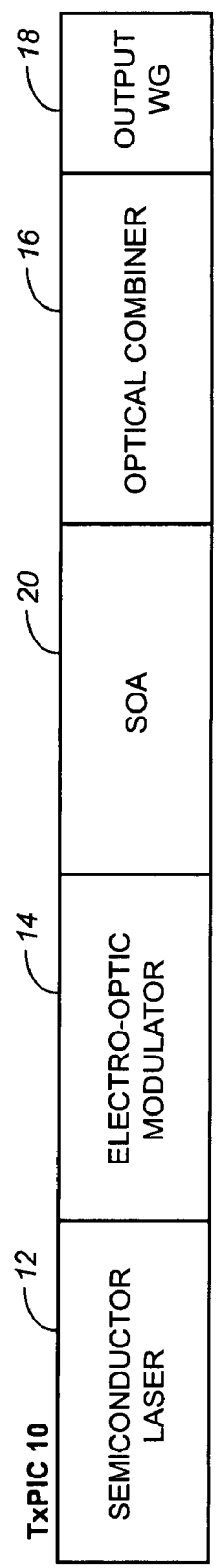
*FIG._2*
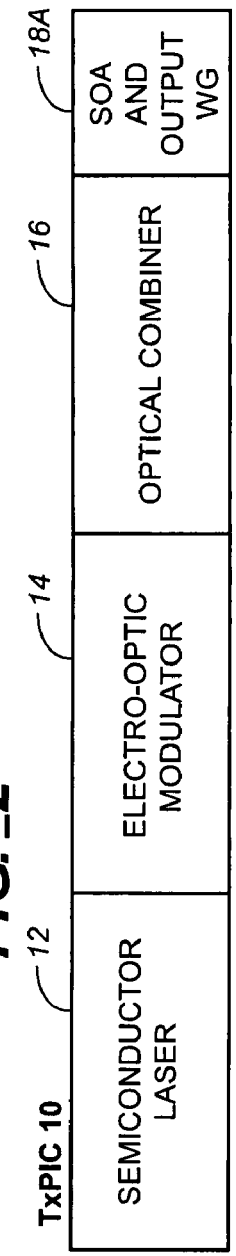
*FIG._3*

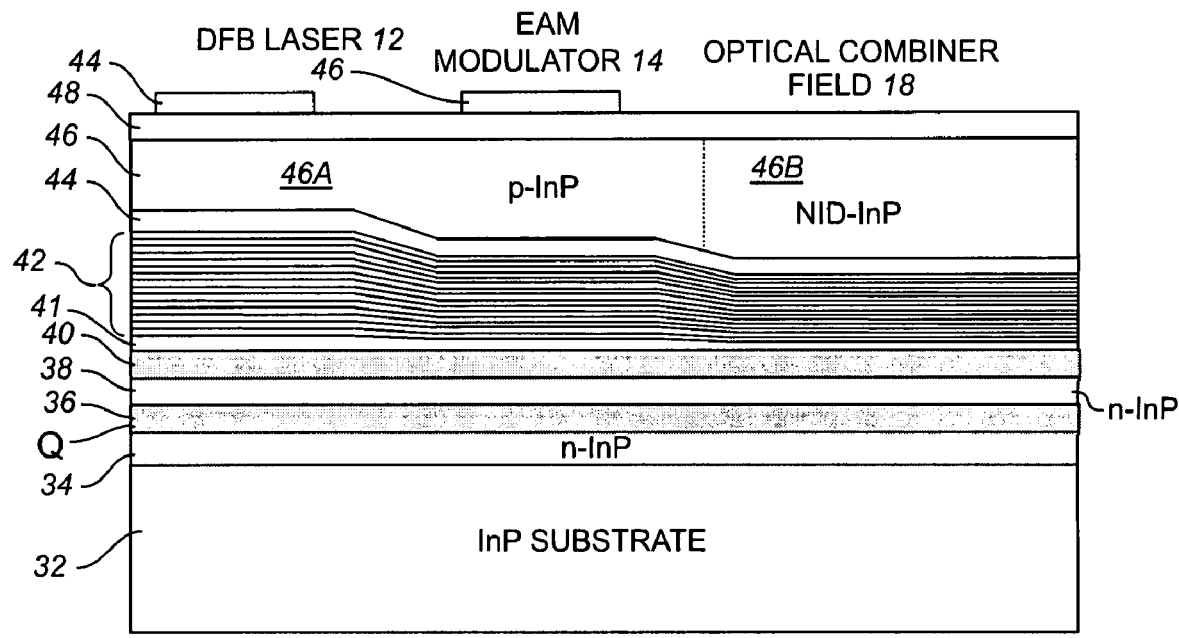
FIG._4
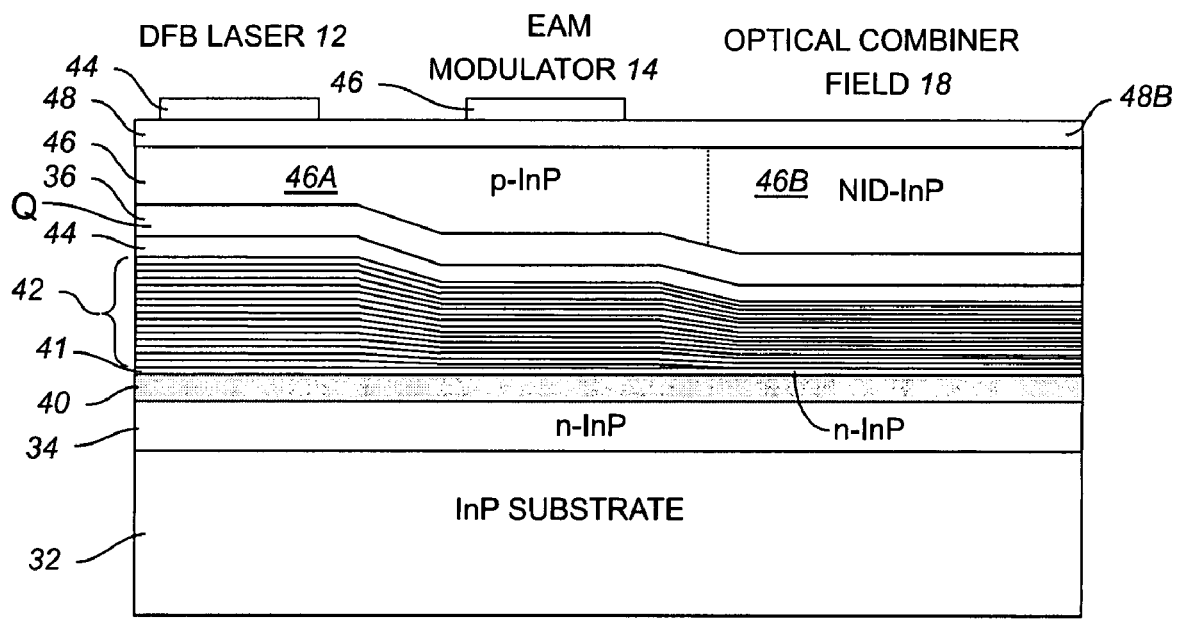
FIG._5

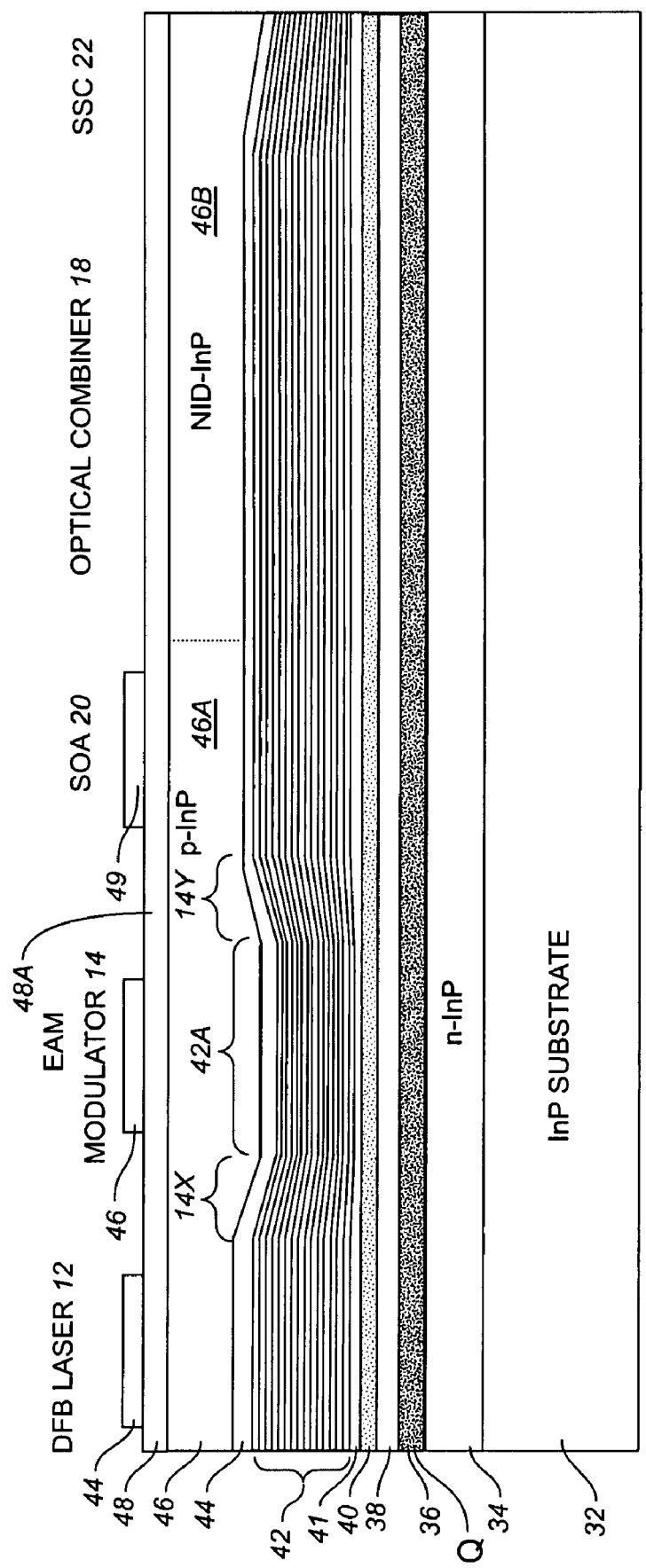
FIG._6

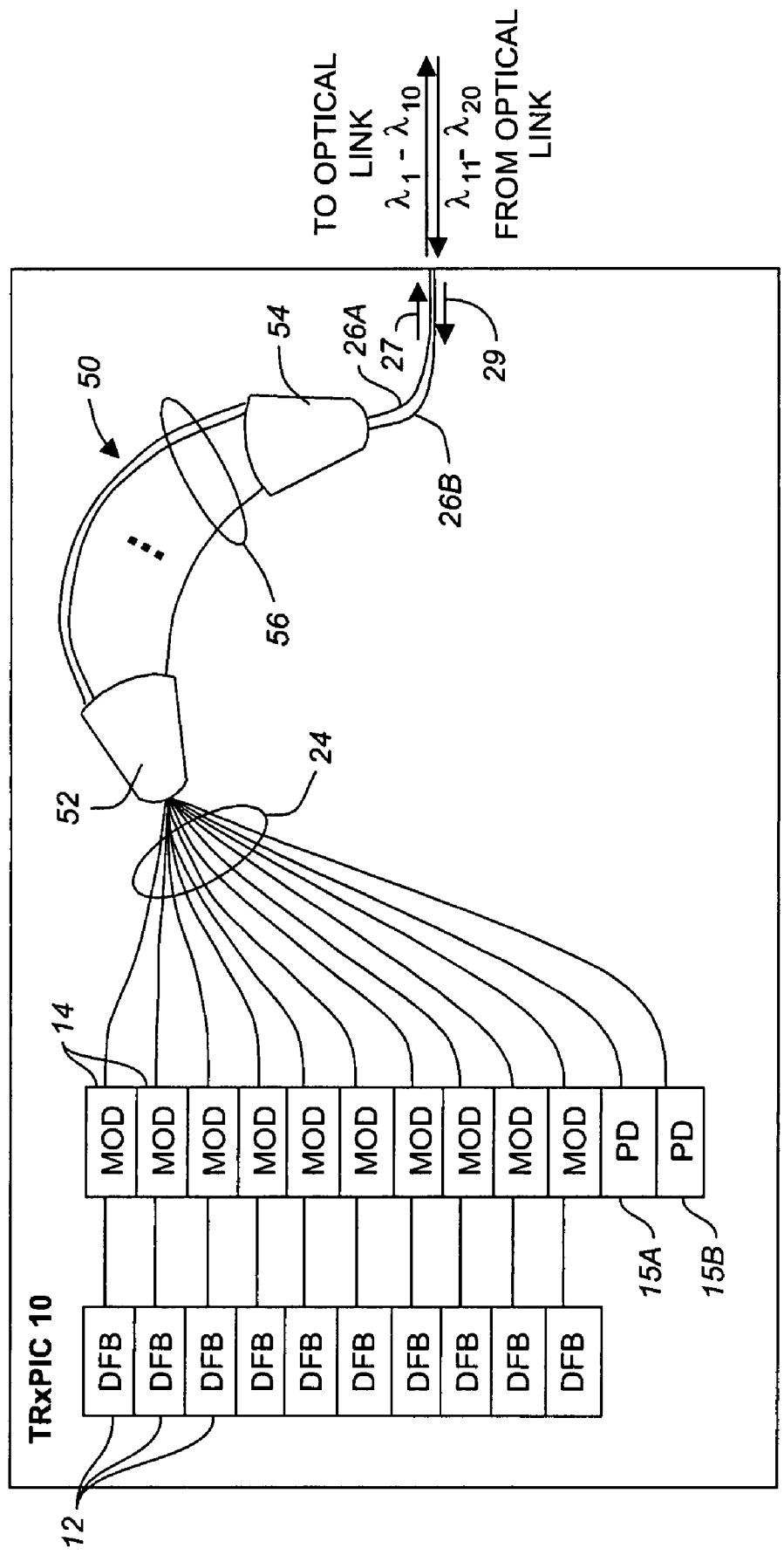
FIG._7A

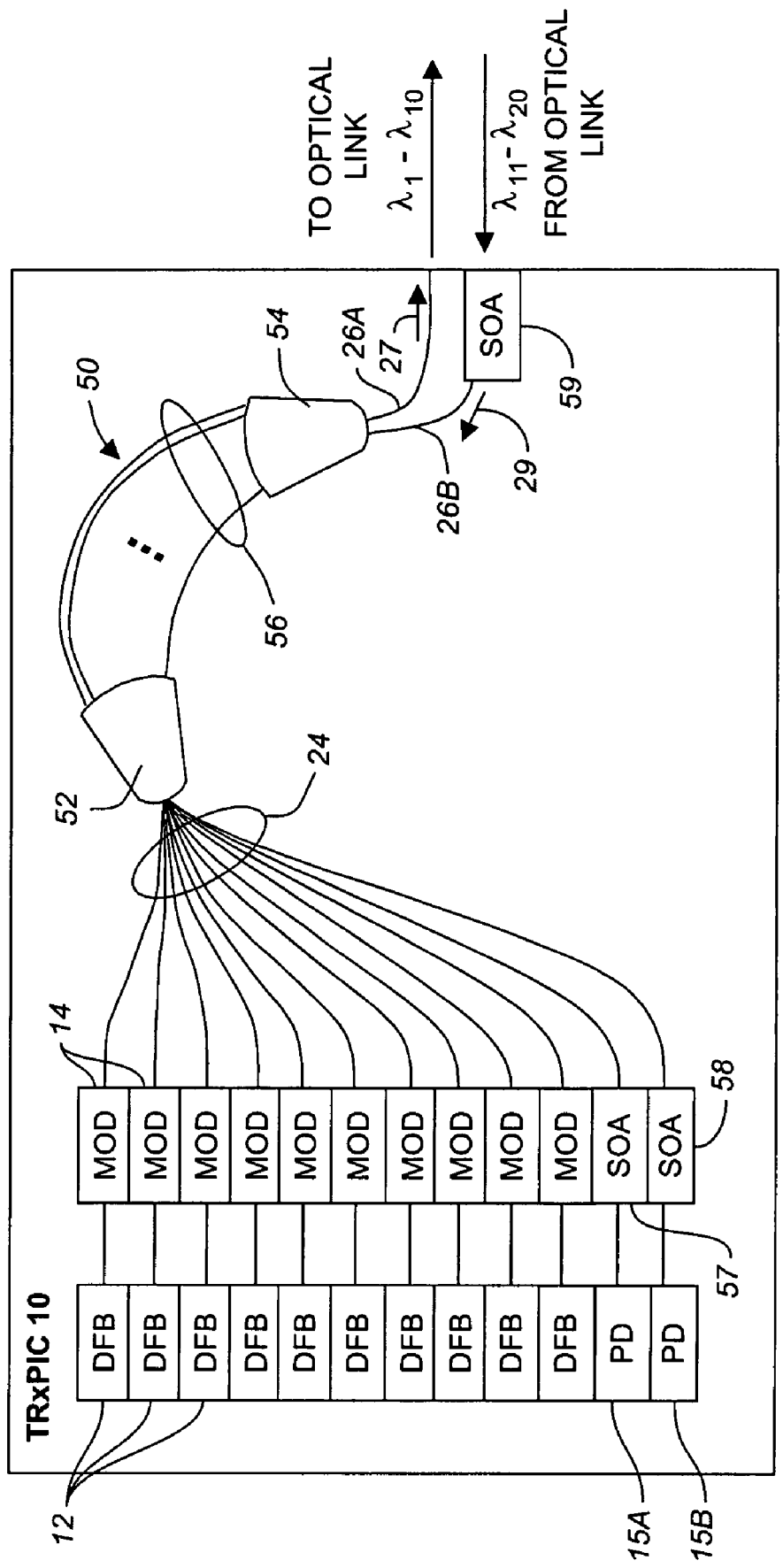
FIG._7B

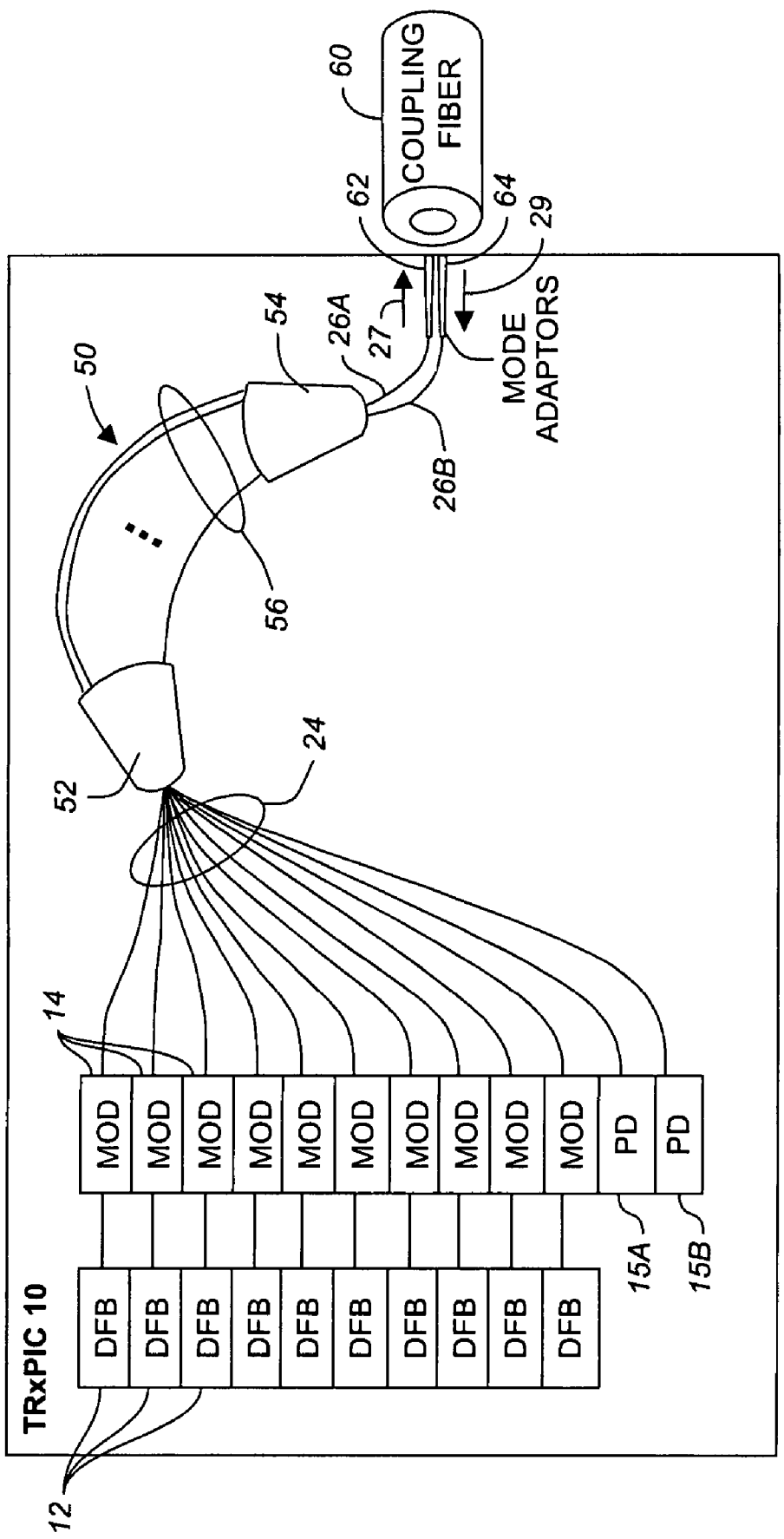
FIG._7C

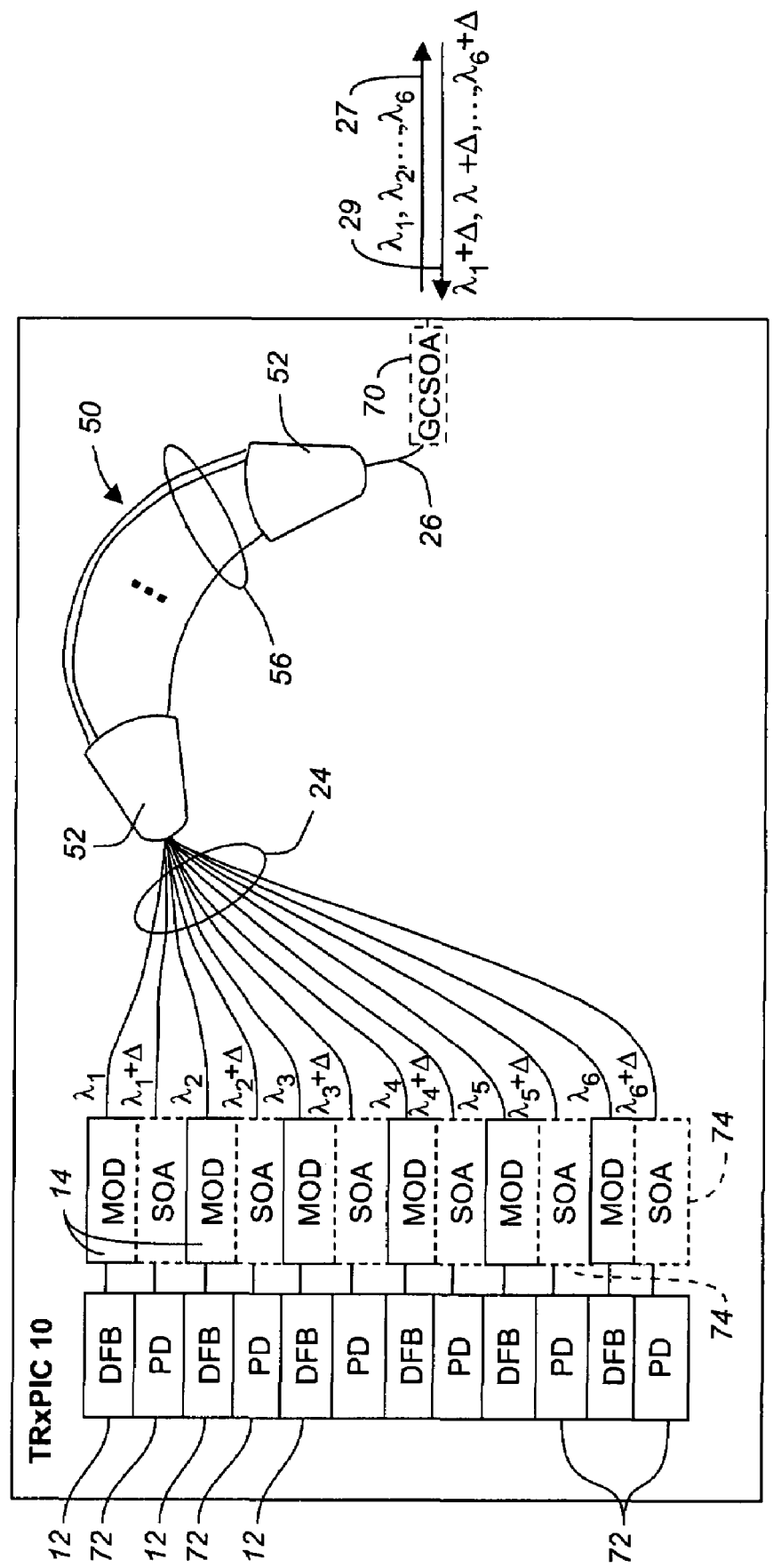
FIG._8

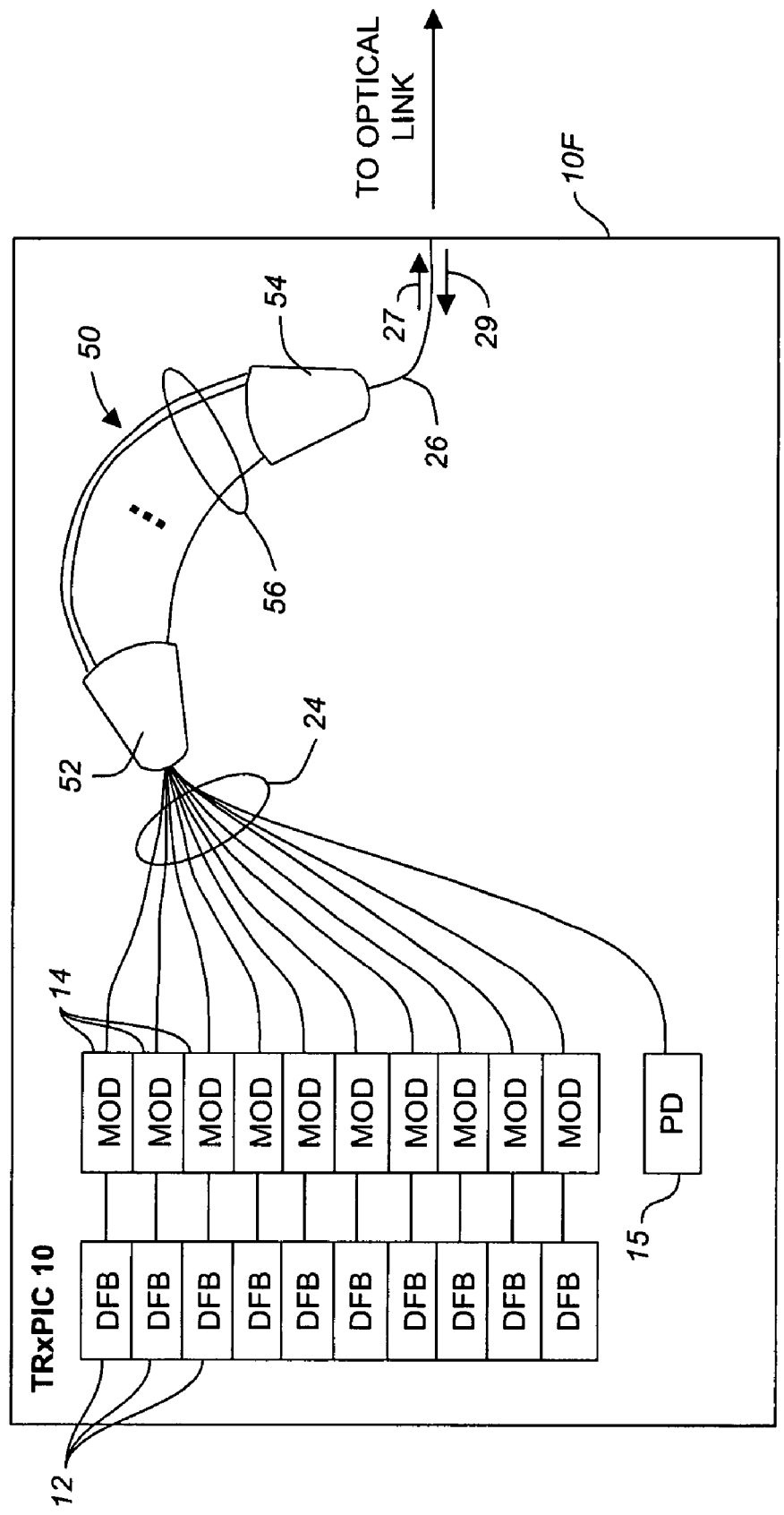
FIG._9

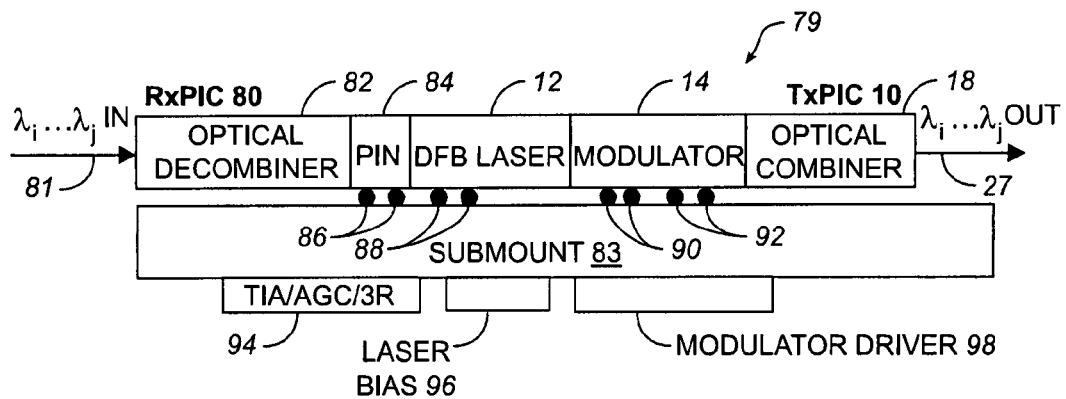
FIG._10
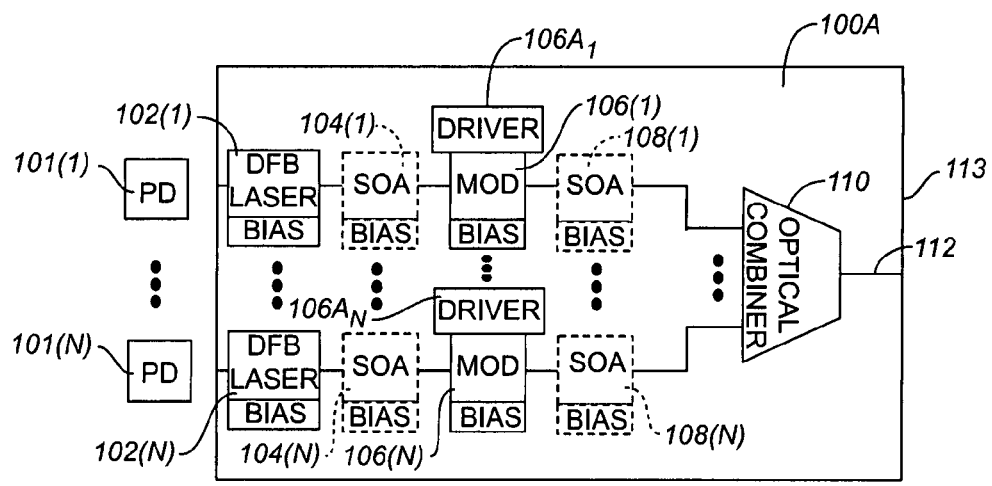
FIG._11

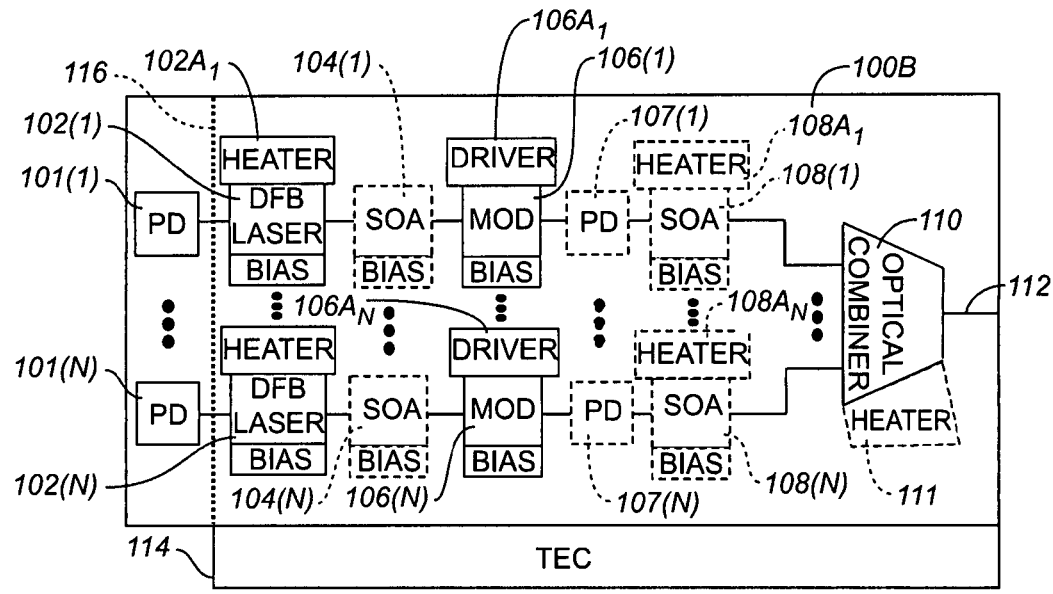
FIG._12
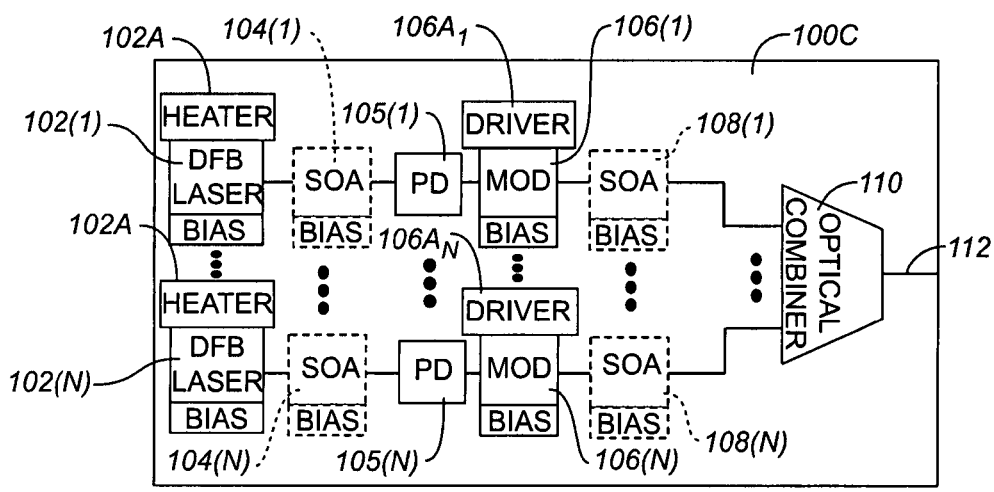
FIG._13

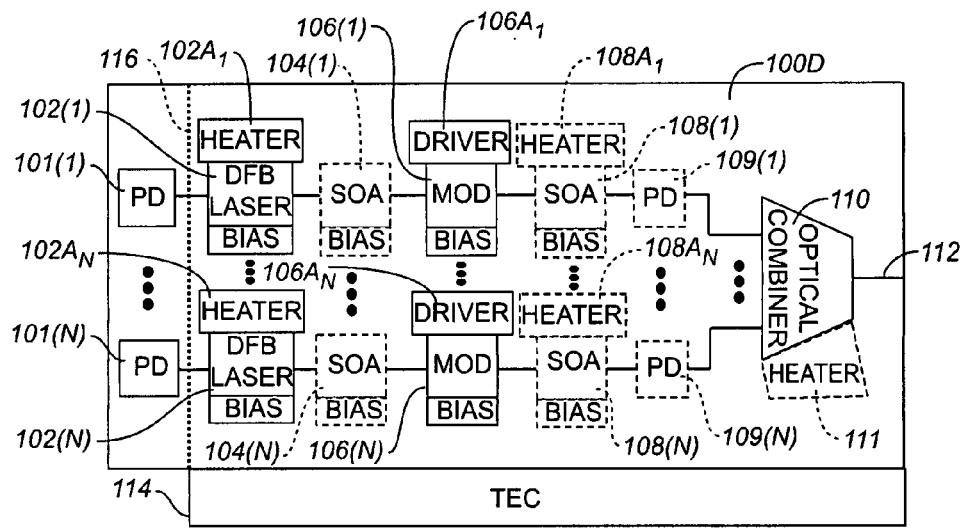
FIG._14
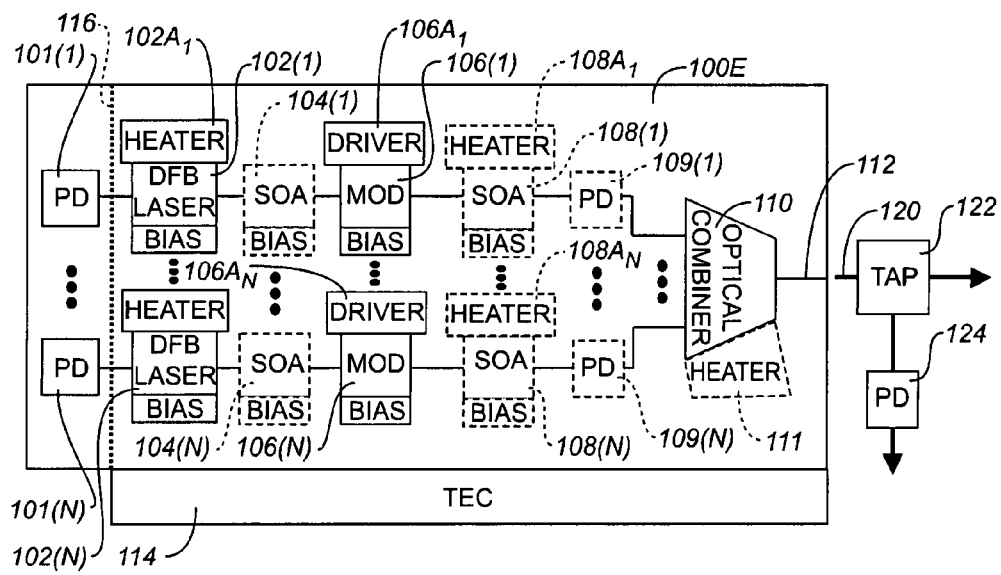
FIG._15

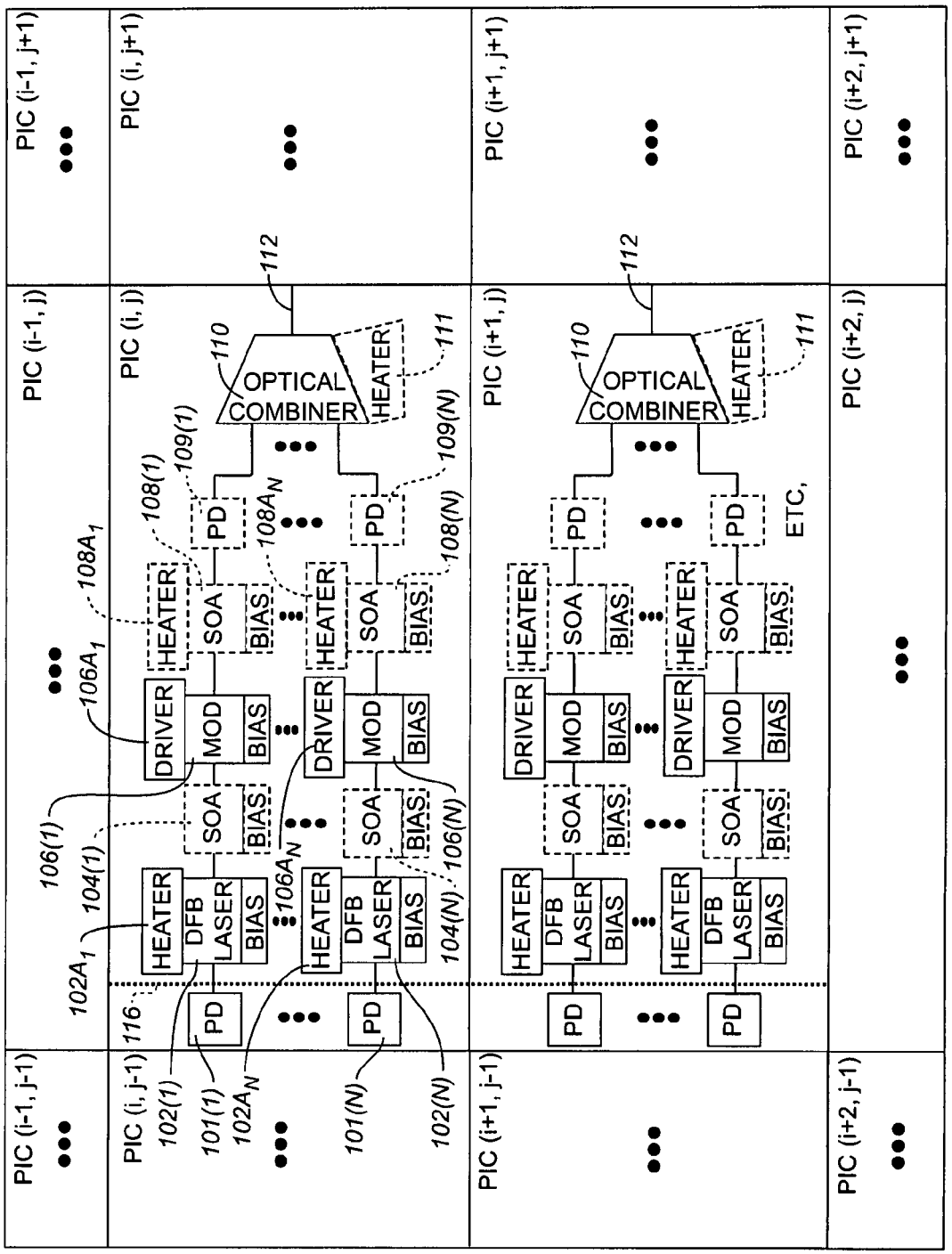
FIG._16

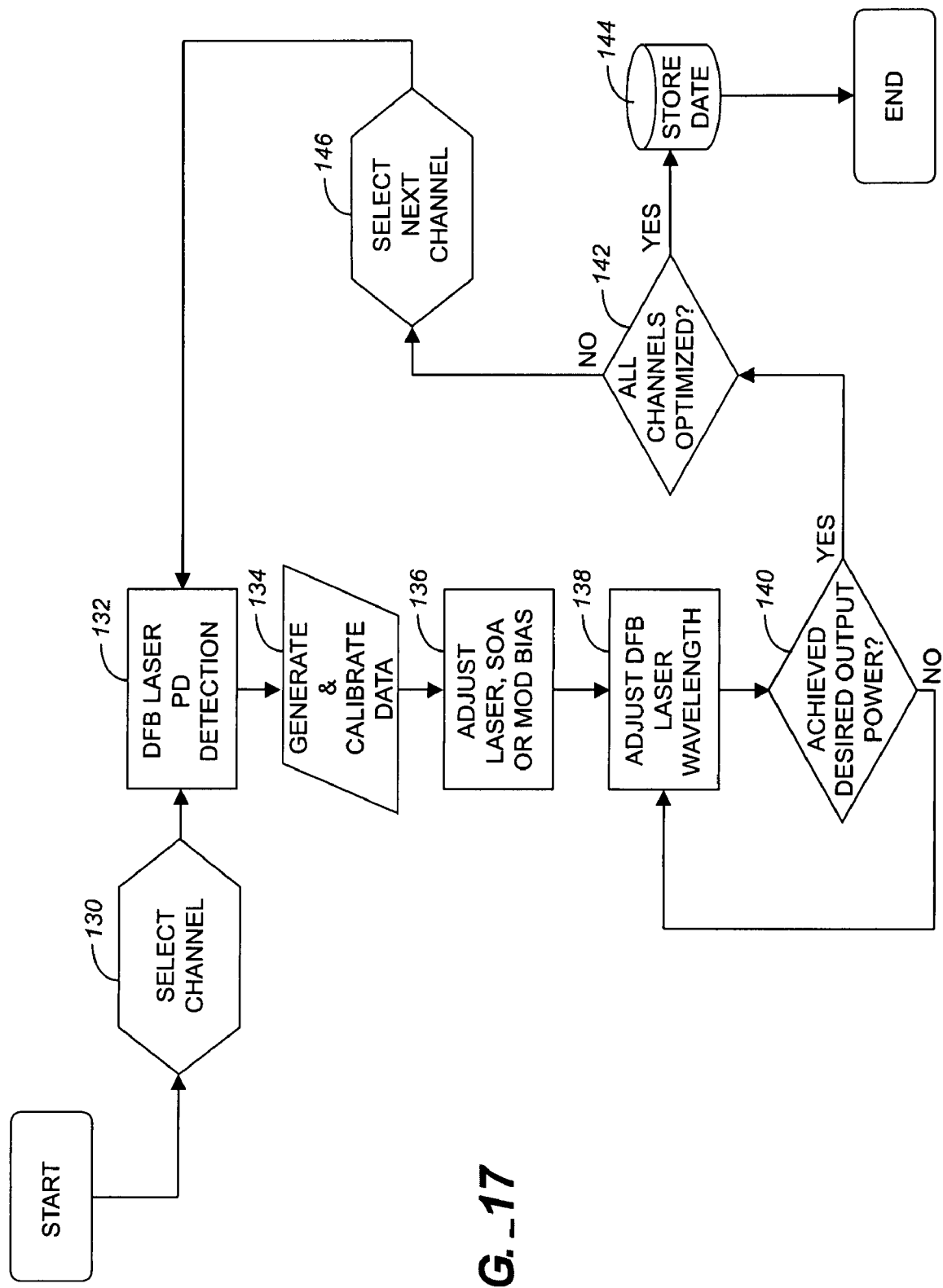
FIG._17

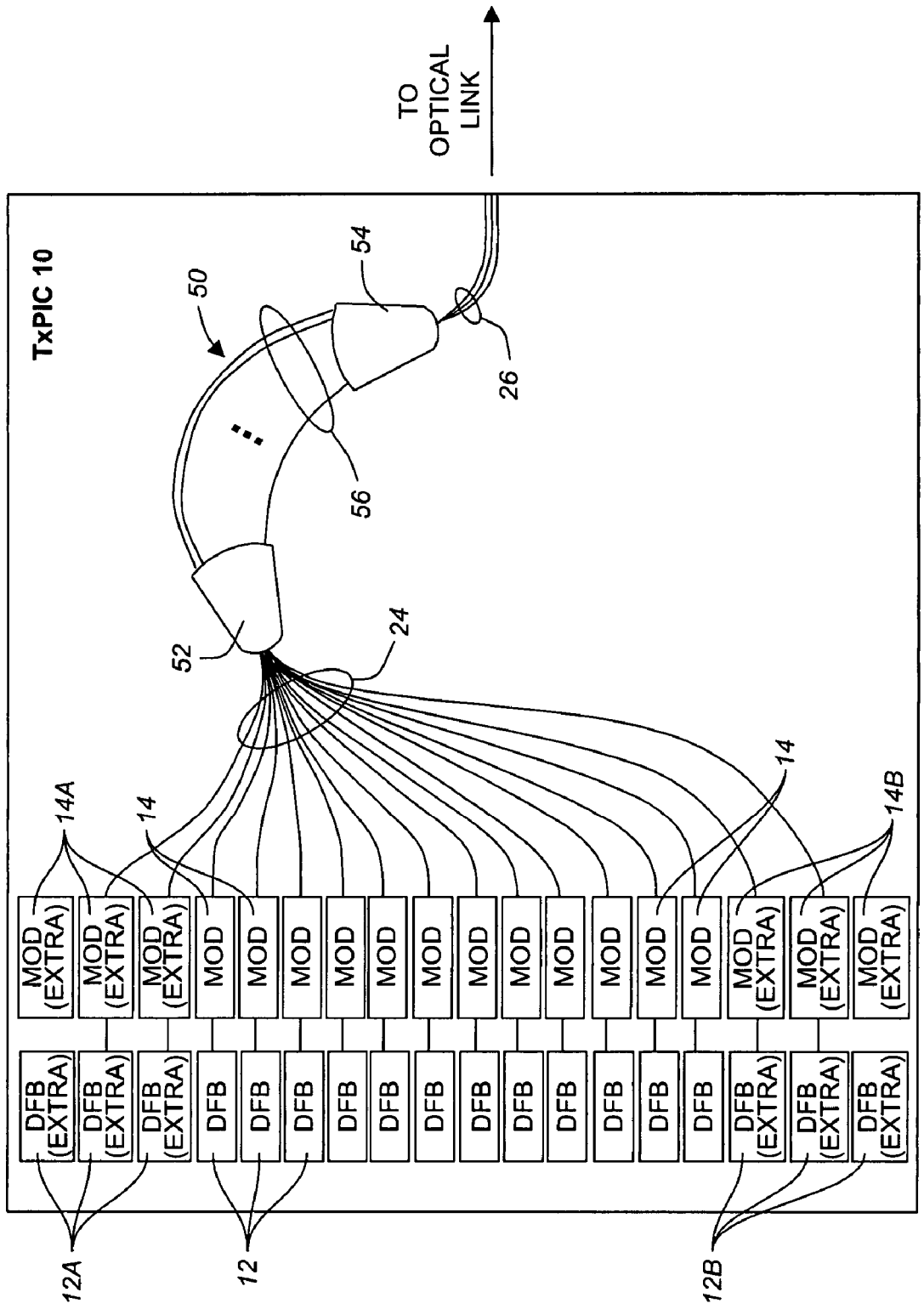
FIG._18

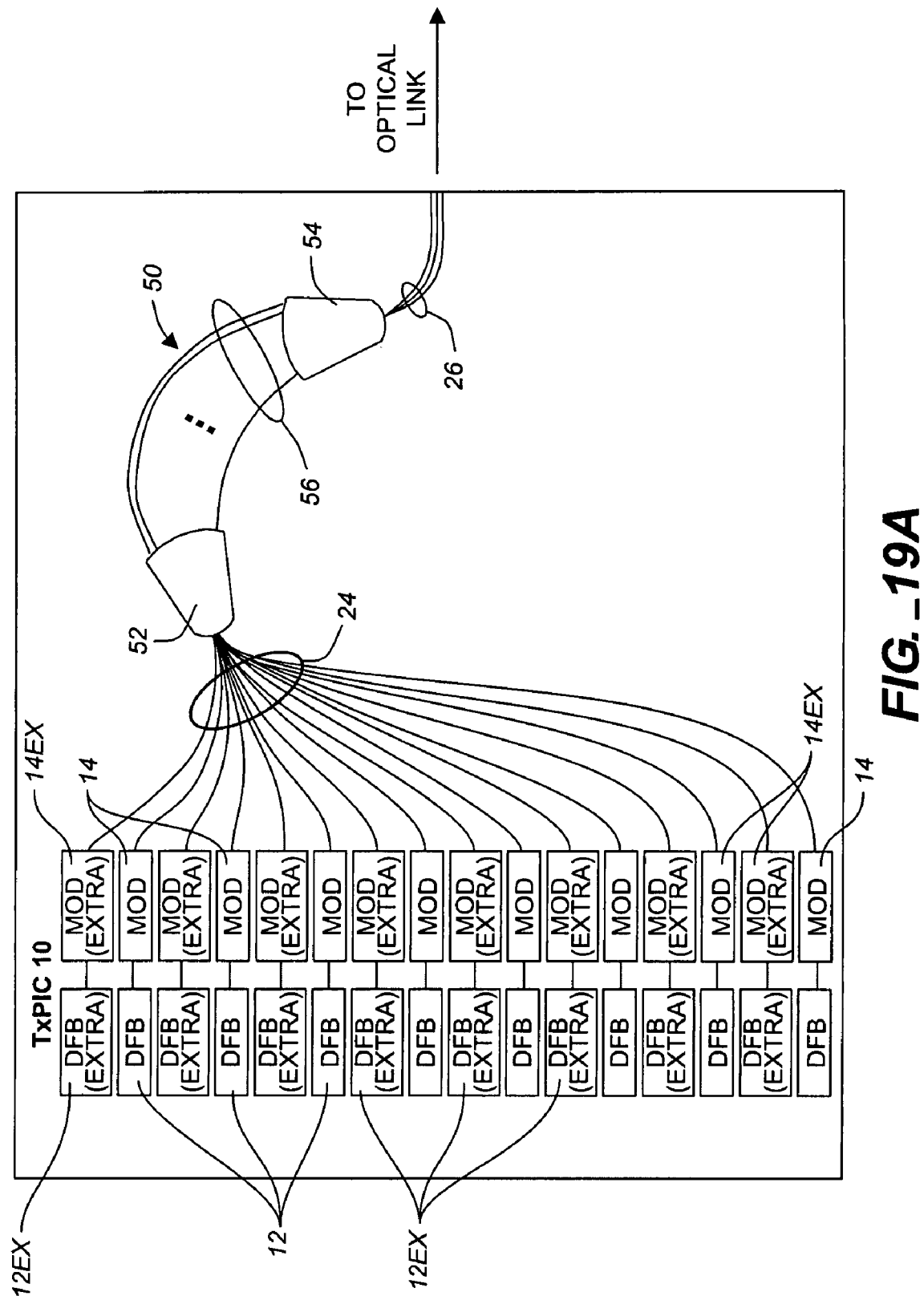
FIG._19A

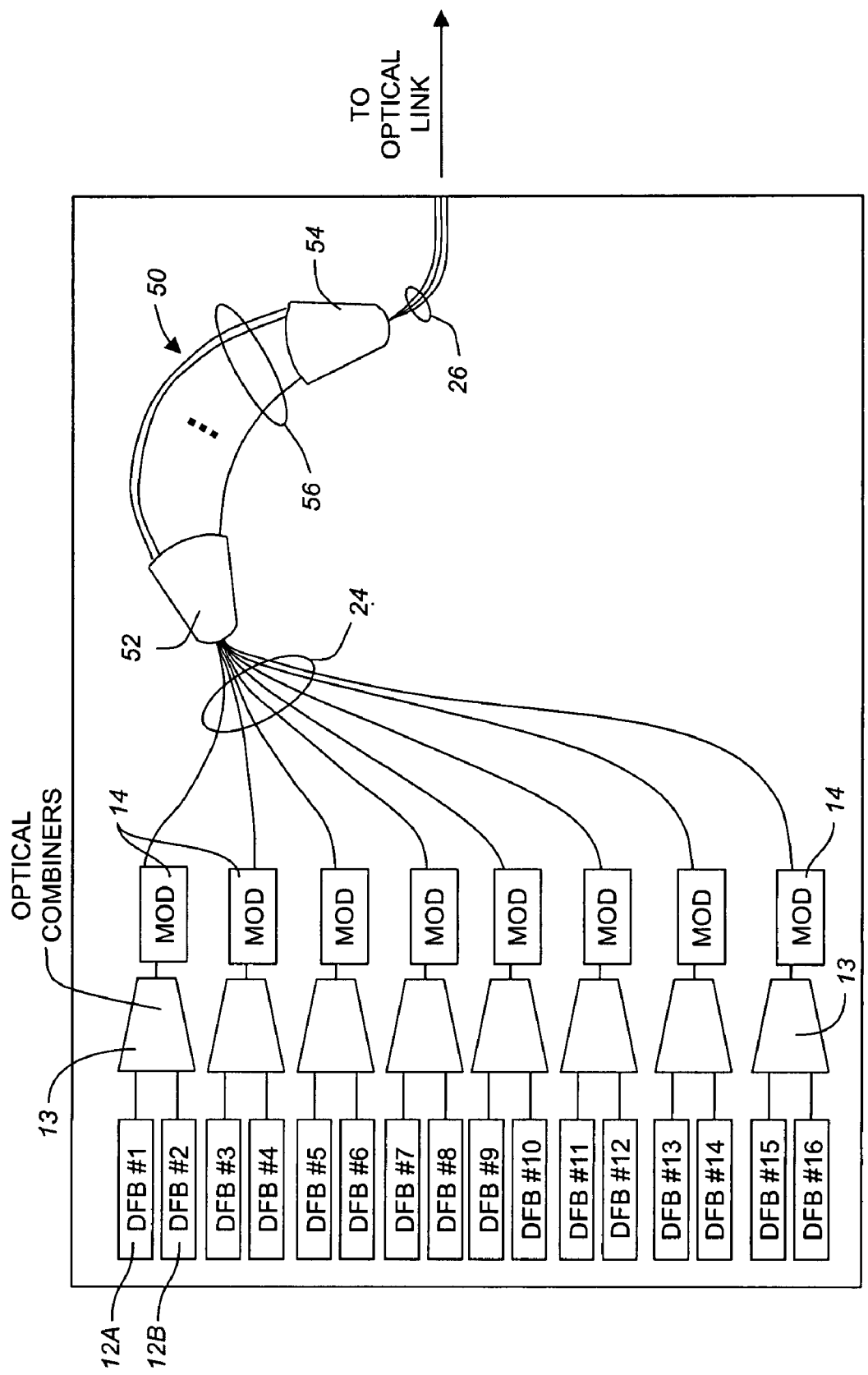
FIG._19B

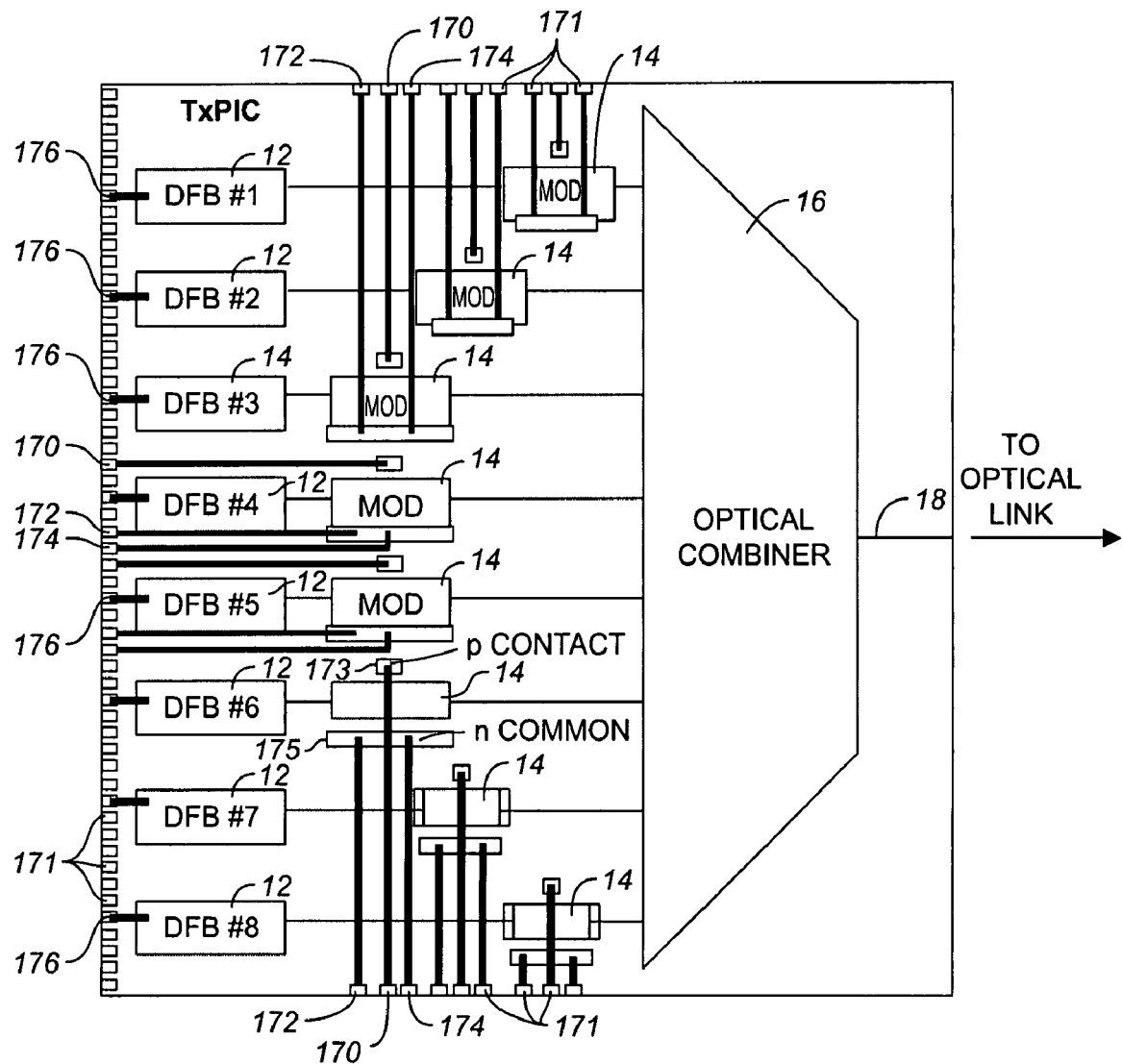
FIG. _20
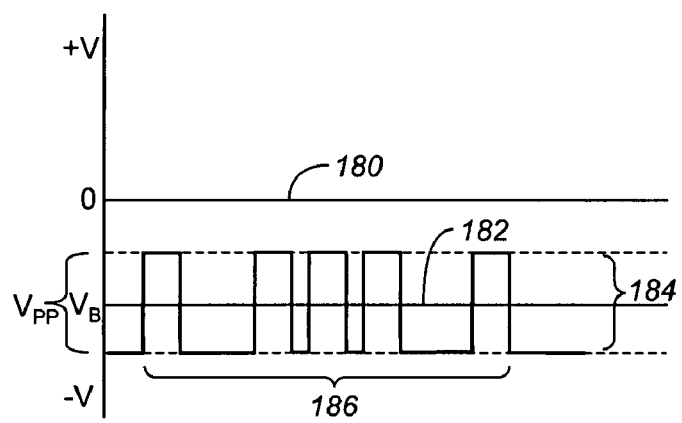
FIG. _20A

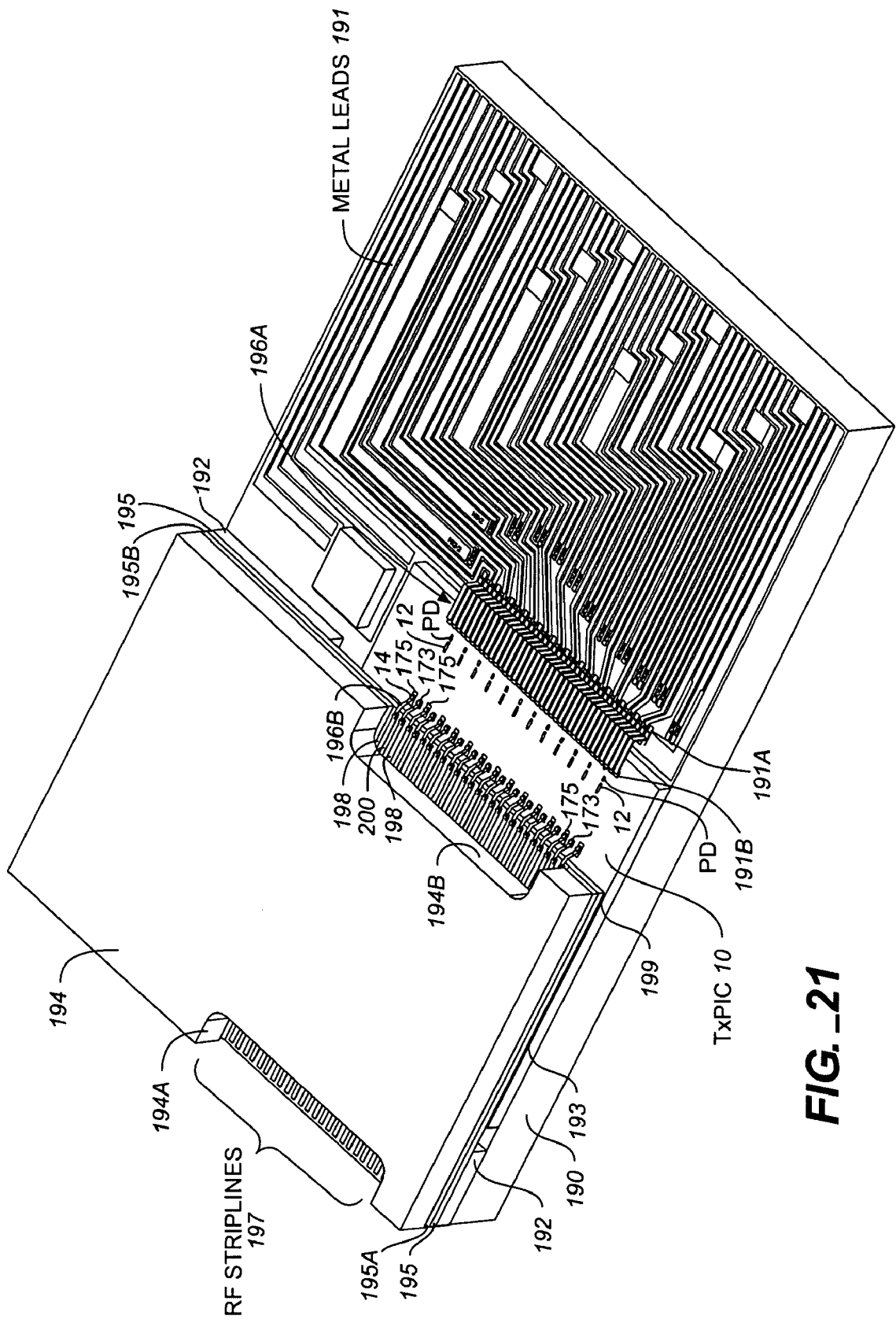
FIG. _21

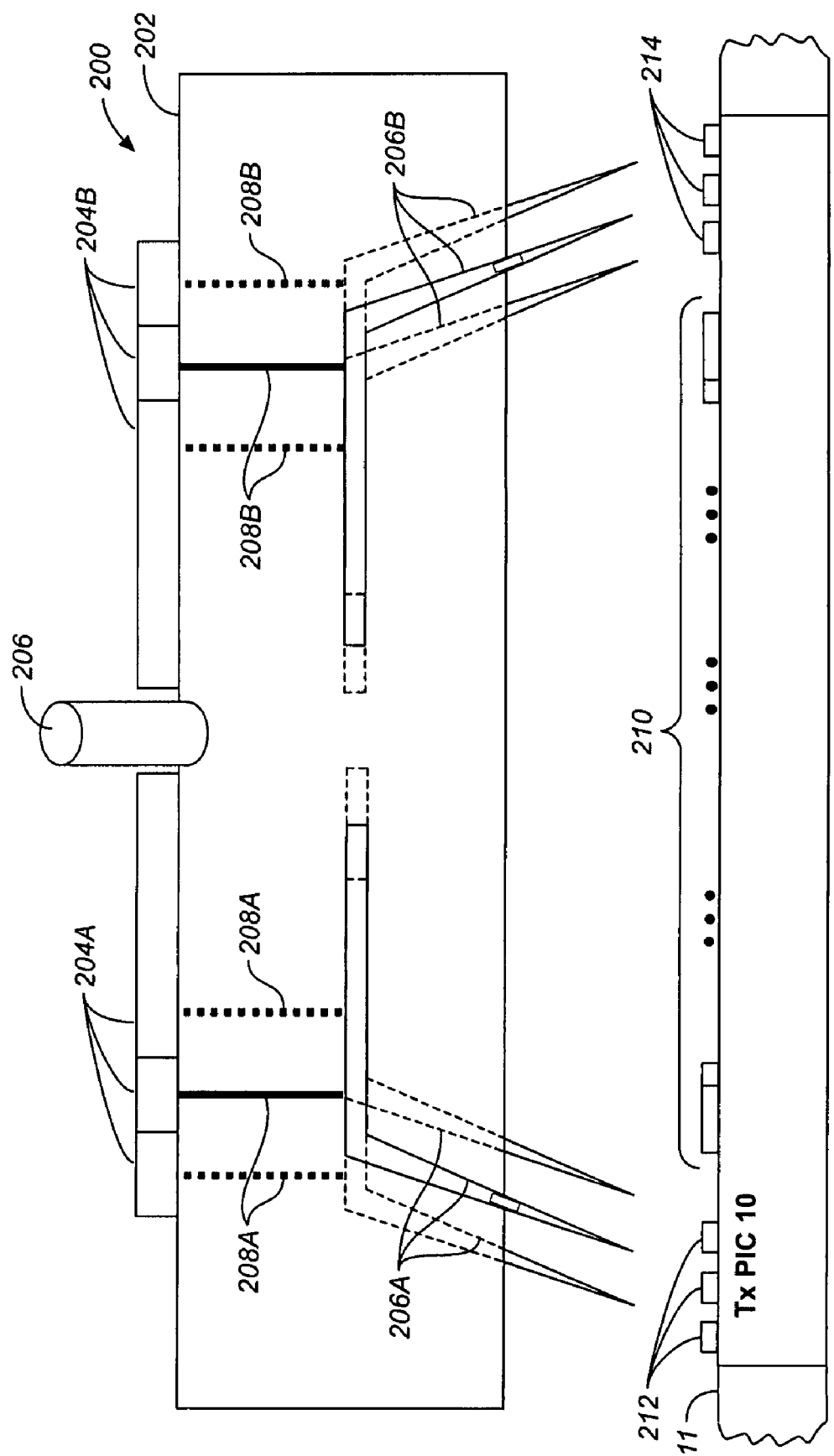
FIG._22

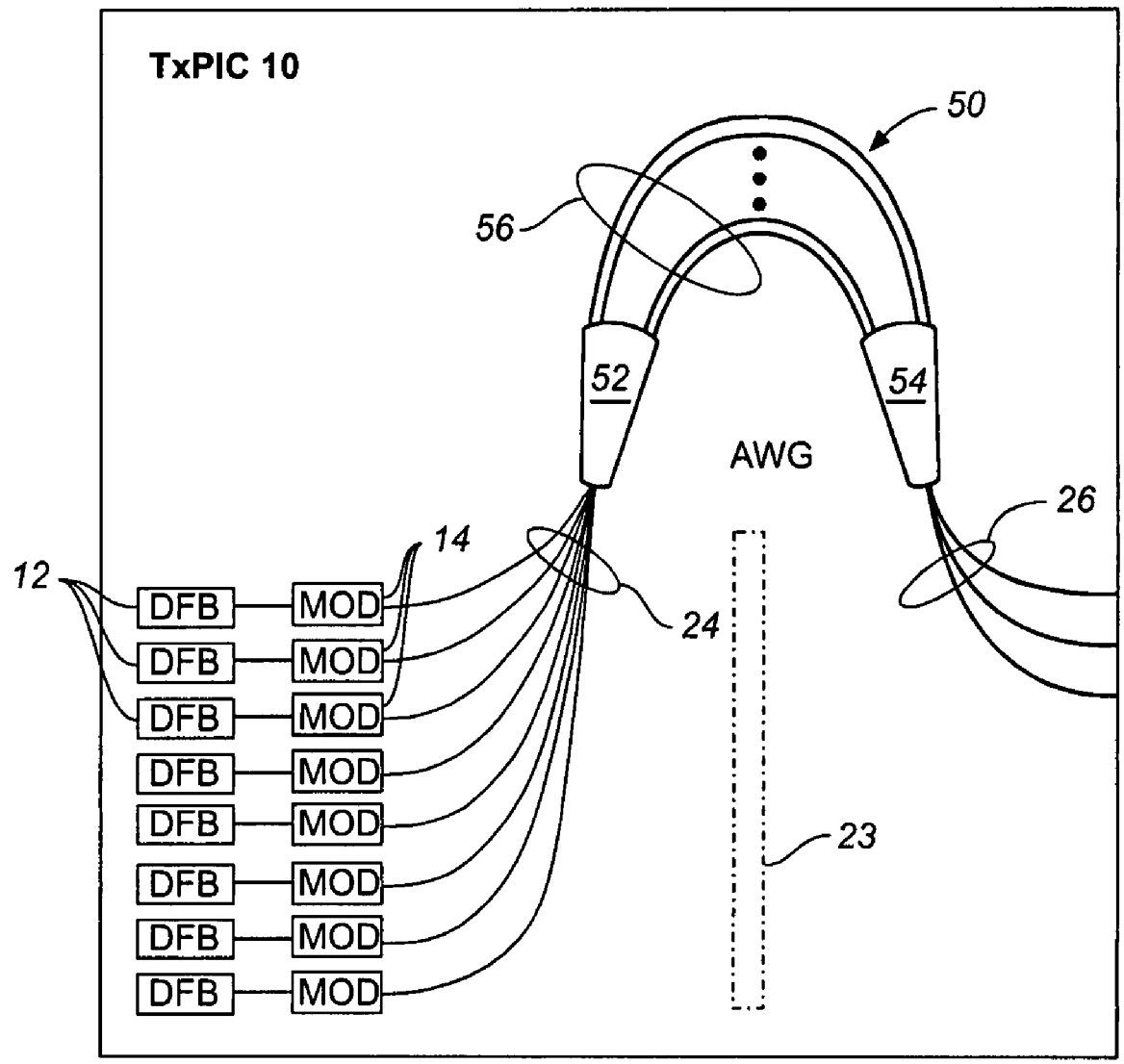
FIG. _24A

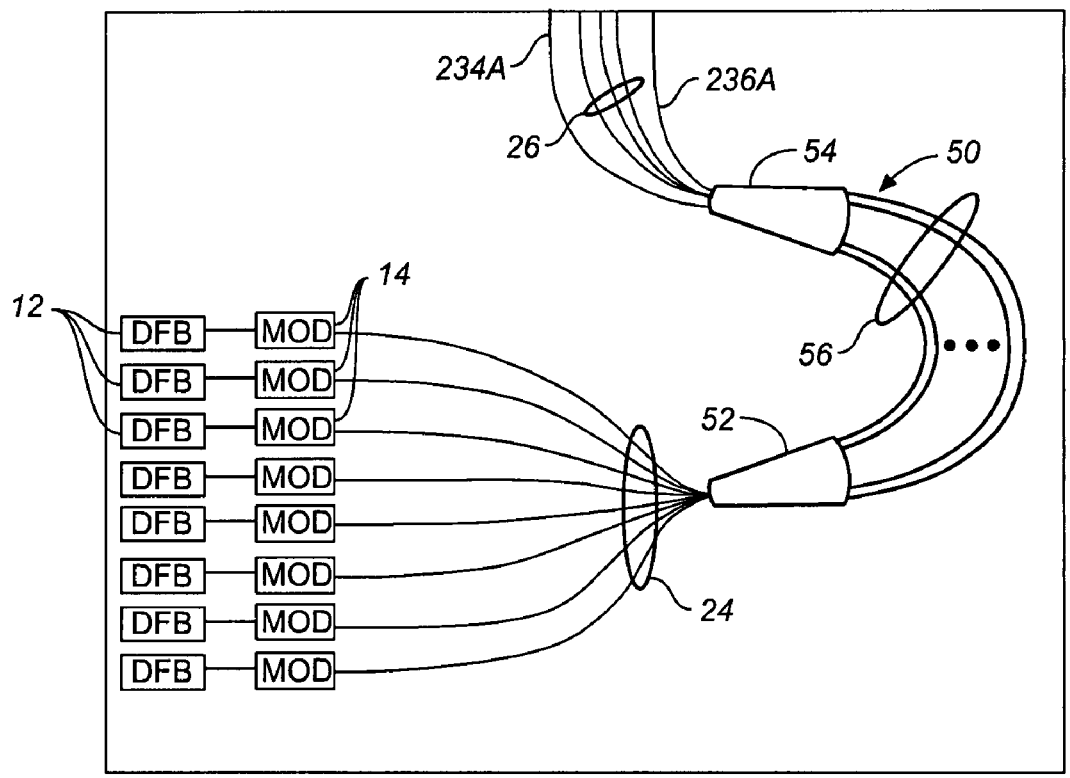
FIG._24B
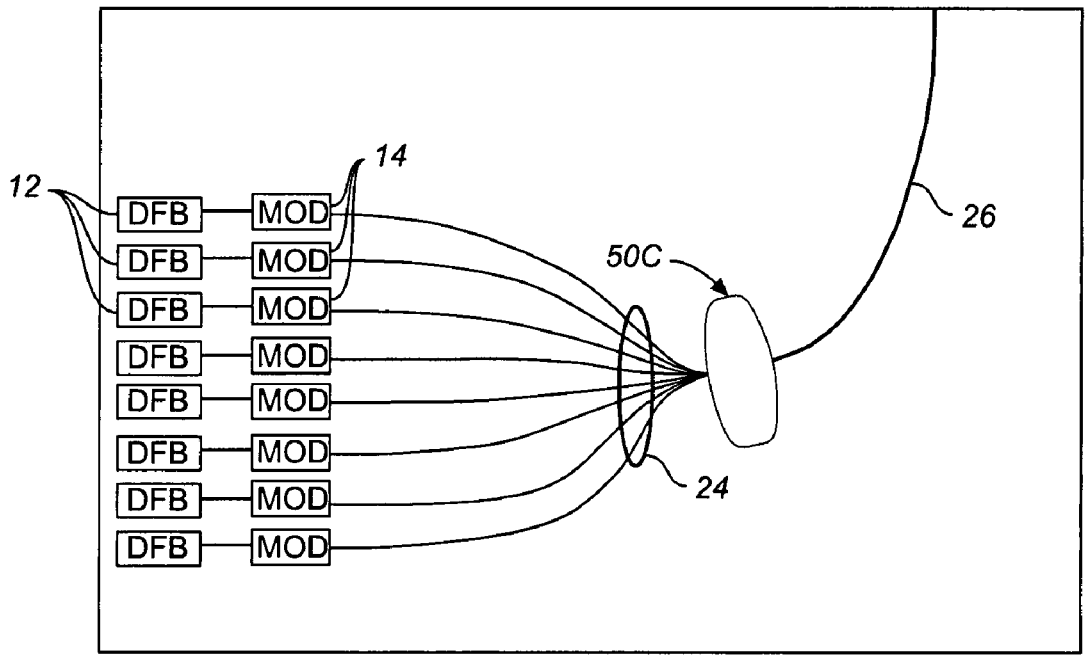
FIG._24C

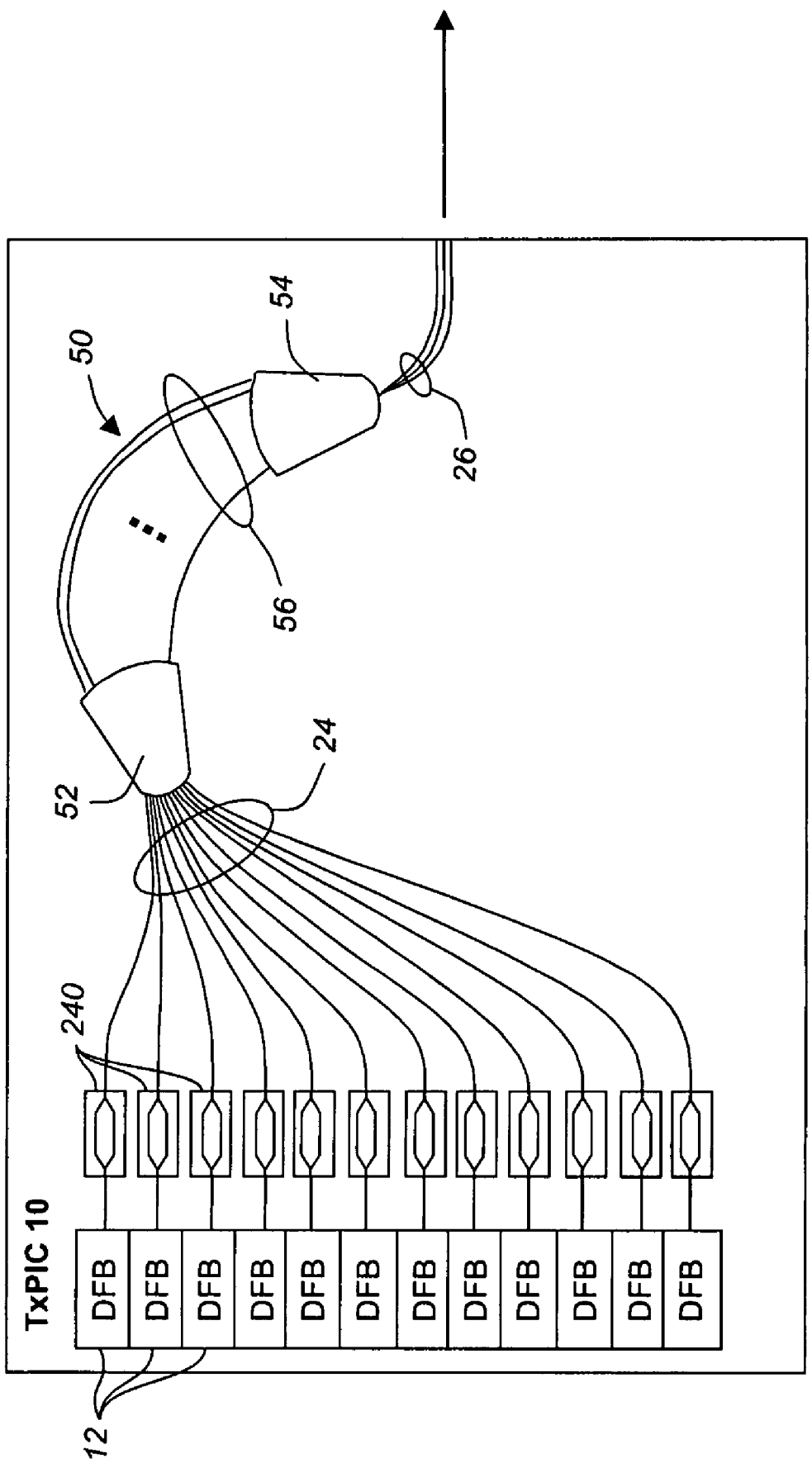
FIG._25

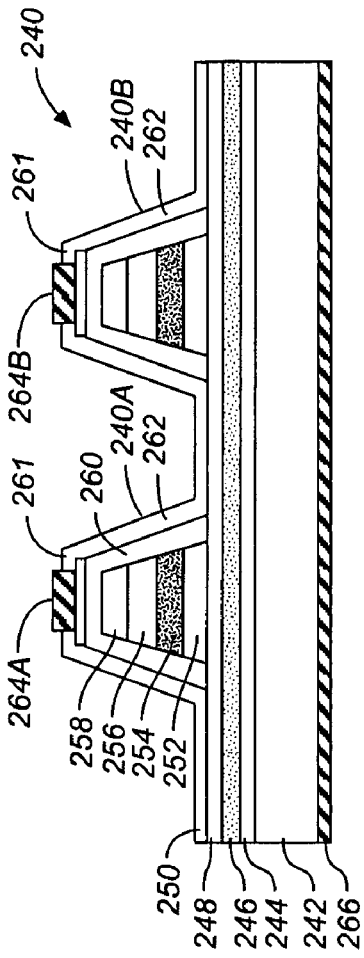
FIG._26
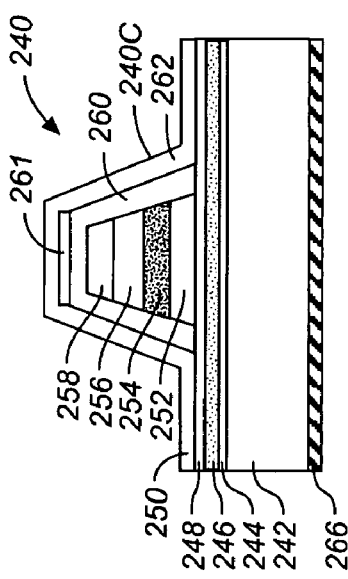
FIG._27
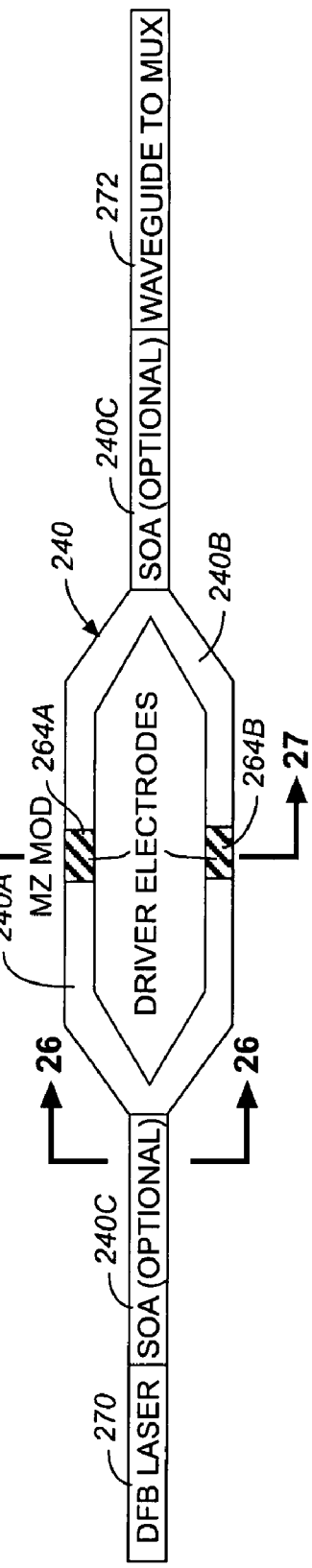
FIG._28
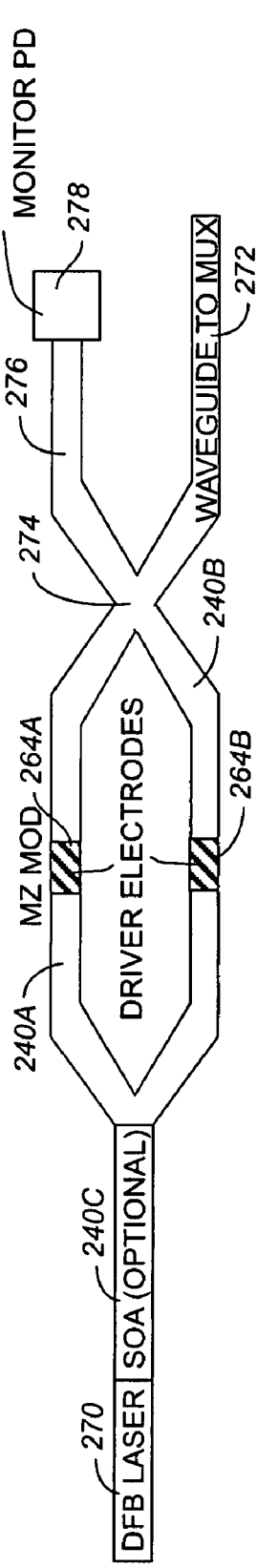
FIG._29

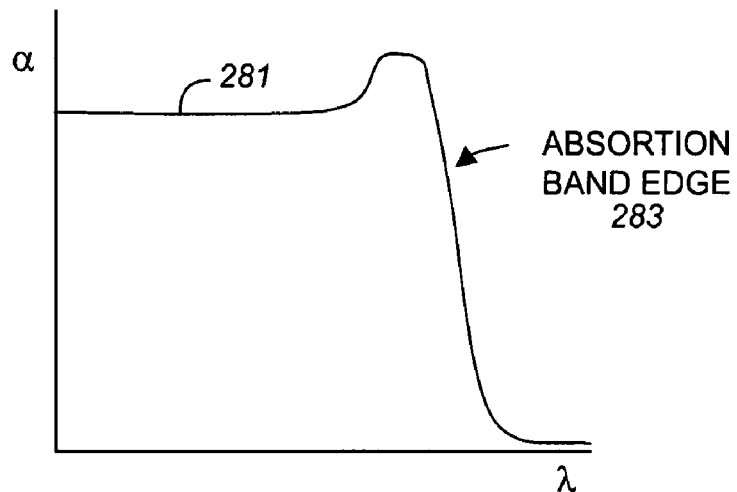
FIG._30
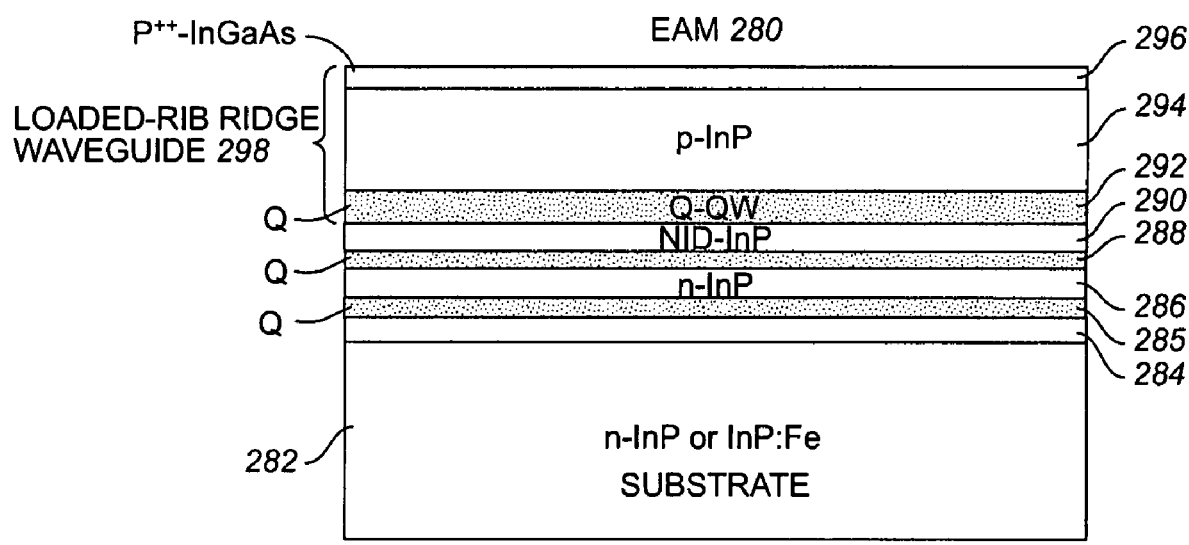
FIG._31

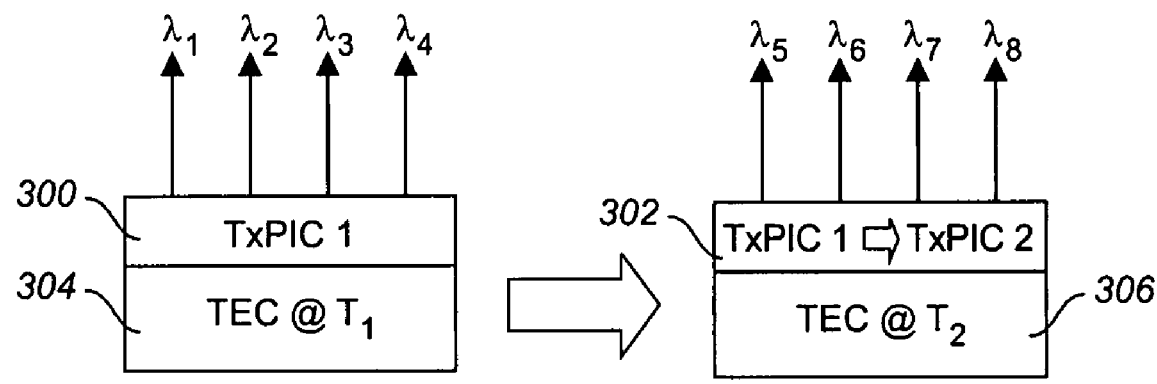
FIG. _32
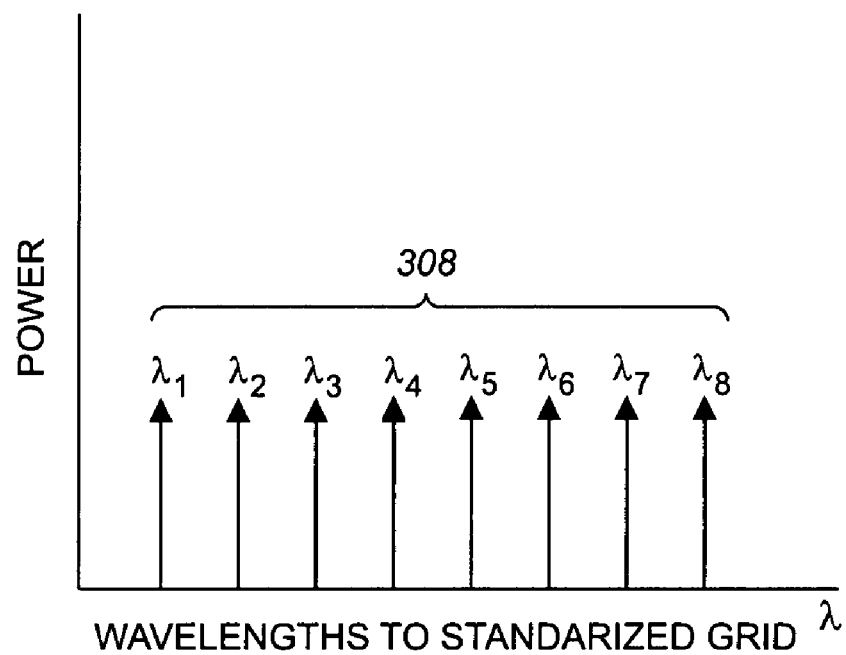
FIG. _33

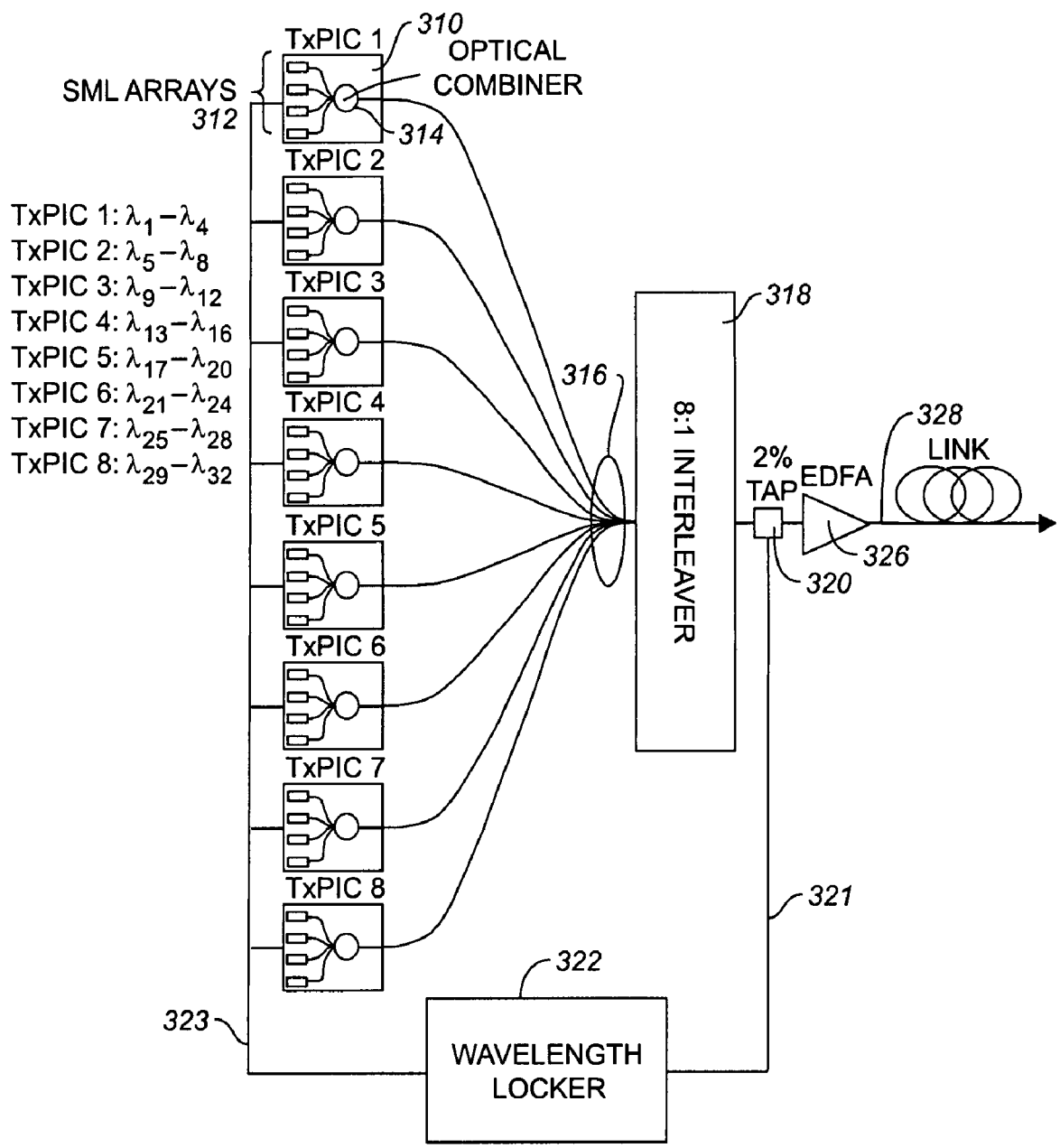
FIG._34

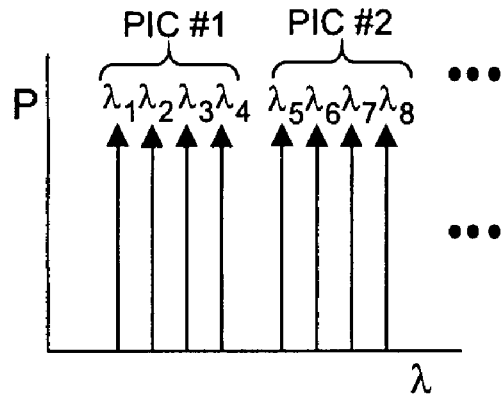
FIG. _34A
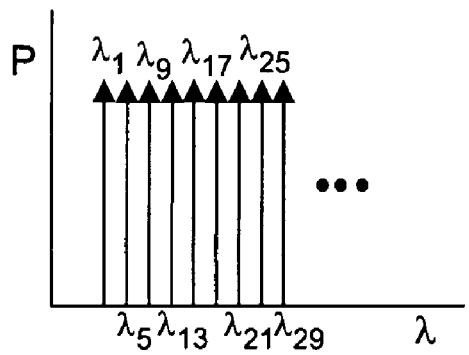
FIG. _34B

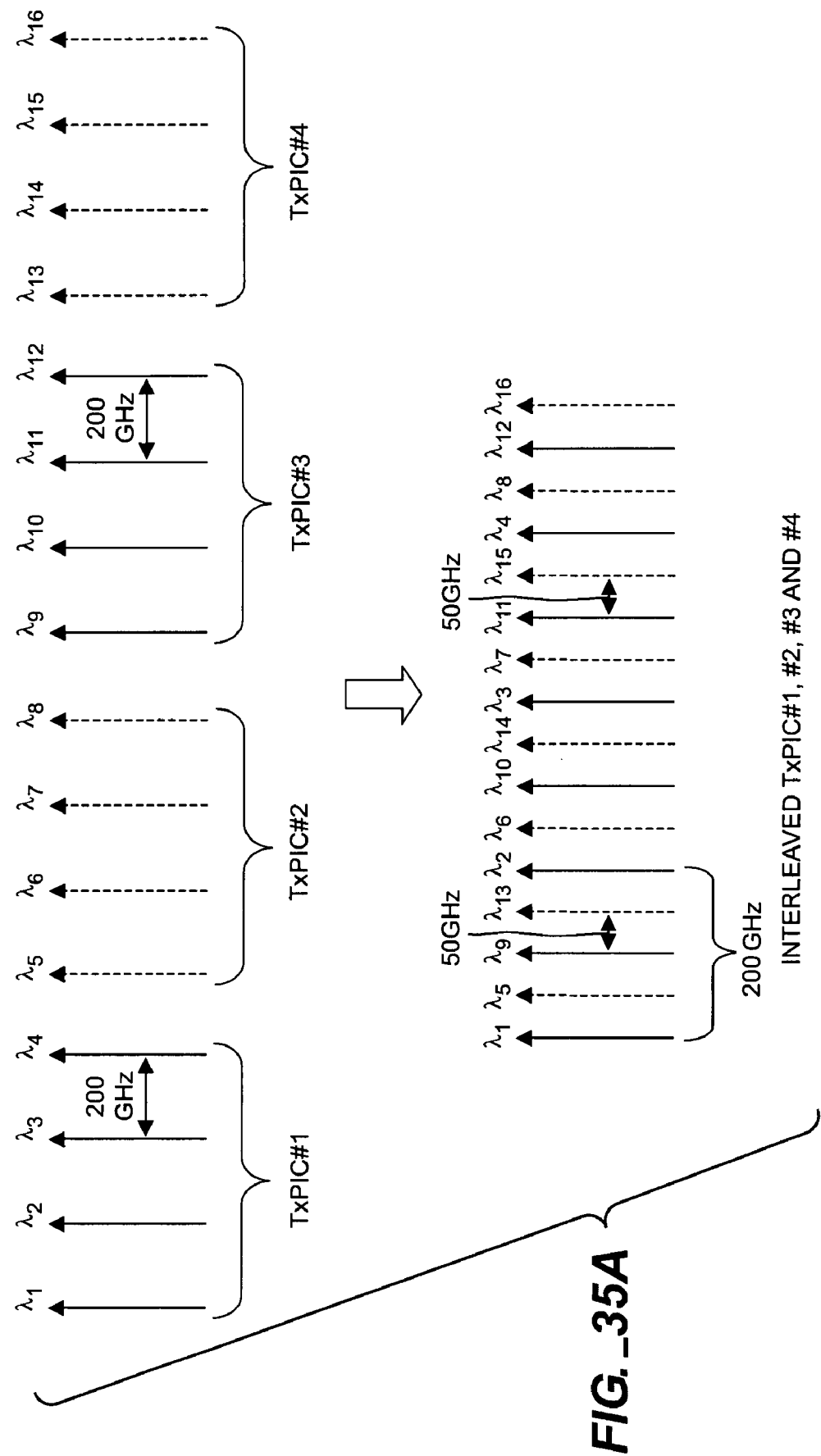
FIG._35A

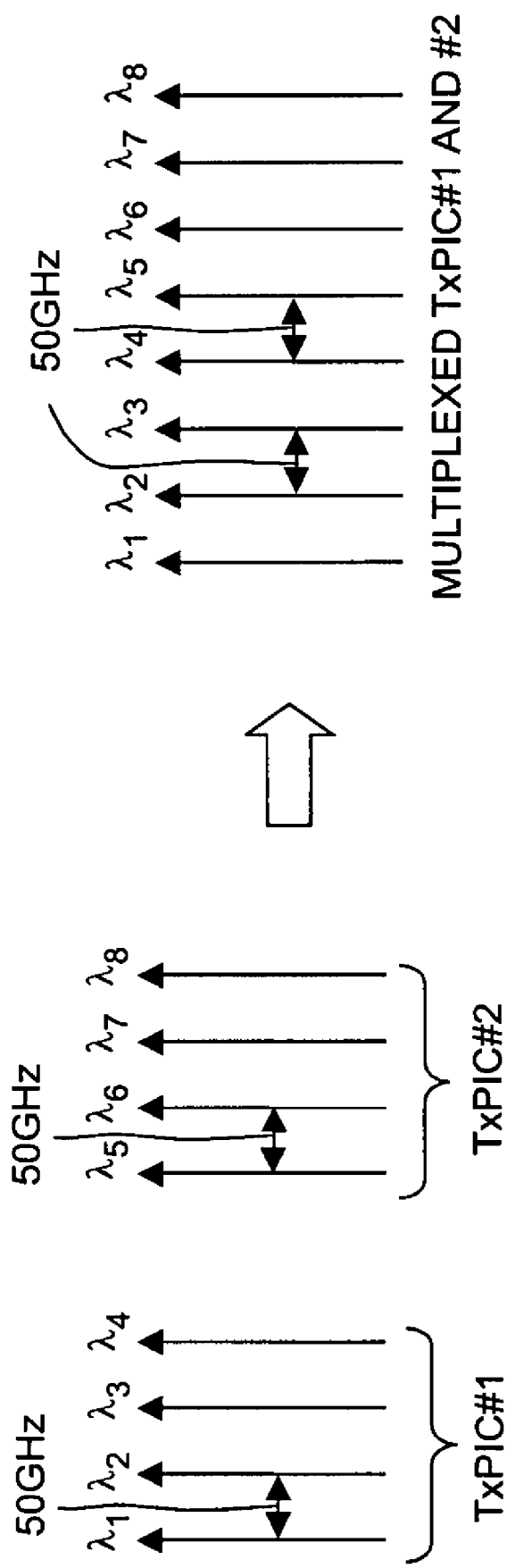
FIG._35B

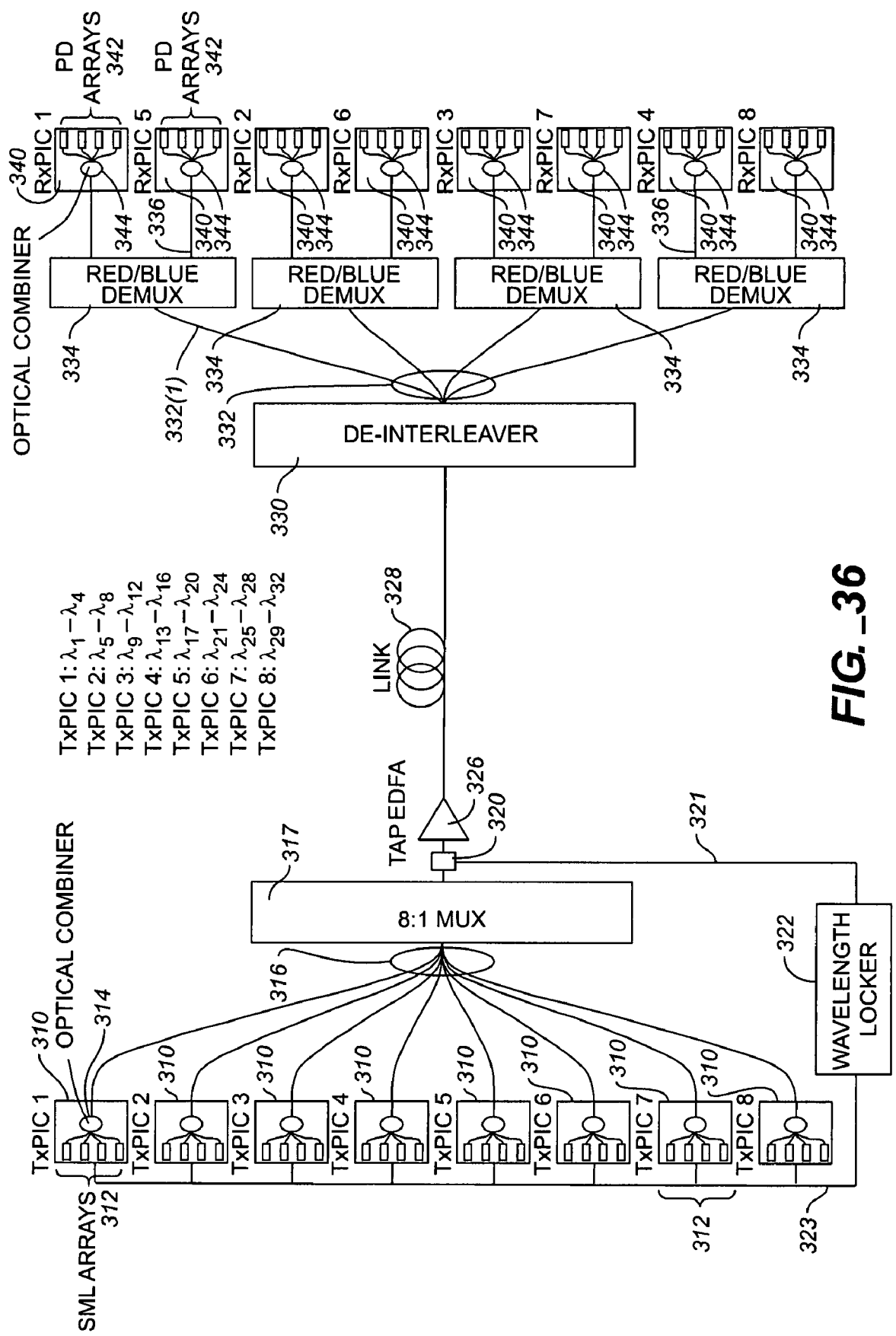
FIG._36

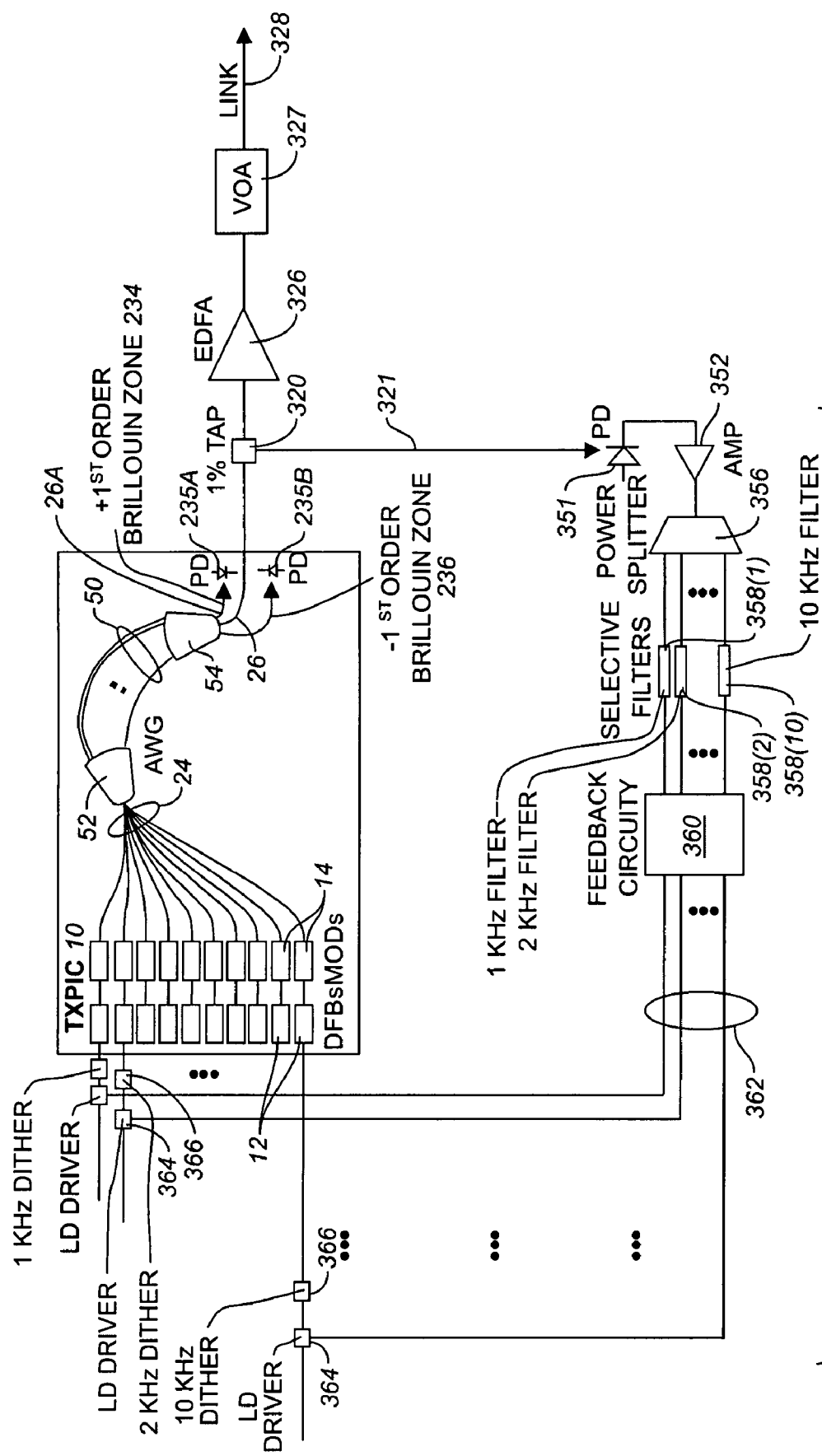
FIG._37

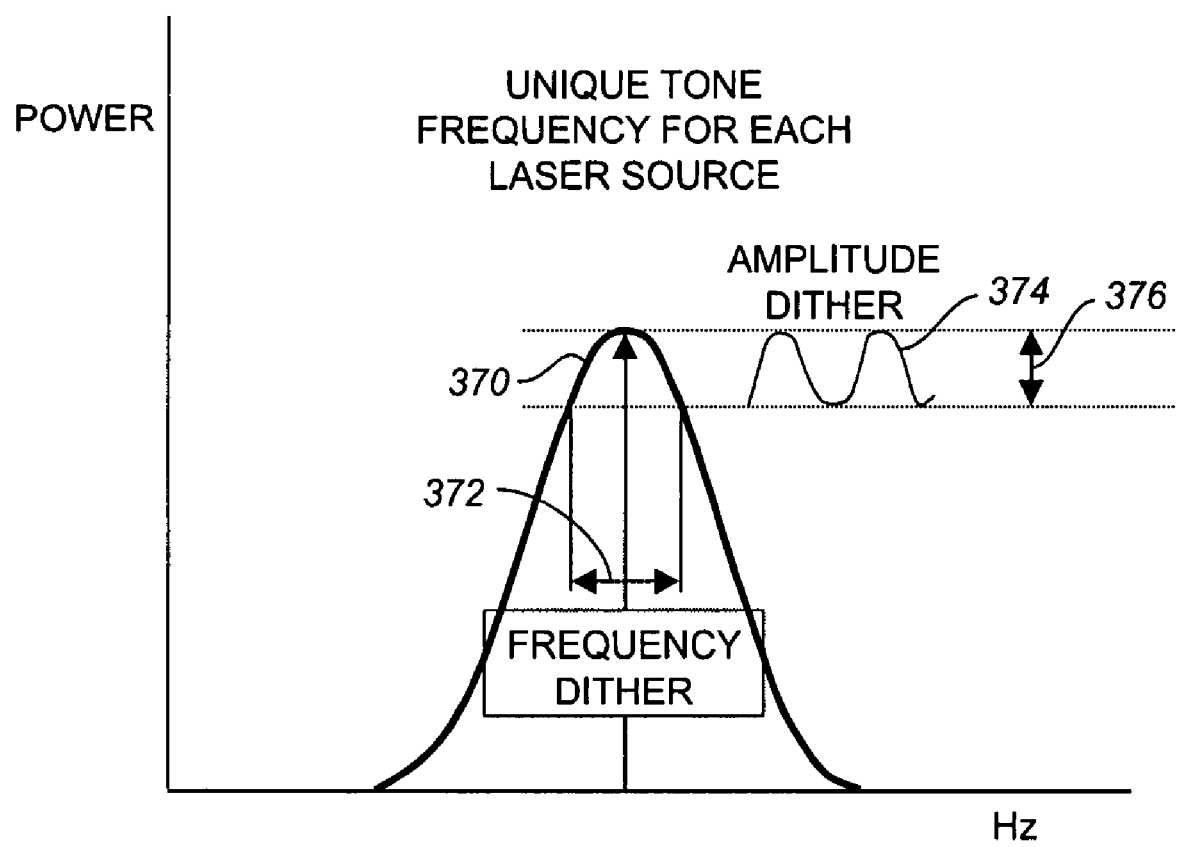
FIG. _38

PHOTONIC INTEGRATED CIRCUIT (PIC) CHIPS

CROSS REFERENCE TO RELATED APPLICATIONS

This application is a continuation application of patent application Ser. No. 10/317,935, filed Dec. 11, 2002, which is a continuation of patent application Ser. No. 10/267,331, filed Oct. 8, 2002, and entitled, TRANSMITTER PHOTONIC INTEGRATED CIRCUITS (TxPICs) AND OPTICAL TRANSPORT NETWORK SYSTEM EMPLOYING TxPICs, which claims the benefit of priority to provisional patent applications of David F. Welch et al., Ser. No. 60/328,207, filed Oct. 9, 2001, and entitled, PHOTONIC INTEGRATED CIRCUITS FOR DWDM OPTICAL NETWORKS; Robert B. Taylor et al, Ser. No. 60/328,332, filed Oct. 9, 2001, and entitled, APPARATUS AND METHOD OF WAVELENGTH LOCKING IN AN OPTICAL TRANSMITTER SYSTEM; Fred A. Kish, Jr. et al, Ser. No. 60/370,345, filed Apr. 5, 2002, and entitled, TRANSMITTER PHOTONIC INTEGRATED CIRCUITS (TxPICs); Charles H. Joyner et al, Ser. No. 60/378,010, filed May 10, 2002, and entitled, TRANSMITTER PHOTONIC INTEGRATED CIRCUITS (TxPICs) CHIP WITH ENHANCED POWER AND YIELD WITHOUT ON-CHIP AMPLIFICATION; Jagdeep Singh et al, Ser. No. 60/392,494, filed Jun. 28, 2002, and entitled, DIGITAL OPTICAL NETWORK ARCHITECTURE; and David F. Welch et al, Ser. No. 60/367,595, filed Mar. 25, 2002, and entitled, AN OPTICAL SIGNAL RECEIVER PHOTONIC INTEGRATED CIRCUIT (RxPIC), AN ASSOCIATED OPTICAL TRANSMITTER PHOTONIC INTEGRATED CIRCUIT (TxPIC) AND AN OPTICAL NETWORK TRANSMISSION SYSTEM UTILIZING THESE CIRCUITS, all of which applications are incorporated herein in their entirety by their reference. This application is also related to U.S. patent application Ser. No. 10/317,935, filed Dec. 11, 2002 and entitled, TRANSMITTER PHOTONIC INTEGRATED CIRCUIT (TxPIC) CHIPS, which application is incorporated herein in its entirety by its reference.

BACKGROUND OF THE INVENTION

1. Field of the Invention

This invention relates generally to optical telecommunication systems and more particularly to optical transport networks employed in such systems deploying photonic integrated circuits (PICs) for wavelength division multiplexed (WDM) or dense wavelength division multiplexed (DWDM) optical networks.

2. Description of the Related Art

If used throughout this description and the drawings, the following short terms have the following meanings unless otherwise stated:

1R—Re-amplification of the information signal.

2R—Optical signal regeneration that includes signal reshaping as well as signal regeneration or re-amplification.

3R—Optical signal regeneration that includes signal retiming as well as signal reshaping as well as re-amplification.

4R—Any electronic reconditioning to correct for transmission impairments other than 3R processing, such as, but not limited to, FEC encoding, decoding and re-encoding.

A/D—Add/Drop.

APD—Avalanche Photodiode.

AWG—Arrayed Waveguide Grating.

BER—Bit Error Rate.

CD—Chromatic Dispersion.

CDWM—Cascaded Dielectric wavelength Multiplexer (Demultiplexer).

CoC—Chip on Carrier.

DBR—Distributed Bragg Reflector laser.

EDFAs—Erbium Doped Fiber Amplifiers.

DAWN—Digitally Amplified Wavelength Network.

DCF—Dispersion Compensating Fiber.

DEMUX—Demultiplexer.

DFB—Distributed Feedback laser.

DLM—Digital Line Modulator.

DON—Digital Optical Network as defined and used in this application.

EA—Electro-Absorption.

EAM—Electro-Absorption Modulator.

EDFA—Erbium Doped Fiber Amplifier.

EML—Electro-absorption Modulator/Laser.

EO—Electrical to Optical signal conversion (from the electrical domain into the optical domain).

FEC—Forward Error Correction.

GVD—Group Velocity Dispersion comprising CD and/or PMD.

ITU—International Telecommunication Union.

MMI—Multimode Interference combiner.

MPD—Monitoring Photodiode.

MZM—Mach-Zehnder Modulator.

MUX—Multiplexer.

NE—Network Element.

NF—Noise Figure: The ratio of input OSNR to output OSNR.

OADM—Optical Add Drop Multiplexer.

OE—Optical to Electrical signal conversion (from the optical domain into the electrical domain).

OEO—Optical to Electrical to Optical signal conversion (from the optical domain into the electrical domain with electrical signal regeneration and then converted back into optical domain) and also sometimes referred to as SONET regenerators.

OEO-REGEN—OEO signal REGEN using opto-electronic regeneration.

OO—Optical-Optical for signal re-amplification due to attenuation. EDFAs do this in current WDM systems.

OOO—Optical to Optical to Optical signal conversion (from the optical domain and remaining in the optical domain with optical signal regeneration and then forwarded in optical domain).

OOO-REGEN—OOO signal REGEN using all-optical regeneration.

OSNR—Optical Signal to Noise Ratio.

PIC—Photonic Integrated Circuit.

PIN—p-i-n semiconductor photodiode.

PMD—Polarization Mode Dispersion.

REGEN—digital optical signal regeneration, also referred to as re-mapping, is signal restoration, accomplished electronically or optically or a combination of both, which is required due to both optical signal degradation or distortion primarily occurring during optical signal propagation caused by the nature and quality of the signal itself or due to optical impairments incurred on the transport medium.

Rx—Receiver, here in reference to optical channel receivers.

RxPIC—Receiver Photonic Integrated Circuit.

SDH—Synchronous Digital Hierarchy.

SDM—Space Division Multiplexing.

Signal regeneration (regenerating)—Also, rejuvenation. This may entail 1R, 2R, 3R or 4R and in a broader sense signal A/D multiplexing, switching, routing, grooming, wavelength conversion as discussed, for example, in the book entitled, "Optical Networks" by Rajiv Ramaswami and Kumar N. Sivarajan, Second Edition, Morgan Kaufmann Publishers, 2002.

SMF—Single Mode Fiber.
SML—Semiconductor Modulator/Laser.
SOA—Semiconductor Optical Amplifier.
SONET—Synchronous Optical Network.
SSC—Spot Size Converter, sometimes referred to as a mode adapter.
TDM—Time Division Multiplexing.
TEC—Thermo Electric Cooler.
TRxPIC—Monolithic Transceiver Photonic Integrated Circuit.
Tx—Transmitter, here in reference to optical channel transmitters.
TxPIC—Transmitter Photonic Integrated Circuit.
VOA—Variable Optical Attenuator.
WDM—Wavelength Division Multiplexing. As used herein, WDM includes Dense Wavelength Division Multiplexing (DWDM).

DWDM optical networks are deployed for transporting data in long haul networks, metropolitan area networks, and other optical communication applications. In a DWDM system, a plurality of different light wavelengths, representing signal channels, are transported or propagated along fiber links or along one more optical fibers comprising an optical span. In a conventional DWDM system, an optical transmitter is an electrical-to-optical (EO) conversion apparatus for generating an integral number of optical channels $\lambda_1, \lambda_2, \ldots \lambda_N$, where each channel has a different center or peak wavelength. DWDM optical networks commonly have optical transmitter modules that deploy eight or more optical channels, with some DWDM optical networks employing 30, 40, 80 or more signal channels. The optical transmitter module generally comprises a plurality of discrete optical devices, such as a discrete group or array of DFB or DBR laser sources of different wavelengths, a plurality of discrete modulators, such as, Mach-Zehnder modulators (MZMs) or electro-absorption modulators (EAMs), and an optical combiner, such as a star coupler, a multi-mode interference (MMI) combiner, an Echelle grating or an arrayed waveguide grating (AWG). All of these optical components are optically coupled to one another as an array of optical signal paths coupled to the input of an optical combiner using a multitude of single mode fibers (SMFs), each aligned and optically coupled between discrete optical devices. A semiconductor modulator/laser (SML) may be integrated on a single chip, which in the case of an electro-absorption modulator/laser (EML) is, of course, an EA modulator. The modulator, whether an EAM or a MZM, modulates the cw (continuous wave) output of the laser source with a digital data signal to provide a channel signal which is different in wavelength from each of the other channel signals of other EMLs in the transmitter module. While each signal channel has a center wavelength (e.g., 1.48 μm, 1.52 μm, 1.55 μm, etc.), each optical channel is typically assigned a minimum channel spacing or bandwidth to avoid crosstalk with other optical channels. Currently, channel spacings are greater than 50 GHz, with 50 GHz and 100 GHz being common channel spacings.

An optical fiber span in an optical transport network may provide coupling between an optical transmitter terminal and an optical receiver terminal. The terminal traditionally is a transceiver capable of generating channel signals as well as receiving channel signals. The optical medium may include one or more optical fiber links forming an optical span with one or more intermediate optical nodes. The optical receiver receives the optical channel signals and converts the channel signals into electrical signals employing an optical-to-electrical (OE) conversion apparatus for data recovery. The bit error rate (BER) at the optical receiver for a particular optical channel will depend upon the received optical power, the optical signal-to-noise ratio (OSNR), non-linear fiber effects of each fiber link, such as chromatic dispersion (CD) and polarization mode dispersion (PMD), and whether a forward error correction (FEC) code technique was employed in the transmission of the data.

The optical power in each channel is naturally attenuated by the optical fiber link or spans over which the channel signals propagate. The signal attenuation, as measured in dB/km, of an optical fiber depends upon the particular fiber, with the total loss increasing with the length of optical fiber span.

As indicated above, each optical fiber link typically introduces group velocity dispersion (GVD) comprising chromatic dispersion (CD) and polarization mode dispersion (PMD). Chromatic dispersion of the signal is created by the different frequency components of the optical signal travel at different velocities in the fiber. Polarization mode dispersion (PMD) of the signal is created due to the delay-time difference between the orthogonally polarized modes of the signal light. Thus, GVD can broaden the width of an optical pulse as it propagates along an optical fiber. Both attenuation and dispersion effects can limit the distance that an optical signal can travel in an optical fiber and still provide detectable data at the optical receiver and be received at a desired BER. The dispersion limit will depend, in part, on the data rate of the optical channel. Generally, the limiting dispersion length, L, is modeled as decreasing inversely with $B^2$, where B is the bit rate.

The landscape of optical transport networks has change significantly over the past ten years. Prior to this time, most long haul telecommunication networks were generally handled via electrical domain transmission, such as provided through wire cables, which is bandwidth limited. Telecommunication service providers have more recently commercially deployed optical transport networks having vastly higher information or data transmission capability compared to traditional electrical transport networks. Capacity demands have increased significantly with the advent of the Internet. The demand for information signal capacity increases dramatically every year.

In a conventional long haul DWDM optical network, erbium doped fiber amplifiers (EDFAs) may be employed at intermediate nodes in the optical span to amplify attenuated optical channel signals. Dispersion compensation devices may also be employed to compensate for the effects of fiber pulse dispersion and reshape the optical pulses approximately to their original signal shape.

As previously indicated, a conventional DWDM optical network requires a large number of discrete optical components in the optical transmitter and receiver as well as at intermediate nodes along the optical link between the transmitter terminal and the receiver terminal. More particularly, each optical transmitter typically includes a semiconductor laser source for each optical channel. Typically a packaged module may include a semiconductor laser and a monitoring photodiode (MPD) to monitor the laser source wavelength and intensity and a heat sink or thermal electric cooler (TEC) to control the temperature and, therefore, wavelength of the laser source. The laser sources as well as the optical coupling means for the output light of the laser source to fiber pigtail, usually involving an optical lens system, are all mounted on a substrate, such as a silicon microbench. The output of the laser pigtail is then coupled to an external electro-optical modulator, such as a Mach-Zehnder lithium niobate modulator. Alternatively, the laser source itself may be directly modulated. Moreover, different modulation approaches may be employed to modulate the external modulator, such as dual tone frequency techniques.

The output of each modulator is coupled via an optical fiber to an optical combiner, such as, an optical multiplexer, for example, a silica-based thin film filter, such as an array waveguide grating (AWG) fabricated employing a plurality of silicon dioxide waveguides formed in a silica substrate. The fibers attached to each device may be fusion spliced together or mechanically coupled. Each of these device/fiber connections introduces a deleterious, backward reflection into the transmitter, which can degrade the channel signals. Each optical component and fiber coupling also typically introduces an optical insertion loss.

Part of the cost of the optical transmitter is associated with the requirement that the optical components also be optically compatible. For example, semiconductor lasers typically produce light output that has a TE optical mode. Conventional optical fibers typically do not preserve optical polarization. Thus, optical fiber pigtails and modulators will transmit and receive both transverse electric (TE) and transverse magnetic (TM) polarization modes. Similarly, the optical combiner is polarization sensitive to both the TE and TM modes. In order to attenuate the effects of polarization dispersion, the modulator and the optical combiner are, therefore, designed to be polarization insensitive, increasing their cost. Alternatively, polarization preserving fibers may be employed for optically coupling each laser source to its corresponding modulator and for coupling each modulator to the optical combiner. Polarization preserving fibers comprise fibers with a transverse refractive index profile designed to preserve the polarization of an optical mode as originally launched into a fiber. For example, the fiber core may be provided with an oblong shape, or may be stressed by applying a force to the fiber to warp the refractive index of the waveguide core along a radial or cross-sectional lateral direction of the fiber, such as a PANDA™ fiber. However, polarization preserving fibers are expensive and increase packaging costs since they require highly accurate angular alignment of the fiber at each coupling point to an optical component in order to preserve the initial polarization of the channel signal.

A conventional optical receiver also requires a plurality of discrete optical components, such as an optical demultiplexer or combiner, such as an arrayed waveguide grating (AWG), optical fibers, optical amplifiers, and discrete optical detectors as well as electronic circuit components for handling the channel signals in the electrical domain. A conventional optical amplifier, such as an EDFA, has limited spectral width over which sufficient gain can be provided to a plurality of optical signal channels. Consequently, intermediate OEO nodes will be required comprising a demultiplexer to separate the optical channel signals, photodetector array to provide OE conversion of the optical signals into the electrical domain, 3R processing of the electrical channel signals, EO conversion or regeneration of the processed electrical signals, via an electro-optic modulator, into optical signals, optical amplifiers to amplify the channel signals, dispersion compensators to correct for signal distortion and dispersion, and an optical multiplexer to recombine the channel signals for propagation over the next optical link.

There is considerable interest in DWDM systems to increase both the data rate of each signal channel as well as the number of channels, particularly within the gain bandwidth of the EDFA. However, increasing the channel data rate necessitates increasing the number of intermediate nodes along the optical path to provide the required signal dispersion compensation and amplification. Increasing the number of channels requires precise control of channel assignment and more precise control over signal dispersion, which dramatically increases the complexity and cost of the fiber-optic components of the system. A further complication is that many pre-existing optical networks use different types of optical fibers in the different optical links of the optical network having, therefore, different dispersion effects over different fiber lengths. In some cases, the wavelengths of the optical channels generated at the optical transmitter may not be optimal for one or more optical links of the optical span.

What is desired are improved techniques to provide DWDM optical network services through improved, integrated optical network components and systems.

SUMMARY OF THE INVENTION

According to this invention, a photonic integrated circuit (PIC) chip comprising an array of modulated sources, each providing a modulated signal output at a channel wavelength different from the channel wavelength of other modulated sources and a wavelength selective combiner having an input optically coupled to received all the channel signal outputs from the modulated sources and provide a combined output signal on an output waveguide from the chip. The modulated sources, combiner and output waveguide are all integrated on the same chip.

An optical transmitter comprises a photonic integrated circuit chip or TxPIC chip having an integrated array of modulated sources which may be an array of directly modulated laser sources or an integrated array of laser sources and electro-optic modulators. The modulated sources have their outputs coupled to inputs of an integrated optical combiner. For example, the laser array may be DFB lasers or DBR lasers, preferably the former, which, in one embodiment may be directly modulated. The electro-optical modulator may be comprised of electro-absorption (EA) modulators (EAMs) or Mach-Zehnder modulators (MZMs), preferably the former. The optical combiner may be a free space combiner or a wavelength selective combiner or multiplexer, where examples of the free space combiner are a power coupler such as a star coupler and a multi-mode interference (MMI) coupler, and examples of a wavelength selective combiner are an Echelle grating or an arrayed waveguide grating (AWG), preferably the latter multiplexer because of its lower insertion loss. This disclosure discloses many different embodiments of the TxPIC, applications of the TxPIC in an optical transport network and wavelength stabilization or monitoring of the TxPIC.

The TxPIC chip in its simplest form comprises a semiconductor laser array, an electro-optic modulator array, an optical combiner and an output waveguide. The output waveguide may include a spot size converter (SSC) for providing a chip output that is better matched to the numerical aperture of the optical coupling medium, which is typically an optical fiber. In addition, a semiconductor optical amplifier (SOA) array may be included in various points on the chip, for example, between the modulator array and the optical combiner; or between the laser array and the modulator array. In addition, a photodiode (PD) array may be included before the laser array; or between the laser array and the modulator array; or between an SOA array, following the laser array, and the modulator array, or between the modulator array and the optical combiner; or between an SOA array, following the modulator array, and the optical combiner. Also, an SOA may be provided in the output waveguide, preferably a laser amplifier, for example, a GC-SOA.

A preferred form of the TxPIC chip may be comprised of an array of modulated sources comprising a DFB laser array and an EAM array, together with an AWG multiplexer and possibly with some on-chip monitoring photodiodes, such as PIN photodiodes or avalanche photodiodes (APDs).

Another disclosed feature is a transceiver (TRxPIC) that includes, in addition to the laser and modulator arrays and combiner, an array of photodetectors to receive optical channel signals for OE conversion as well as provide for transmission of optical channel signals on single output waveguide or on separate input and output waveguides. In such an embodiment, the optical combiner or multiplexer also functions as an optical decombiner or demultiplexer. On-chip optical amplifiers may be provided in the output waveguide from the optical combiner or in the input waveguide to the optical combiner to amplify the channel signals.

Another disclosed feature is deployment of a plurality of output waveguides from the TxPIC chip AWG combiner to provide for selection of the output having optimized passband characteristics.

Another disclosed feature is the deployment of redundant sets of modulated sources, such as, for examples, EMLs, (combination laser/modulator) on the TxPIC chip coupled to the optical combiner for substitution of faulty EMLs thereby enhancing chip yield.

Another disclosed feature is the deployment of an on-chip photodiode on the TxPIC to monitor or check for antireflection qualities of an AR coating applied to the front facet of the TxPIC chip.

Another disclosed feature is the provision of PIC OEO REGEN chip or chips where the PIC chip(s) are flip chip mounted to IC circuit chips.

Another disclosed feature is the provision of an integrated array of monitoring photodiodes on the TxPIC chip adjacent the back end of the array lasers to monitor their optical power and which may later be cleaved from the TxPIC chip.

Another disclosed feature is the provision of at least one extra set of modulated sources, such as SMLs, along the edges of the TxPIC chip or along the edges of the wafer containing the TxPIC die.

Another disclosed feature is the provision of a redundant laser source or modulated source on the TxPIC to be substituted for faulty laser sources thereby increasing chip yield.

Another disclosed feature is a TxPIC chip platform that includes a submount containing contact leads from the TxPIC chip to be elevated over and spatially separated from the TxPIC chip.

Another disclosed feature is a card probe for checking and testing the operational integrity of the TxPIC chips while as die within a wafer.

Another disclosed feature is the provision of TxPIC chip geometry that substantially prevents stray light from entering the TxPIC output waveguide thereby affecting the channel signal insertion loss.

Another disclosed feature is the provision of at least two TxPIC chips that each have a first set of channel wavelengths where one of the chips is temperature tuned to produce a second set of channel wavelengths different from the first set of channel wavelengths so that the two chips together provide a contiguous set of monotonic increasing or decreasing channel transmission wavelengths.

Another disclosed feature is the deployment of a plurality of TxPIC chips each having an on-chip WDM channel multiplexer where the WDM combined chip outputs are then multiplexed or interleaved. A plurality of channel signals with wider on-chip channel spacing can be combined into a narrower channel spacing through interleaving of the WDM combined channel signals.

Another disclosed feature is the deployment of a plurality of RxPIC chips each having an on-chip WDM channel demultiplexer where the WDM combined chip inputs are first de-interleaved into red/blue wavelength channel groups followed by red and blue wavelength channel group demultiplexing thereby significantly reducing the number of optical connections necessary in a large multi-channel optical transport network.

Another disclosed feature is the provision of a wavelength locking apparatus for a TxPIC chip.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a schematic block diagram of an example of a single channel in a TxPIC chip.

FIG. 2 is another schematic block diagram of another example of a single channel in a TxPIC chip.

FIG. 3 is another schematic block diagram of a further example of a single channel in a TxPIC chip.

FIG. 4 is a cross-sectional view of a first embodiment of a monolithic TxPIC chip illustrating a signal channel waveguide through an integrated DFB laser, EAM modulator and an optical combiner.

FIG. 5 is a cross-sectional view of a second embodiment of a monolithic TxPIC chip illustrating a signal channel waveguide through an integrated DFB laser, EAM modulator and an optical combiner.

FIG. 6 is a cross-sectional view of a third embodiment of a monolithic TxPIC chip illustrating a signal channel waveguide through an integrated DFB laser, EAM modulator, semiconductor optical amplifier (SOA) and an optical combiner.

FIG. 7A is a schematic diagram of the plan view of a monolithic TxPIC adapted also to receive data from an optical link.

FIG. 7B is a schematic diagram of a modified version of the monolithic TxPIC of FIG. 7A.

FIG. 7C is a schematic diagram of a further modified version of the monolithic TxPIC of FIG. 7A.

FIG. 8 is a schematic diagram of a plan view of a monolithic TxPIC for utilizing an on-chip photodetector to monitor facet reflectivity during the antireflection (AR) coating process.

FIG. 9 is a schematic diagram of a plan view of a first type of monolithic transceiver (TRxPIC) with interleaved optical transmitter and receiver components.

FIG. 10 is a schematic diagram of a side view of a second type of monolithic transceiver (TRxPIC) useful for 3R regeneration and flip chip coupled to a submount with control electronic semiconductor chip components for operating the TRxPIC.

FIG. 11 is a schematic diagram of a plan view of a monolithic TxPIC with external monitoring photodiodes (MPDs) for monitoring the wavelength and/or intensity of the laser sources.

FIG. 12 is a schematic diagram of a plan view of a monolithic TxPIC with detachable integrated MPDs and heater sources provided for each laser source and the optional SOAs, and for the optical combiner.

FIG. 13 is a schematic diagram of a plan view of a monolithic TxPIC with MPD coupled between each laser source and electro-optic modulator to monitor the output intensity and/or wavelength of each laser source.

FIG. 14 is a schematic diagram of a plan view of a monolithic TxPIC with MPD coupled between each electro-optic modulator and the optical combiner to monitor the output intensity and/or chirp parameter of each modulator.

FIG. 15 is a schematic diagram of a plan view of a monolithic TxPIC with MPD coupled to a tapped portion of the multiplexed signal output of the TxPIC to monitor the signal channel intensity and wavelength.

FIG. 16 is a schematic diagram of a plan view of a monolithic TxPICs as-grown in an InP wafer.

FIG. 17 is a flowchart of a method for generating calibration data during manufacture to store calibrated data in adjusting the bias of the laser sources, modulators and SOAs, if present, in the TxPIC and thereafter adjust the wavelength of the channels to be set at the predetermined wavelengths after which the SOAs, if present, may be further adjusted to provide the appropriate output power.

FIG. 18 is a schematic diagram of a plan view of another embodiment of a TxPIC chip where additional SMLs are formed at the edges of the InP wafer or, more particularly, to the edges of the TxPIC chip or die in order to maximize chip yield per wafer.

FIG. 19A is a schematic diagram of a plan view of another embodiment of a TxPIC chip where additional redundant SML sets are formed between SML sets that are to be deployed for signal channel generation on the chip and used to replace inoperative SMLs, either at the time of manufacture or later in the field, thereby maximizing chip yield per wafer.

FIG. 19B is a schematic diagram of a plan view of another embodiment of a TxPIC chip where additional redundant laser sources are provided for each signal channel on the chip so that if one of the pair of laser sources is inoperative, either at the time of manufacture or later in the field, the other source can be placed in operation, thereby maximizing chip yield per wafer.

FIG. 20 is a schematic diagram of a plan view of another embodiment of a TxPIC chip illustrating one embodiment of the provision of RF conductive lines employed for modulating the electro-optic modulators on the chip.

FIG. 20A is a graphic illustration of how the modulators of FIG. 20, or any other modulator in other embodiments, are operated via negative bias and peak-to-peak swing.

FIG. 21 is a perspective view of a schematic diagram of the bias contacts and bonding wire or tape for electro-optic components and the RF lines and contacts for the electro-optic modulators.

FIG. 22 is a schematic side view of a probe card with multiple probes inline with contact pad on a TxPIC chip to provide PIC chip testing at the wafer level or after burn-in for reliability screening prior to final chip fabrication.

FIG. 24A is a schematic diagram of a plan view of another embodiment of a TxPIC chip with an arrayed waveguide grating (AWG) as a combiner and illustrating the geometric arrangement of optical components to insure that stray light from the SML components do not interfere with the output waveguides of the optical combiner.

FIG. 24B is a schematic diagram of a plan view of another embodiment of a TxPIC chip with an arrayed waveguide grating (AWG) as a combiner illustrating the geometric arrangement of optical components to insure that stray light from the SML components do not interfere with the output waveguides of the optical combiner.

FIG. 24C is a schematic diagram of a plan view of another embodiment of a TxPIC chip with an optical coupler as a combiner illustrating the geometric arrangement of optical components to insure that stray light from the SML components do not interfere with the output waveguides of the optical combiner.

FIG. 25 is a schematic diagram of a plan view of another embodiment of a TxPIC chip deploying Mach-Zehnder Modulators (MZMs) in the TxPIC chip.

FIG. 26 is a cross-sectional view of an embodiment of a DFB laser source that may be deployed in FIG. 25.

FIG. 27 is a cross-sectional view of an embodiment of a Mach-Zehnder Modulator (MZM) that may be deployed in FIG. 25.

FIG. 28 is a schematic block diagram of another embodiment of a single channel in the TxPIC chip of FIG. 25.

FIG. 29 is a schematic block diagram of a further embodiment of a single channel in the TxPIC chip of FIG. 25.

FIG. 30 is a graphic illustration of an example of the absorption of a modulator verses wavelength.

FIG. 31 is a cross-sectional view of an example of a band-edge electro-absorption modulator (BE-EAM).

FIG. 32 is a diagrammatic side view of multiple TxPICs with the same wavelength grid output but having separate TEC control to achieve a wavelength band shift of one PIC relative to the other to achieve a separate set of signal signals within the wavelength grid of the optical combiner.

FIG. 33 is a representative example of the multiple wavelength outputs of the pair of TxPIC chips of FIG. 32.

FIG. 34 is a schematic diagram of a plan view of an embodiment of an optical transmitter portion of an optical transport system employing a plurality TxPIC chips with interleaved signal channel outputs.

FIG. 34A is a graph illustration of the first and second TxPICs of the optical transmitter of FIG. 34 showing their wavelength outputs verse power before interleaving with a wavelength grid at a larger spatial separation or pitch.

FIG. 34B is a graph illustration of the first and second TxPICs of the optical transmitter of FIG. 34 showing their interleaved wavelength outputs verse power after interleaving with a wavelength grid at a smaller spatial separation or pitch.

FIG. 35A is an illustration of one kind of interleaving where the TxPICs such as shown in FIG. 34 have on-chip channel spacing of 100 GHz or 200 GHz.

FIG. 35B is an illustration of another kind of interleaving where the TxPICs such as shown in FIG. 34 have on-chip channel spacing of 50 GHz.

FIG. 36 is a schematic diagram of a plan view of an embodiment of optical transport system employing a plurality TxPIC chips with multiplexed signal channels at the optical transmitter launched on a fiber link and received at an optical receiver where the signal channels are de-interleaved and demultiplexed to a plurality of RxPIC chips.

FIG. 37 is a schematic diagram of a plan view of a TxPIC chip with a wavelength locker system utilizing frequency tone identifying tags for each laser source in the TxPIC.

FIG. 38 is a graphic illustration of a frequency tone for a laser source in the TxPIC shown in FIG. 35.

DESCRIPTION OF THE PREFERRED EMBODIMENTS

Figure 23:
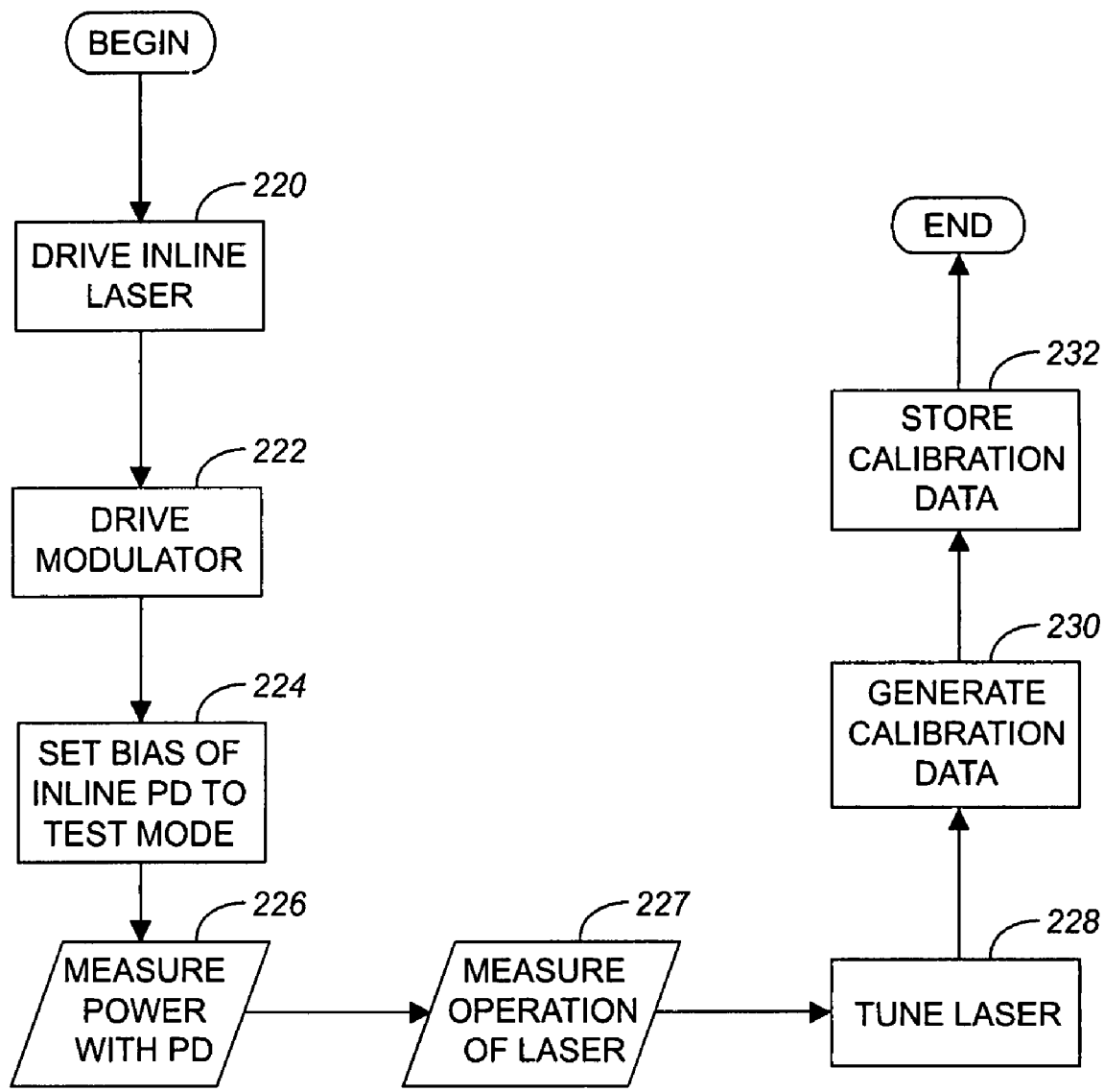
FIG. 23 is flowchart of a method for wafer level testing of laser source output power using integrated PDs which may later be rendered optically transparent.

Reference is now made to FIGS. 1A and 1B which illustrate, in block form, an optical path on a monolithic TxPIC chip 10 showing plural active and passive optically coupled and integrated components. What is shown in diagrammatic form is one channel of such a chip. Both FIGS. 1A and 1B show modulated sources coupled to an optical combiner. Shown in FIG. 1A is one of an array of sources comprising a directly modulated semiconductor laser 12 integrated with an optical combiner 16 having an optical output waveguide 18 to take a combined channel signal off-chip. Shown in FIG. 1B is one of an array of sources comprising a semiconductor laser 12 optically coupled to one of an array of modulators comprising an electro-optic modulator 14 optically coupled to an input of an optical combiner 16 with the output of combiner 16 coupled to an optical output waveguide 18. There are plural optical paths on chip 10 of semiconductor laser 12 and electro-optic modulator 14, also in combination referred to as an SML, these SMLs respectively coupled to inputs of optical combiner 16. This is the basic monolithic, generic structure of a TxPIC chip 10 for use in an optical transmitter module, also referred to by the applicants herein as a DLM (digital line module).

The semiconductor laser 12 may be a DFB laser or a DBR laser. While the later has a broader tuning range, the former is more desirable from the standpoint of forming an array of DFB lasers 12 that have peak wavelengths, which are created in MOCVD (metalorganic chemical vapor deposition) employing SAG (selective area growth) techniques to approximate a standardized wavelength grid, such as the ITU grid. There has been difficulty in the integration of DFB lasers with an optical combiner but the careful deployment of SAG will provide a TxPIC 10 that has the required wavelength grid. Thus, the optical SML paths, mentioned in the previous paragraph, are modulated data signal channels where the modulated channel signals are respectively on the standardized grid. Electro-optic modulators 14 may be EAMs (electro-absorption modulators) or MZMs (Mach-Zehnder modulators). Optical combiner 18 may be comprised of a star coupler, a MMI coupler, an Echelle grating or an arrayed waveguide grating (AWG). To be noted is that there is an absence in the art, at least to the present knowledge of the inventors herein, of the teaching and disclosure of an array of modulated sources and wavelength selective optical multiplexer, e.g., such as an arrayed waveguide grating (AWG) or Echelle grating In this disclosure, a wavelength selective multiplexer or combiner is defined as one that has less than 1/N insertion loss wherein N is the number of modulated sources being multiplexed. One principal reason is that it is difficult to fabricate, on a repeated basis, an array of lasers with a wavelength grid that simultaneously matches the wavelength grid of the wavelength selective combiner (e.g., an AWG). The AWG is preferred because it can provide a lower loss multiplexing structure. Additionally, an AWG may provide a narrow passband for grid wavelengths of lasers such as DFB lasers.

In FIG. 2, there is shown a further embodiment of a monolithic TxPIC 10 chip. The TxPIC chip here is the same as that shown in FIG. 1B except there is an additional active component in the form of semiconductor optical amplifier (SOA) 20. Due to insertion losses in the optical components on the chip 10, particularly at points of their coupling, an on-chip amplifier 20 may be included in each EML optical path to boost the output channel signals from modulators 14. An advantage of SOAs on TxPIC chips 10 compared to their deployment on RxPIC chips is the relaxation of the optical signal to noise ratio (OSNR) on the TxPIC SOAs compared to their employment in RxPIC SOAs. SOAs deployed on RxPIC chips are positioned at the input of the chip to enhance the gain of the incoming multiplexed channel signal and is dominated by ASE generated from the SOA which can effect the proper detection of channel signal outputs. This is not as significant a problem in TxPIC chips which renders their usage in TxPIC chips as more acceptable in design freedom. As a result, the noise figure design criteria are relaxed in the transmitter side, compared to the receiver side and being sufficient for 100 km optical fiber link. Thus, OSNR limited optical devices can drive the architecture and this has not been recognized by those skilled in the art. More details of RxPIC chips can be found in U.S. Pat. No. 7,116,851, which is incorporated herein by its reference.

It should be noted that the peak wavelengths of the SOAs 20 on a TxPIC chip 10, such as, for example, SOAs 20 following each modulator 14 of each channel on an N channel TxPIC chip 10, should preferably have a peak wavelength slightly longer, such as, for example, in the range of 10 nm to 80 nm or preferably in the range of 30 nm to 60 nm, than its corresponding semiconductor laser, such as a DFB laser, in order to compensate for band-filling effects in SOAs 20, which effectively shifts the gain peak of an SOA 14 to shorter wavelengths when the SOA is placed into operation. The amount of wavelength shift depends upon the designed bias point of the SOA. A preferred way to accomplish a different peak wavelength in SOAs 20, compared to its corresponding semiconductor DFB laser, is to change the size or thickness of the active region of SOA 20 to change its built-in peak wavelength through the use of SAG or, alternatively, through multiple layer regrowths. The use of SAG in fabrication of chip 10 is discussed in more detail in U.S. Pat. No. 7,058,246, which is incorporated herein by its reference.

Also, attention should be drawn to the optimization of active optical component to active optical component spacing relative to substrate thickness to minimize thermal cross-talk between active optical components on TxPIC chip 10. Inter-component spacing of active optical components, such as DFB lasers 12, modulators 14 and SOAs 20, is, in part, driven by thermal crosstalk, e.g., changes in temperature operation of these components that affect the optical characteristics of neighboring active optical components, such as their wavelength or their bias point. Therefore, these active optical components should be sufficiently spaced in order to minimize thermal crosstalk affecting neighboring component operation. Component separation is also important with respect to substrate thickness. Ideally, the thickness of the substrate should be kept to a maximum in order to minimize wafer breakage, particularly in the case of highly brittle InP wafers, as well as breakage at the chip level during handling or processing. On the other hand, the substrate should not be too thick rendering cleaving yields lower or resulting in excess heating and thermal crosstalk due to thicker substrates. As an example, for a 500 μm thick InP substrate, a preferred inter-component separation is in the range of about 200 μm to about 600 μm.

Reference is now made to FIG. 3 which shows, in block form, a TXPIC chip 10 similar to the chip shown in FIG. 1 except the output waveguide 18A from the optical combiner includes in its path an SOA. Thus, the multiplexed channel signals may be on-chip amplified prior to their launching on an optical transport medium such as an optical fiber link. This chip output amplifier may be preferred as a gain-clamped SOA which is discussed in more detail in connection with FIG. 9.

Reference is now made to cross section views of various representative embodiments of a TxPIC chip 10. These cross-sectional views are not to scale, particularly in reference to the active waveguide core 42 of the disclosed semiconductor chips. Chips 10 are made from InP wafers and the layers are epitaxially deposited using an MOCVD reactor and specifically comprise DFB lasers 12, EAMs. As seen in the cross-sectional view of FIG. 4, there is shown an optical EML path and optical combiner of TxPIC chip 10, comprising an InP substrate 32, such as n-InP or InP:Fe, followed by a cladding layer 34, a waveguide layer 36, a spacer layer 38 of n-InP, followed by grating layer 40. Grating layer 40 includes a grating (not shown) in the section comprising DFB laser 12, as is well known in the art, having a periodicity that provides a peak wavelength on a standardized wavelength grid. Grating layer 40 is followed by layer 41 of n-InP, multiple quantum well region of wells and barriers employing a quaternary (Q) such as InGaAsP or AlInGaAs. These quaternaries are hereinafter collectively referred to as "Q". These layer are deposited deploying SAG using a mask to form the individual DFB bandgaps of their active regions as well as the bandgaps for the individual EAMs 14 so that wavelengths generated by the DFB laser 12 will be transparent to the individual EAMs 14. Also, the wavelength of the field of combiner 18 will be shorter than that of the EAMs 14. As an example, the longest wavelength for a DFB array may be 1590 nm, its EAM will have a wavelength of 1520 nm and the field of optical combiner 18 will have a wavelength of 1360 nm.

The Q active region 42 and the waveguide core 36 layer extend through all of the integrated optical components. If desired, the laser, and the SOA 20, if present, can be composed of a different active layer structure than the region of the EAM 14. In this embodiment, the Q waveguiding layer 36 provides most of the optical confinement and guiding through each section of the chip 10.

The chip 10 is completed with the growth of NID-InP layer 44, cladding layer 46, which is either n-InP or NID-InP, and contact layer 48 comprising $p^{++}$-InGaAs. Cladding layer 46 as well as its overlying contact layer portion is selectively etched away either over the EMLs or over the field of optical combiner 18 and regrown so that the partition results in p-InP layer 46A and $p^{++}$-InGaAs layer 48A in regions of DFB lasers 12 and EAMs 14 and a NID-InP layer 46B and a passivation layer 48B in region of the field of optical combiner 18. The reason for this etch and regrowth is to render the optical combiner field 18 non-absorbing to the optical channel signals propagating thought this optical passive device. More is said and disclosed relative to this matter in U.S. Pat. No. 7,058,246, and incorporated herein by its reference.

Chip 10 is completed with appropriate contact pads or electrodes, the p-side electrodes 44 and 46 shown respectively for DFB laser 12 and EAM 14. If substrate 32 is semiconductive, i.e., n-InP, then an n-side electrode is provided on the bottom substrate 32. If substrate 32 is insulating, i.e., InP:Fe, the electrical contact to the n-side is provided through a via (not shown) from the top of the chip down to n-InP layer 34. The use of a semi-insulating substrate 32 provides the advantage of minimizing electrical cross-talk between optical components, particularly active electrical components in aligned arrays, such as DFB lasers 12 and EAMs 14. The inter-component spacing between adjacent DFB laser 12 and EAM 14 may be about 250 μm or more to minimize cross-talk at data rates of 10 Gbits per second.

Reference is now made to FIG. 5 which is the same as FIG. 4 except that Q waveguide layer 36 is epitaxially positioned above active region 42 rather than below this region as shown in FIG. 4.

Reference is now made to FIG. 6 which is similar to FIG. 4 except that, in addition, discloses an integrated optical amplifier comprising SOA 20 with its p-side contact pad 49 and a spot size converter 22 formed in the waveguide 18 from the optical combiner 18. To be noted is that the selective area growth (SAG) techniques may be employed to vary the epitaxial growth rate along the regions of the PIC to vary the thickness of quantum well active layers longitudinally along the optical EML paths of these optical active components. For example, in the case here, layers 42A in the active region 41 of EAM 14 are made thinner compared to the DFB and optical combiner regions so that the optical mode experiences tighter confinement during modulation with no probable creation of multi-modes. Thus on either side of EAM 14, there are mode adaptors 14X and 14Y formed through SAG that respectively slightly tighten the confinement of the optical mode and permit slight expansion of the optical mode in the optical combiner where the propagation does become multi-modal.

In SSC 22 of TxPIC chip 10 of FIG. 6, in region 42B of the active region 42, the layers become increasingly narrower so that the optical mode in the case here can expand more into NID-InP layer 46B permitting the mode expansion to more approximate the numerical aperture of a coupling optical fiber. In this connection, other layers of the structure may be shortened, such as in a step-pad manner as is known in the art, to form an aperture in the waveguide 18 from the PIC that provides a beam from chip 10 to approximate the numerical aperture of a coupling optical fiber.

TxPIC chip 10 is fabricated through employment of MOCVD where, in forming active region 42 across all of the chips in an InP wafer, a patterned $SiO_2$ mask is positioned over the growth plane of the as-grown InP substrate. The patterned $SiO_2$ mask has a plurality of openings of different widths and masking spaces of different widths so that the growth rates in the mask openings will depend upon the area (width) of the opening as well as the width of masks on the sides of the openings. The reason that the mask widths play a role in what is deposited in the openings is that the reactants, such as molecules of Ga and In, in particular In, breakup or crack from their carrier gas quickly at regions of the $SiO_2$ mask and will migrate off the mask into the mask openings. For example, quantum well layers grown in wider open areas tend to grow slower and have a different composition than quantum wells grown on narrower open areas. This effect may be employed to vary quantum well bandgap across the plane of the substrate for each of the DFB lasers 12, EAMs 14 and the field of the combiner 18. The corresponding differences in quantum well energy can exceed 60 meV, which is sufficient to create regions having a low absorption loss at the lasing wavelength. The $SiO_2$ masks are removed after the growth of active region 42. Additional growth and a subsequent etchback and regrowth are then performed, as previously discussed, to form a continuous buried waveguide integrated transmitter chip.

An optical transport module may be fabricated employing a separate RxPIC chip and a TxPIC chip. However, a TRxPIC chip is employed that includes both transmitter and receiver components. The transmitter and receiver components share a common AWG or may be two AWGs, a first AWG for the transmitter portion of the TRxPIC and a second AWG for the receiver portion of the TRxPIC. In this case, the AWGs may be mirrored imaged AWGs as known in the art. Embodiments of TRxPICs 10 are disclosed in FIGS. 7A through 8.

Reference is first made to FIG. 7A illustrating an embodiment of TRxPIC chip 10. Chip 10 comprises an array of DFB lasers 12 and array of EAMs 14 optically coupled via waveguides 24 to an optical combiner comprising an arrayed waveguide grating (AWG) 50. For example, TRxPIC may have ten signal channels with wavelengths of $\lambda_1$ to $\lambda_{10}$ forming a first wavelength grid matching that of a standardized wavelength grid. However, as indicated before, the number of channel signal EMLs may be less than or greater than ten channels, the latter depending upon the ability to spatially integrate an array of EMLs with minimal cross-talk levels. AWG 50 is an optical combiner of choice because of its capability of providing narrow passbands for the respective channel signals thereby providing the least amount of noise through its filtering function. Also, AWG 50 provides for comparative low insertion loss. AWG 50, as known in the art, comprises an input slab or free space region 52, a plurality of grating arms 56 of predetermined increasing length, and an output slab or free space region 54. AWG 50 is capable of providing for transmission of multiplexed channel signals as well as to receive multiplexed channel signals. In this case, there are waveguides 26A and 26B coupled between the output slab 54 of AWG 50 and the output of chip 10. Output waveguide 26A is the output for multiplexed channel signals 27 generated on-chip by the EMLs and launched onto the optical link, and input waveguide 26B is the input for multiplexed channel signals 29 received from the optical link. To be noted is that TRxPIC chip 10 includes an array of integrated photodiodes (PDs) 15, two of which are shown at 15A and 15B, for receiving incoming demultiplexed channel signals on optically coupled waveguides 24 from AWG 50. Thus, AWG 50 is optically bidirectional and may be deployed simultaneously to multiplex outgoing optical channel signals to output waveguide 26A and to demultiplex (route) a multiplexed input optical signal, preferably comprising channel signals of different wavelengths from the outgoing channel signals, which are coupled from the optical link for distribution and detection to PDs 15A, 15B, etc. Thus, AWG 50 can function in one direction as a multiplexer and in the opposite direction as a demultiplexer as is known in the art. PDs 15 may be integrated PIN photodiodes or avalanche photodiodes (APDs). There may be, for example, an array of ten such PDs 15 integrated on TRxPIC 10. The electrical channel signals generated by PDs 15 are taken off-chip for further processing as known in the art. It is preferred that the EML inputs from waveguide 24 to slab 52 of AWG 50 as well as the outputs from slab 52 to PDs 15 are formed in the first order Brillouin zone output of slab 52.

Alternatively, it should be noted that the input signal to TRxPIC 10 may be one or more service channel signals, for example, from another optical receiver or TRxPIC transmitter. AWG 50 would route these signals to appropriate in-chip photodetectors 15 and taken off-chip as electrical service signals for further processing.

In the embodiments herein deploying an AWG as an optical combiner, the AWG may be designed to be polarization insensitive, although this is not critical to the design of the TxPIC 10. In general, an AWG does not need to be polarization insensitive because the propagating polarization modes from the respective DFB laser sources to the AWG are principally in the TE mode. However, due to multimode propagation in the AWG, the TM mode may develop in one or more arms of the AWG in a worst case situation. There are ways to combat this issue which are to (1) employ polarization selective elements, (2) place a TM mode filter at the output of the AWG and/or (3) make the SOAs 20, such as in the case of the embodiment of FIG. 6, have the same polarization bias as the DFB lasers 12 so that the amplification provided by the SOAs, following modulation, will amplify the TE mode rather than the TM mode so that any amount of presence of the TM mode will be substantially suppressed before the TE mode encounters the AWG 50.

The design of the passive output waveguide 26A of AWG 50 of TRxPIC chip 10, or any chip 10 embodiment output waveguide disclosed herein, involves several additional considerations. The total power coupled by the AWG output waveguide 26 into optical fiber link should be sufficient to allow low error rate transmission. It is, thus, desirable that the output waveguide have a low insertion loss to increase the coupled power. However, it is also desirable that the power density in the AWG output waveguide 26 be below the threshold limit for two photon absorption. For an AWG output waveguide, such as waveguide 26, this corresponds to approximately 20 mW total average power for all channels for a waveguide width in the range of approximately 1 µm to 3 µm. Additionally, it is also desirable that output waveguide 26 be oriented at an angle relative to an axis perpendicular to the plane of the output face or facet of chip 10, such as at an angle of about 7°, to reduce the capture of stray light emanating from the on-chip EMLs in order to maintain a high extinction ratio for signal channels. More will be said about this issue in connection with the embodiments of FIGS. 24A and 24B.

Reference is now made to FIG. 7B which discloses the same TRxPIC 10 of FIG. 7A except that the TRxPIC 10 of FIG. 7B includes, in addition, the array of SOAs 58A, 58B, etc. formed in the on-chip optical waveguides 24 to PDs 15A, 15B, etc. SOAs 58 respectively provide gain to demultiplexed channel signals that have experienced on-chip insertion loss through AWG 50 so that a stronger channel signal is detected by PDs 15. SOAs 58 are optional and can be eliminated depending upon the design of AWG 50 where it provides a low insertion loss, such as below 3 dB. TRxPIC 10 in both FIGS. 7A and 7B include, as an example, ten signal channels with wavelengths of $\lambda_1$ to $\lambda_{10}$ forming a first wavelength grid matching that of a standardized wavelength grid. The wavelength grid for received channel signals may be, for example, $\lambda_{11}$ to $\lambda_{20}$ forming a second wavelength grid matching that of a standardized wavelength grid. It is preferred that the incoming channel signals be of different grid wavelengths so as not to provide any interference, particularly in AWG 50. Compare this embodiment of FIG. 7B with the embodiment shown in FIG. 8 to be later discussed. In the case here of FIG. 7B, the wavelengths of the incoming signals are different from the outgoing signal, whereas in FIG. 8 the wavelengths of the incoming and outgoing channels are interleaved. In either case, the received channels, $\lambda_{11}$-$\lambda_{20}$, that are provided as an output from the AWG may be coupled into SOAs 58. Furthermore, an optional SOA 59 may be integrated in the input waveguide 26B before the input of AWG 50, a shown in FIG. 7B, to enhance the incoming multiplexed signal strength prior to demultiplexing at AWG 50.

Reference is now made to FIG. 7C which discloses a TRxPIC 10 that is identical to that shown in FIG. 7A except that chip includes integrated mode adaptors or spot size converters (SSCs) 62 and 64 respectively in waveguides 26A and 26B at the output of the chip for conforming the optical mode of the multiplexed signals from AWG 50 to better fit the numerical aperture of optical coupling fiber 60 and for conforming the optical mode of the multiplexed signals from fiber 60 to better fit the numerical aperture of chip 10 as well as waveguide 26B.

Another alternative approach for a TRxPIC 10 is illustrated in FIG. 8, which is basically the same as TRxPIC 10 of FIG. 7B except there are less transmitter and receiver channels, for example, only six transmitter channels and six receiver channels are disclosed, and the integrated receiver channels are interleaved with the integrated transmitter channels. Also, a single output waveguide 26 is for both received and transmitted channel signals for chip 10. Chip 10 also has a gain-clamped semiconductor optical amplifier (GC-SOA) 70 instead of a SOA. GC-SOA 70 is preferred, particularly for received channel signal 29, not only for providing on-chip gain to these signals but also the gain clamped signal or laser signal eliminates the loss of gain to higher wavelength channels. Further, the TE/TM gain ratio of the multiplexed signal traversing the GC-SOA 70 is fixed due to the presence of the gain clamped signal. Also, GC-SOA 70 provides gain to the outgoing multiplexed channel signals, $\lambda_1$-$\lambda_{10}$. More about the utility of GC-SOAs is found in U.S. Pat. No. 7,116,851, and incorporated herein by its reference. A single AWG 50 is employed for both the transmitter and receiver channels, which signal channels have interleaved wavelength bands. The channel wavelength band for the transmitter channels are $\lambda_1$-$\lambda_6$, whereas the channel wavelength band for the receiver bands are $\lambda_1+\Delta$-$\lambda_6+\Delta$ where $\Delta$ is a value sufficient to not cause significant cross-talk with the transmitter channels. A GC-SOA is required in this embodiment as a non-clamped SOA will result in significant cross-talk and pattern dependent effects. Furthermore, it is likely that the power levels of the incoming 29 and outgoing 27 channels will be significantly different resulting in gain compression of the higher power signals. Thus, a GC-SOA is required for the practical implementation of an on-chip amplifier in the location shown in FIG. 8.

Manufacturing variances in waveguide layer thicknesses and grating periodicity can cause significant variance in emission wavelength of DFB lasers fabricated on the same wafer and substantial lot-to-lot variance. Depending upon the fabrication process employed, the absolute accuracy of the DFB/DBR wavelength may be greater than about 1 nm due to the empirical process variances. For a single discrete DFB laser, control of heat-sink temperature permits tuning to within less than 0.1 nm. Consequently, it is desirable to monitor and lock the emission wavelength of each DFB laser in the array of the TxPIC to its assigned channel wavelength while also maintaining the desired output power of each channel. The light output of at least one laser may be provided as input to a filter element having a wavelength-dependent response, such as an optical transmission filter. The optical output of the filter is received by an optical detector. Changes in lasing wavelength will result in a change in detected optical power. The lasers are then adjusted (e.g., by changing the drive current and/or local temperature) to tune the wavelength. If there are SOAs or PIN photodiodes on TxPIC 10 integrated between the DFB lasers and the AWG in each signal channel, such as suggested in FIG. 12 later on, the SOA or PIN photodiode for each signal channel may be adjusted to adjust the relative output power levels to desired levels across the channels.

Reference is made to FIG. 9 illustrating another embodiment, this time of a TxPIC 10 which comprises only the transmitter channels of EMLs. Each EML optical channel comprises a DFB laser 12 and modulator 14 and AWG 50 of FIG. 7A, but having a single output waveguide 26 and one single photodiode PD 15T optically coupled by a waveguide 24 to the input slab 52 of AWG 50. PD 15T may be coupled at the second order Brillouin zone of slab 52 rather than the first order Brillouin zone where all the signal channels are coupled into slab 52. The application here of PD 15T is different from the previous embodiments in that it is deployed to check parameters on the chip after manufacture such as the amount of reflected light occurring within chip 10. In fabricating a TxPIC chip, it is often necessary to AR coat one or more facets of the chip, such as facet 10F of chip 10 where an AR coating 51 is place on this output facet to prevent facet reflections of light back into chip 10 from interfering with the multiplexed output signal. When an AWG 50 is involved, the second order Brillouin zone, PD 15T on the input side of AWG 50 may be utilized to monitor this reflected light from facet 10F. PD 15T is operated as facet 10F is being AR coated, i.e., in situ, or employed as a check of facet coating reflectivity after the AR coating has been completed. During in situ use, when a desired, after minimum, reflection is detected by PD 15, the AR coating process is terminated, the desired thickness of the AR coating having been achieved. Also, PD 15T may be deployed later in field use as a trouble shooting means to determine if there are any later occurring internal reflections or undesired light entering the chip from the optical link interfering with its operation.

As shown in FIG. 10, a TxPIC and a RxPIC are fabricated on a single substrate with each having their separate AWGs. In this embodiment, the integrated PICs can be utilized in a digital OEO REGEN as also explained and described in U.S. patent application Ser. No. 10/267,212, filed Oct. 8, 2002, and incorporated herein by its reference. In FIG. 10 an OEO REGEN 79 comprises RxPIC 80 and TxPIC 10 integrated as single chip. As in past embodiments, TxPIC 10 comprises an array of DFB lasers 12 and EA modulators 14, pairs of which are referred to as EMLs. The outputs of the EMLs are provided as an input to optical combiner 18, such as, for example an AWG or power (star) coupler. Optical combiner 18 has an output at 27 for optical coupling to fiber link. RxPIC 80 comprises an optical wavelength-selective combiner 82, such as, for example an AWG or Echelle grating, which receives an optical multiplexed signal 29 for demultiplexing into separate wavelength grid channel signals which, in turn, are respectively detected at an array of photodetectors 84, such PIN photodiodes, providing an array of electrical channel signals.

As noted in FIG. 10, the OEO REGEN 79 is flip-chip solder bonded to a submount 83, including solder bonding at 86 for connecting the converted electrical signals to IC control chip or chips 94, via electrical conductors and conductive vias in and on submount 83. IC control chip or chips 94 comprise a TIA circuit, an AGC circuit, as known in the art, and a 3R functioning circuit for re-amplifying, reshaping and retiming the electrical channel signals. The rejuvenated electrical channel signals are then passed through submount 83, via electrical conductors and conductive vias in and on submount 83, to IC modulator driver 98 where they are provided to drive EA modulators 14 via solder bonding at 90 via their coupling through conductive leads in or on submount 83. Further, IC bias circuit chip 96 provides the bias points for each of the respective lasers 12 to maintain their desired peak wavelength as well as proper bias point for EA modulators 14 midway or along the absorption edge of the modulators at a point for proper application of the peak-to-peak voltage swing required for modulation. As can be seen, the embodiment of FIG. 10 provides for a low cost digital regenerator for regeneration of optical channel signals that is compact and resides almost entirely in the exclusive form of circuit chips, some electronic and some photonic. Such an OEO REGEN 79 is therefore cost competitive as a replacement for inline optical fiber amplifiers, such as EDFAs.

To facilitate microwave packaging, the OEO REGEN 79 is preferably flip-chip mounted to a submount to form electrical connections to the several IC control chips. Also, note that IC control chips can be flip-chip bonded to OEO REGEN 79. Also, further note that the OEO REGEN 79 may comprise two chips, one being TxPIC chip 10 and the other being RxPIC chip 80.

Referring now to FIG. 11, there is shown another embodiment of a TxPIC chip 100A wherein an array of PDs 101(1) . . . 101(N) is provided, separate and outside of chip 100A, where each PD 101 is optically coupled to a rear facet of a respective DFB laser 102(1) . . . 102(N). It can be seen that there are an integral number of optical channels, $\lambda_1, \lambda_2, \ldots \lambda_n$, on chip 100A, each of which has a different center wavelength conforming to a predetermined wavelength grid. PDs 101 are included to characterize or monitor the response of any or all of respective on-chip DFB lasers 102(1) . . . 102(N). DFB lasers 102(1) . . . 102(N) have corresponding optical outputs transmitted on corresponding passive waveguides forming optical paths that eventually lead to a coupling input of optical combiner 110. For example shown here, the optical waveguides couple the output of DFB lasers 102(1) . . . 102(N, respectively, to an SOA 104(1) . . . 104(N), which are optional on the chip, an EA modulator 106(1) . . . 106(N) with associate driver $106A_1 \ldots 106A_N$, an optional SOA 108(1) . . . 108(N) and thence optically coupled to optical combiner 110, which may be, for example, an AWG 50. Each of these active components 102, 104, 106 and 108 has an appropriate bias circuit for their operation. The output waveguide 112 is coupled to an output of optical combiner 110.

Optical combiner 110 multiplexes the optically modulated signals of different wavelengths, and provides a combined output signal on waveguide 112 to output facet 113 of TxPIC chip 100A for optical coupling to an optical fiber (not shown). SOAs 108(1) . . . 108(N) may be positioned along the optical path after the modulators 106(1) . . . 106(N) in order to amplify the modulated signals prior to being multiplexed and transmitted over the fiber coupled to TxPIC chip 100A. The addition of off-chip PDs 101(1) . . . 101(N) may absorb some of the power emitted from the back facet of DFB lasers 102(1) . . . 102(N), but, of course does not directly contribute to insertion losses of light coupled from the front facet of DFB lasers 102(1) . . . 102(N) to other active on-chip components. The utility of off-chip PDs 101(1) . . . 101(N) is also beneficial for measuring the power of DFB lasers 102(1) . . . 102(N) during a calibration run, and also during its operation, in addition to being helpful with the initial testing of TxPIC 100A.

In FIG. 11, cleaved front facet 113 of chip 100A may be AR coated to suppress deleterious internal reflections. Where the off-chip PDs 101(1) . . . 101(N) are designed to be integral with chip 100A, the employment of an AR coating on front facet 113 may be unnecessary because much of the interfering stray light internal of the chip comes from the rear facet of the lasers reflecting internally to the front facet 113. As will be appreciated by those skilled in the art, each DFB laser 102 has an optical cavity providing light in the forward and rearward directions.

Conventional semiconductor laser fabrication processes for DFB and DBR lasers permits substantial control over laser wavelength by selecting a grating periodicity. However, variations in the thickness of semiconductor layers or grating periodicity may cause some individual lasers to lase at a wavelength that is significantly off from their target channel wavelength. In one approach, each laser and its corresponding SOAs are selected to permit substantial control of lasing wavelength (e.g., several nanometers) while achieving a preselected channel power.

The DFB laser may be a single section laser. Additionally, the DFB laser may be a multi-section DFB or DBR laser where some sections are optimized for power and others to facilitate wavelength tuning. Multi-section DFB lasers with good tuning characteristics are known in the art. For example, multi-section DFB lasers are described in the paper by Thomas Koch et al., "Semiconductor Lasers For Coherent Optical Fiber Communications," pp. 274-293, IEEE Journal of Lightwave Technology, Vol. 8(3), March 1990, which is incorporated herein by its reference. In a single or multi-section DFB laser, the lasing wavelength of the DFB laser is tuned by varying the current or currents to the DFB laser, among other techniques.

Alternatively, the DFB laser may have a microstrip heater or other localized heater to selectively control the temperature of the laser. In one approach, the entire TxPIC may be cooled with a single TEC thermally coupled to the substrate of the TxPIC such as illustrated in FIG. 12. FIG. 12 illustrates TxPIC chip 100B which is substantially identical to the embodiment of FIG. 11 except includes, in addition, integrated PDs 107(1) . . . (N) between modulators 106(n) . . . (N) and SOAs 108(1) . . . (N), device heaters 102A, 108A and 112 as well as PDs 101(1) . . . 101(N) which, in this case are integrated on chip 100B. PDs 101 may be deployed for initial characterization of DFB lasers 102 and then subsequently cleaved away as indicated by cleave line 116. PDs 107 are deployed to monitor the output intensity and modulator parameters such as chirp and extinction ratio (ER).

The array of DFB lasers 102 may have an array bias temperature, $T_0$, and each laser can have an individual bias temperature, $T_0+T_i$, through the employment of individual laser heaters $102A_1 \ldots 102A_N$. In FIG. 12, there is shown a heater $102A_1 \ldots 102A_N$ for each DFB 102 on TxPIC chip 100B, and also a separate heater 111 for optical combiner 110 and a TEC heater/cooler 114 for the entire the chip. The best combination may be a heater 102A for each respective DFB laser 102 and a chip TEC heater/cooler 114, with no heater 111 provided for combiner 110. In this just mentioned approach, the TEC 114 may be employed to spectrally adjust the combiner wavelength grid or envelope, and individual heaters 102A of DFB lasers 102 are then each spectrally adjusted to line their respective wavelengths to the proper wavelength channels as well as to match the combiner wavelength grid. Heaters 102A for respective DFB lasers 102 may be comprised of a buried heater layer in proximity to the periodic grating of each DFB laser, embodiments of which are disclosed and described in U.S. Pat. No. 7,079,715, and incorporated herein by its reference. It should be noted that in employing a chip TEC 114 in combination with individual heaters 102A for DFB laser 102, it is preferred that TEC 114 function as a primary cooler for chip 100B be a cooler, rather than heater, so that the overall heat dissipation from chip 100B may be ultimately lower than compared to the case where TEC 114 is utilized as a heater to functionally tune the combiner wavelength grid. Where TEC 114 functions primarily as a cooler, a spatial heater 11 may be suitable for tuning the wavelength grid of combiner while TEC 114 functions as a primary cooler for chip 100B to maintain a high level of heat dissipation. Then, individual DFB lasers 102 may be tuned to their peak operating wavelengths and tuned to the combiner grid.

Reference is now made to the embodiment of FIG. 13 illustrating TxPIC chip 100C that is identical to chip 100A in FIG. 11 except for heaters 102, the addition of integrated PDs 105(1) . . . 105(N) positioned in EML optical paths between SOAs 104(1) . . . 104(N) and modulators 106(1) . . . 106(N). SOAs 104 are disposed between DFB lasers 102 and modulators 106 and PDs 105 are disposed between SOAs 104 and modulators 106. In order to obtain the desired total output power from DFB lasers 102, two alternatives are now described. First, initialization of lasers 102, a bias voltage is applied to PDs 105 for purposes of monitoring the output of the DFB lasers 102, attenuation, $\alpha_{bias}$, of the photodiodes may, themselves, result in an insertion loss. However, by adjusting the bias of SOAs 104, the total desired output power for a given EML stage of TxPIC chip 100C may be maintained. One benefit of PDs 105 is the provision of dynamic on-chip feedback without necessarily requiring pre-existing calibration data. Another benefit of PDs 105 is the enablement of the gain characteristics of SOAs 104 to be discerned. Second, during normal operation of TxPIC chip 100C, PDs 105 can function as passive components through the lack of any biasing, which, if bias existed, would provide some attenuation, $\alpha_{bias}$. When PDs 105 function more like a passive device, e.g., with no applied reverse bias, insertion losses associated with such in-line PDs 105 may be substantially eliminated. For many power monitoring applications, PDs 105 need not be operated as a reverse biased device and can even be slightly or partially positive bias to minimize any residual insertion loss and render them more transparent to the light from DFB lasers 102. Alternatively, a small portion, such as 1% or 2%, of the light in the EML optical path may be tapped off by deploying PDs 105 that include a blazed grating in the active/waveguide core, where the light is taken off-chip for other functions such as wavelength locking of lasers 102 or adjustment of the laser intensity. As in the previous embodiment of FIGS. 11 and 12, PDs 105 may be a PIN photodiode or an avalanche photodiode, where the former is preferred.

Thus, from the foregoing, it can be seen that during a test mode, prior to cleaving chip 100C from its wafer, PDs in FIG. 13 may operate as an in-line power taps of optical power from DFB lasers 102 to calibrate their operating characteristics. As previously indicated, after TxPIC chip 100C has been cleaved from its wafer, during its a normal operational mode, PDs 105 may be operated to be optically transparent in order to minimize their inline insertion losses, or may be slightly forward biased to further minimize any residual insertion losses or may be operated with selected reverse bias to adjust attenuation to a desired level.

Reference is now made to the embodiment of FIG. 14 illustrating TxPIC chip 100D, which is identical to FIG. 12, except there are PDs 109 following SOAs 108 in the optical paths, whereas in FIG. 12 PDs 107 precede SOAs 108. PDs 109 are beneficial for characterizing the total performance of all optical components upstream of these PDs, and hence, can be deployed as monitors of the total channel power before combiner 110. Furthermore, the insertion loss of optical combiner can be characterized by utilizing PDs 105 in combination with an additional photodiode integrated on chip 100D in a higher order Brillouin zone output of combiner 110 or positioned in the off-chip output 120 of optical combiner 120, as shown in FIG. 15.

Reference now is made to FIG. 15 illustrating TxPIC 100E, which is identical to TxPIC 100B in FIG. 12 except that there is shown a fiber output 120 optically coupled to receive the multiplexed channel signals from output waveguide 26 where a portion of the signals are tapped off fiber 120 via tap 122 and received by PD 124. PD 124 may be a PIN photodiode or an avalanche photodiode. As previously indicated, PD 124 may be integrated in wafer. PD 124, as employed on-chip, may be employed for testing the chip output prior to cleaving TxPIC chip 100E from its wafer, in which case the photodiode is relatively inexpensive to fabricate and would be non-operational or cleaved from the chip after use. PD 124 is coupled to receive a percentage, such as 1% or 2%, of the entire optical combiner output, permitting the optical power characteristics of TxPIC chip 100E to be determined during wafer level testing, such as for the purposes of stabilization of laser wavelengths and/or tuning of the wavelength grid response of optical combiner 110 to reduce insertion losses.

It should be noted that both SOAs, such as SOAs 108, or photodetectors, such as photodiodes 109, can further serve as optical modulators or as variable optical attenuators, in addition to their roles as monitors. Multiple of these functions can be performed simultaneously by a single photodetector, such as photodiode 124, or an integrated, on-chip photodiode at a first or higher order output of the multiplexer, or the functions can be distributed among multiple photodetectors. On-chip photodetectors can vary power by changing insertion loss and, therefore, act as in-line optical circuit attenuators. They also can be modulated at frequencies substantially transparent to the signal channel wavelength grid with little effect to modulate data that is not necessarily the customer's or service provider's data.

Additionally, optical combiner 110 may include integrated photodiodes at the output of optical combiner 110 to facilitate in locking the laser wavelengths and/or tuning of the grid of optical combiner 110 to reduce insertion losses. Additionally, PD 124 may be utilized to determine the high-frequency characteristics of modulators 106. In particular, PD 124 and associated electronic circuitry may be employed to determine a bias voltage and modulation voltage swing, i.e., the peak-to-peak voltage, required to achieve a desired modulator extinction ratio (ER) and chirp as well as to characterize the eye response of each modulator through application of test signals to each of the EA modulators 106. The bias voltage and voltage swing of the modulator may be varied. An advantage of having PD 124 integrated on chip 100E is that, after initial optical component characterization, the photodetector may be discarded by being cleaved off TxPIC chip 100E. An arrangement where photodiodes are integrated at the output of combiner 110 on the TxPIC chip is disclosed in FIG. 7 of U.S. Pat. No. 7,079,715, and incorporated herein by its reference. The ability to discard the photodetector has the benefit in that the final, packaged device does not include the insertion loss of the photodetector formerly employed to characterize the performance of the modulator during an initial characterization step.

Although particular configurations of SOAs and PDs are shown in FIGS. 11-15, it will be understood by those skilled in the art that more than one SOA may also be employed along any channel.

Referring now to FIG. 16, there is shown in-wafer, the chip die of TxPIC 100B, although other embodiments of FIG. 12 or 13-15 may be shown. A combination of photodiodes, both those inline with EML channels, such as PDs 101 and 109, as well as those off-line, not shown, which may be used to tap off optical power from an inline blazed grating PD or from tap off from output 112. Photodiodes may be located in several locations in TxPICs 100E in order to perform either on-substrate testing or inline testing when TxPICs 100E is operating "on-the-fly". Also, a probe tester can be utilized for testing the TxPICs. It should be noted that PDs 101 at the rear facet of DFB lasers 102 may be left on the final cleaved $T_x$PIC chip and utilized during its operational phase to set, monitor and maintain the DFB and SOA bias requirements.

FIG. 17 discloses, in flowchart form, a procedure for adjustment of the wavelength of the channel lasers, set to a predetermined grid wavelength, after which the on-chip SOAs may be adjusted to provide final appropriate output power. As seen in FIG. 17, first, a channel is selected at 130 in the TxPIC for testing. Next, at 132, the selected DFB laser is turned on and the output is checked via a photodiode, such as PDs 105 in FIG. 13, to generate data and provide calibrated data (134) as to whether the laser wavelength is off from its desired grid wavelength and by how much. This calibrated data is used to adjust the laser wavelength (136) by current or heater tuning. If the desired wavelength is not achieved (138), the calibration process is repeated. The change in wavelength may also change the optical power available since the power via applied current to the laser affects the amount of optical power. If optimized wavelength and optical power adjustment is achieved (138), then SOA, such as SOAs 104, is adjusted (140) to provide the desired output power for the laser. If all of the laser channels on the TxPIC chip have not been tested (142), the next laser channel is selected (146) and the process is repeated at 132. When the laser channel has been tested, the calibration data for all laser channels for the test TxPIC chip is stored at 144 for future use, such as for recalibration when the transmitter module in which the TxPIC chip is deployed is installed in the field. The stored data functions as a benchmark from which further laser wavelength tuning and stabilization is achieved.

Reference is now made to FIG. 18 illustrating another configuration for TxPIC 10 deploying dummy optical components to the edges of a wafer and/or edges of the PIC chips in order to maximize chip yield. These dummy components would be fabricated in the same way as the other optical components on the wafer using MOCVD. TxPIC 10 of FIG. 18 comprises a plurality of DFB lasers 12 and EA modulators 14 formed as integrated EML channels which are coupled to AWG 50 via integrated waveguides 24. On adjacent sides of these optical components are additional DFB lasers 12A and EA modulators 14A on one side and additional DFB lasers 12B and EA modulators 14B on the other side. These additional optical components are all shown as optically coupled to AWG 50. However, they need not be so connected to AWG 50. Furthermore, it is not necessary that bonding pads be connected to them. This will save chip space or chip real estate. The function of the dummy optical components is to take on the faulty attributes that occur to fabricated optical components at edges of wafers or chips. It is problematic that the areas of component defects due to wafer fabrication, such as growth and regrowth steps, lithography, and other processing steps will likely be at the edges of the wafer or boarder components on TxPIC chip edges where these extra dummy optical components reside. By employing these dummy components, the yield of useable wafers and good TxPIC chips will significantly increased.

Generally speaking from MOCVD fabrication experience as well as from backend chip processing experience, the component yield on any PIC chip with multiple optical components tends to decrease relative to either optical PIC chips formed at the edges of the wafer or optical components formed along the edges of the PIC chip. There are several reasons for this attribute. First, at the InP wafer level, an outer perimeter region of the wafer tends to have the greatest material non-uniformity and fabrication variances. An edge region of a PIC may correspond to one of the perimeter regions of the wafer and, hence, also have such significant variances. Second, the cleaving of the wafer produces the PIC dies. The cleaving process may adversely affect the edge optical components of the PIC die or these edge components may experience the greatest amount of handling.

Statistical methods are employed to form a map of edge regions having a reduced yield compared with a central region of a chip or die, or at the wafer level. The redundancy number of dummy optical components required in an edge region is selected to achieve a high yield of wafers where at least one of the dummy optical components is operable for testing or replacement of another failed component. As an illustrative example, if the yield in a central PIC region was 90% but dropped to 60% in an edge region, each dummy optical component in the edge region could include one or more redundant optical components to increase the effective dummy optical component yield to be at least comparable to the central region. It will also be understood that placing dummy optical components in edge regions may be practiced in connection with previously described embodiments.

To be noted is that the output waveguides 26 of AWG 50 in FIG. 18 is a vernier output in the first order Brillouin zone output of AWG 50. The optimum waveguide among the several waveguides shown is chosen based upon the waveguide exhibiting the best overall wavelength grid response.

It should be noted that with respect to the foregoing TxPIC chip and TRxPIC chip embodiments, provision should be made for circumvention of free carrier absorption due to two photon absorption in passive waveguides 26 from AWG 50. The output waveguide length from the optical combiner or AWG must allow sufficient output power to permit low error rate transmission but also must be below the limit for 2 photon absorption. The 2 photon absorption limit is about 20 mW total average power for all signal channels for an approximately 1 μm to 3 μm wide output waveguide.

Two photon absorption can occur in passive waveguide structures, particularly if sufficiently long to induce photon absorption in their waveguide core. There are several ways to circumvent this problem. First, reduce the peak intensity in the waveguide, either transversely or laterally or both. By rendering the mode to be less confined, i.e., making the mode larger, the chance for the onset for two photon absorption will be significantly reduced if not eliminated. Second, the peak intensity of the optical mode may be shifted so as not to be symmetric within the center of the waveguide, i.e., the peak intensity of the mode is asymmetric with respect to the cladding or confining layers of the guide as well as the center position of the waveguide core. This asymmetry can be built into the chip during its growth process. Third, increase the $E_g$ of core waveguides/cladding layers. In all these cases, the point is to reduce the peak intensity in some manner so that the threshold for two photon absorption is not readily achieved.

Another approach to reduce or otherwise eliminate the free carrier absorption due to two photon absorption is by hydrogenation of the waveguides in situ in an MOCVD reactor or in a separate oven. The process includes employing $AsH_3$, $PH_3$ and/or $H_2$ which creates $H^+$ atom sites in the waveguide layer material during component fabrication which dissipate or rid the waveguide of these absorption carriers.

Reference is now made to FIG. 19A illustrating another embodiment of TxPIC, which in the case here includes an extra or dummy EML signal channel beside each of the EML signal channels to be deployed for on-chip operation. As shown, extra DFB lasers 12EX and EA modulators 14EX are formed on chip 10 adjacent to a corresponding laser 12 and modulator 14 These sets of such lasers and modulators have the same bandgap wavelengths and lasing wavelengths. Thus, if a laser 12 or modulator 14 in an operating set would fail, the adjacent laser 12EX and modulator 14EX would be substituted in place of the failed EML channel set. Alternatively, it should be realized that, instead of functioning as replacement EML channel sets on chip 10, these extra EML channel sets can be deployed later, at an additional cost to the carrier provider, to further increase the signal channel capacity of the transmitter module. It should be realized that chip 10 can be made to include additional capacity not initially required by the service provider at a minimal cost of providing addition integrated EML channel sets on the chip which can be placed into operation at a later time. This is an important feature, i.e., the utilization of micro-PICs having multiple arrays of EMLs fabricated on the same chip.

Reference is now made to FIG. 19B illustrating TxPIC chip 10 with pairs of DFB lasers 12A and 12B for each EML channel to provide redundancy on TxPIC chip 10. Each of the lasers 12A and 12B are coupled to an integrated optical 2×1 combiner 13. Thus, the second DFB laser of each pair 12A and 12B, can be placed into operation when the other DFB laser fails to meet required specifications or is inoperative. This redundancy can be applied to modulators 14 as well. This feature can be combined with the dummy optical component feature set forth in FIG. 19A.

Reference is now directed to the TxPIC chip 10 in FIG. 20 which illustrates an embodiment of the contact layout strategy for EMLs on the chip. A multichannel TxPIC chip 10 has a substantial area compared to a conventional single semiconductor laser. Each optical signal source of a TxPIC requires driving at least one modulator section. Each modulator section requires a significant contact pad area for making contact to a microwave feed. This creates potential fabrication and packaging problems in routing microwave feeds across the substrate onto the modulator contact pads. As illustrated in the embodiment of TxPIC chip 10 in FIG. 20, as an example, the location of contact pads 171 for the modulators may be staggered to facilitate microwave packaging. Microwave contact pads 171 are coupled to modulators 14 for coupling RF signals to the modulator electrodes. Chip 10 is shown with eight EML channels optically coupled to optical combiner 16 for multiplexing the channel signals and placement on output waveguide 18 for coupling to an optical link. The important feature is that the EA modulators 14 are staggered relative to one another along the optical path between respective DFB lasers 12 and optical combiner 16. The purpose for this arrangement is to provide for easier electrical contact directly to the modulators 14 for signal modulation and bias. As shown in FIG. 20, co-planar microwave striplines 170, 172 and 174 are fabricated on top of the chip to each modulator 14 from contacts 171, where lead 170 is connected to a prepared opening to p-contact 173 and coplanar leads 172 and 174 are connected to a prepared opening to common n-contact 175. Contacts 175 are connected to the n-side of the modulator through a contact via provided in the chip, such as down to n-InP layer 38 in the embodiment of FIG. 6. The p-contact pad is connected to the contact layer, such as to contact layer 48 in the embodiment of FIG. 6. The modulators 14 are electrically separated from one another through etched channels prepared between the modulators which may extend down as far as the InP substrate 32 as shown in the embodiment of FIG. 6. Also, a bias lead (not shown) is connected to the n and p contacts to provide a bias midpoint for the voltage swing from peak-to-peak in modulation of the modulator. Also, bias leads 176 are also provided to each of DFB lasers 12 from edge contact pads 171 provided along the rear edge of chip 10. Thus, contact pads 171 for modulators 14 are provided along two side edges, as well as the rear edge, of chip 10, whereas contact pads 171 are provided along the rear edge of chip 10 for bias connection to DFB lasers 12.

Pad staggering can also be accomplished in several different ways. First, additional passive waveguide sections are included to stagger the locations of the optical modulators relative to a die or chip edge. For example, a curved passive waveguide section can be included in every other DFB laser to offset the location of the optical modulator and its contact pads. Second, the contact pads of modulator 14 are geometrically positioned relative to the chip edges to be staggered so that straight leads can be easily designed to extend from edge contact pads to the staggered modulator pads.

Reference is made to FIG. 20A which illustrates in graphic form the general waveforms for modulation of modulators 14. In FIG. 20, there is line 180 which is zero bias. Modulators 14 are modulated with a negative bias to provide low chirp with high extinction ratio. Thus, the voltage bias, $V_B$, is set at a negative bias at 182 and the voltage swing has a peak-to-peak voltage, $V_{PP}$, 184 within the negative bias range. The modulation of modulator 14 according to a data signal illustrates the corresponding modulator output at 186. One specific example of voltages $V_B$ and $V_{PP}$ is a bias voltage of $V_B = -2.5V$ and a swing voltage of 2.5V or $V_{PP} = -1.25V$ to $-3.75V$.

Reference is now made to the embodiment shown in FIG. 21 which is a perspective view of a TxPIC chip 10 in a submount and interconnects assembly. The assembly in FIG. 21 comprises a multi-layer ceramic, or other similar submount. As will be seen in the description of this embodiment, a submount 195 is mounted above TxPIC chip 10 and in close proximity to the high-speed modulation pads 173 and 175 on TxPIC chip 10. Transmission lines 198 and 200 are formed on submount 40. Microwave shielding may be included above the submount. In order to ensure that sufficient isolation is achieved between TxPIC 10 and submount 40, an airgap is formed between these two components, preferably which is in a range of values around 5 mils or 127 μm.

Each of the electro-optical modulators 14 of TxPIC chip 10 requires at least one microwave drive signal 200 and at least one common stripline 198. However, in the embodiment here, two common striplines 198 are utilized to reduce crosstalk between the striplines of adjacent striplines to be connected to adjacent modulators 14 on chip 10. RF striplines, comprising striplines 198 and 200, are formed on an array connector substrate 195, which may be made of a ceramic material, and which is spaced, such as by 50 μm, from the surface of TxPIC chip 10 as seen at airgap 193. The forward ends of striplines 198 and 200 are respectively contacted to p-contact pads 173 and common n-contact pads 175 by means of bonding wires 196B as shown in FIG. 21. Alternatively, these connections can be made by wire ribbon bonding or with a flexible circuit cable.

Chip 10 may be supported on CoC submount 190 which includes patterned conductive leads 191 formed on a portion of submount 190. These leads may, for example, be comprised of TiW/Au. Submount 190 may, for example, be comprised of AlN. These patterned leads 191 end at contact or bonding pads 191A along the rear edge of chip 10. The bias signals provided on leads 191 are transferred to on-chip contact or bonding pads 191B (which may have a 100 μm pitch on TxPIC 10) by means of a wire bonded ribbon 196A, or alternatively, a flexible circuit cable, where the respective ribbon leads are connected at one end to contact or bonding pads 191A and at the other end to respective contact or bonding pads 191B for DFB lasers 12. The additional patterned leads are utilized for connecting to on-chip laser source heaters and on-chip monitoring photodiodes.

An important feature of the embodiment of FIG. 21 is the deployment of an L-shaped substrate 192 that has a thickness greater than the thickness of chip 10 so that the mounting of array connector substrate 195 on the top of L-shaped substrate 192 will provide for the micro-spacing of around 5 mils or 127 μm between chip 10 and substrate 195 so that no damage will occur to chip 10, particularly during the backend processing of connecting conductor leads to chip 10. Thus, substrate 192 may be cantilevered over TxPIC chip 10 or a support post may be provided between substrate 192 and substrate 195 at corner 199.

The assembly in the embodiment of FIG. 21 is concluded with top cover 194 over substrate 195 which substrate is shown micro-spaced from the top of substrate 195 with spacer substrates 195A and 195B to provide spacing over RF striplines 197. Cover 194 may be made of AlN or alumina and is provided for a microwave protection shield for the microstriplines 198 and 200 as well as provided for structural support, particularly the suspended portion of the assembly platform (comprising components 195, 195A and 194) which overhangs TxPIC chip 10 as seen at 199. Cover 194 also includes cutout regions 194A and 194B where cutout region 194B provides for tool access to make the appropriate connections 196B to the forward ends of striplines 198 and 200 respectively to bonding pads 175 and 173 of electro-optic modulators 14. The rearward ends of striplines 198 and 200 are exposed by cutout region 194A for off-chip assembly connection to a signal driver circuit as known in the art.

A conventional alternative to the deployment of microwave striplines 197 is to use wire bonding connections. However, it is not practical to use conventional wirebonds to route a large number of microwave signals to PIC bonding pads. This is due, in part, to the comparatively large area of the PIC that would be required to accommodate all the wire bond pads, and the wirebonds would have to traverse a distance as long as several millimeters to reach all of the modulators. Also, the length of such wirebonds would create an excessively large wire inductance and, therefore, would not be feasible. Additionally, the microwave cross-talk between the bonding wires would be excessive. The high speed application required by TxPIC 10 for higher speed data rates requires a transmission line with impedance matching to the drive circuit which is difficult, if not impossible, to achieve with wire bonding. Thus, it is more suitable to deploy a flexible circuit microwave interconnect, such as the type shown at 196A, to couple RF or microwave striplines 197 formed on substrate 195 to contact pads 173 and 175 of each modulator 14. A flexible microwave interconnect is an alternative to wirebonds 196A for two reasons. First, they provide a reduction in assembly complexity. Second, they provide reduced inductance for wirebonds of equivalent length. A flexible circuit microwave interconnect is a microwave transmission line fabricated on a flexible membrane, e.g., two traces spaced apart with a signal trace therebetween to form a co-planar microwave waveguide on a flexible membrane, and providing at least one ground stripline for each signal stripline. However, in the embodiment of FIG. 21, two ground striplines are shown which provides for less signal interference due to crosstalk with other coplanar stripline groups. Each flexible microwave interconnect at 196B would preferably have a contact portion at its end for bonding to bonding pads 173 and 175 of a respective modulator 14 using conventional bonding techniques, such as solder bonding, thermo-compression bonding, thermal-sonic bonding, ultra-sonic bonding or TAB consistent with wire ribbon bonding and/or flexible cable interconnects.

It should be realized that TxPIC 10 may be flip chip mounted to a submount, such as an alumina, aluminum nitride (AlN), or a beryllium oxide (BeO) submount. The submount is provided with patterned contact pads. In one approach, the submount includes vias and microwave waveguides for providing the signals to the modulators. Conventional flip chip soldering techniques are employed to mount the PIC electrical pads to such a submount. The solder is preferably a solder commonly used for lasers, such as gold-tin, or lead-tin. A gold-gold thermo-compression bonding process may also be employed. General background information on flip-chip packaging technology is described in the book by Lau, et al., Electronic Packaging: Design, Materials, Process, and Reliability, McGraw Hill, N.Y. (1998) which is incorporated herein by its reference. Some background information on microwave circuit interconnect technology is described in the book by Pozar, Microwave Engineering, John Wiley & Sons, Inc. NY (1998).

There is a significant packaging cost associated with providing separate DC contact pads for driving each semiconductor laser, such as in an array of DFB lasers or DBR lasers. Driving a group of semiconductor lasers simultaneously reduces the number of DC pin outs and DC interconnect paths required, which permits a substantial reduction in PIC area and packaging complexity, reducing PIC costs. As an example of one approach, all of the DFB lasers sources 12 on a TxPIC 10 are driven in parallel. Alternatively, groups of laser sources, e.g., three laser sources, are coupled in parallel. For multi-section laser sources having a primary drive section and a tuning section, the drive sections of groups of lasers may be driven in parallel. Driving laser sources in parallel reduces the packaging cost and the number of DC pin outs required. However, it also requires that the laser sources have a low incidence of electrical short defects. Moreover, in embodiments in which groups of laser sources are driven in parallel, it is desirable that the laser sources have similar threshold currents, quantum efficiencies, threshold voltages, and series resistances. Alternatively, the lasers may be driven in parallel, as described above, with the current to each laser source being tuned by trimming a resistive element couple in the electrical drive line to the laser source. Such trimming may be accomplished by laser ablation or standard wafer fabrication technology etching. The former may occur in chip or wafer form whereas the later is in wafer form. The trimming is done after the L-I characteristics are measured and determined for each laser.

Reference is now made to FIG. 22 which illustrates, in schematic form, the use of a probe card 200 containing a plurality of contact probes 206A and 206B, such as, for example, one for each inline optical active component, e.g., inline laser sources and their respective modulators, for each PIC chip to provide wafer level reliability screening before or after wafer burn-in or die cleaving. The probe card 200 comprises a card body 202 which is supported for lateral movement over a PIC wafer by means of rod support 206. The top surface of probe card 200 includes a plurality of test IC circuits 204A and 204B which are connected, via connection lines 208A and 208B formed in the body of card 200, to a plurality of rows of corresponding contact probes 206A and 206B as shown in FIG. 22. Only six such contact probes 206A and 206B are seen in FIG. 22 but the rows of these probes extend into the plane of the figure so that there are many more contact probes than seen in this figure. A sufficient number of contact probes 206A and 206B are preferably provided that would simultaneously contact all contact pads on a single TxPIC 10 if possible; otherwise, more than one probe card 200 may be utilized to check each chip 10. As seen in the example of FIG. 22, TxPIC in wafer 11 includes rows of contacts 212 and 214, extending into the plane of the figure and formed along the edges of each TxPIC 10, thereby surrounding the centrally located active electro-optical and optical passive components in region 210 internal of the chip 10. Probe card 200 can be laterally indexed in the x-y plane to test the PICs and determine their quality and their potential operability prior to being cleaved from the chip. This testing saves processing time of later testing of individual, cleaved chips only to find out that the chips from a particular wafer were all bad.

With the foregoing processing in mind, reference is made to the flowchart of FIG. 23 illustrating a procedure for wafer level testing the output power of the semiconductor lasers with inline, integrated PDs which may later be rendered optically transparent when the PICs are cleaved from the wafer.

As shown in FIG. 23, a probe card 200 is centered over a PIC to be tested in wafer and brought into contact with its contact layers to first drive at least one of the semiconductor lasers 12 (220). Note, that a back or bottom ground contact may be also made for probe card testing. Next, a modulator 14 is driven with a test signal (222). This is followed by setting the bias to the inline PD, such as PDs 105 and/or 109 in FIG. 16 (224). This is followed by measuring the power received by the PD (226) as well as measuring, off-chip, the operation of the laser, such as its output intensity and operational wavelength (227). If required, the tested laser wavelength is tuned (228). After all the lasers have been so tested, calibration data for each PIC on the wafer is generated (230) and stored (232) for use in future testing before and after backend processing to determined if there is any deterioration in the optical characteristics in any PIC. It should be noted that probe card 200 includes PIC identification circuitry and memory circuitry to identify each wafer level PIC as PIC testing is carried out so that the PICs tested can be easily later identified and correlated to the stored calibration data (232).

Reference is now made to FIGS. 24A and 24B which disclose TxPIC architectures designed to minimize interference at the PIC output waveguide 26 of any unguided or stray light propagating within TxPIC chip 10 and interfering with the multiplexed channel signals in waveguide 26 thereby deteriorating their extinction ratio as well as causing some signal interference. It should be noted that electro-optic integrated components, particularly if SOAs are present, produce stray light that can propagate through the chip. It can be particularly deleterious to the multiplexed output signals, deteriorating their quality and causing an increase in their BER at the optical receiver. In FIG. 24A, TxPIC 10 is similar to previous embodiments comprising an array of EMLs consisting of DFB laser 14 and EA modulators 14 coupled, via waveguides 24, to AWG 50. In the case here, however, it is to be noted that the arrays of EMLs are offset from AWG 50 and, furthermore, there is provided an isolation trench 23, shown in dotted line in FIG. 24A, to block any stray, unguided light from the EML arrays from interfering with output waveguides 26.

FIG. 24B is an alternate embodiment of FIG. 24A. In FIG. 24B, the orientation of the active components of TxPIC chip 10 are such that both the laser and modulator arrays are at 90° C. relative to the output waveguides 26 and the Brillouin zone waveguides 234A and 236A of AWG 50. This PIC architecture optimally minimizes the amount of unguided stray light that becomes captured by the AWG output waveguides 26 and, therefore, does not appear as noise on the multiplexed channels signals thereby improving the extinction ratio of the outgoing multiplexed signals on one or more waveguides 26. The extinction ratio loss from this stray light may be as much 1 dB. Wavelength selective combiner 50 may also be an Echelle grating.

FIG. 24C is an alternate embodiment of FIG. 24B. In the case here, rather than deploy a selective wavelength combiner, such as AWG 50 in FIG. 24B, a free space or power combiner 50C is instead utilized. The advantages of using power combiner 50C is that its insertion loss relative to frequency is not dependent on temperature changes or variations that occur due epitaxial growth as in the case of a wavelength selective combiner. However, it has significantly higher insertion loss for multiple signal channels, which insertion loss is dependent of critical dimension variation. Such a power combiner is desirable in systems implementation wherein the link budget is not limited by the launch power. That is, the reach of the system decreases sub-linearly with the decrease in launched power from the TxPIC. Also, such a TxPIC minimizes the amount of required temperature tuning as there is no need to match the grid of the combiner to that of the grid of the transmission sources.

FIGS. 25-29 disclose the deployment of Mach-Zehnder modulators 240 in TxPIC chip 10 in lieu of EA modulators 14. As previously described, in the case where the lasers themselves are not directly modulated, each semiconductor laser source is operated CW with its output optically coupled to an on-chip optical modulator. A high speed optical modulator is used to transform digital data into optical signal pulses, such as in a return-to-zero (RZ) or non-return-to-zero (NRZ) format. Optical modulation may be performed by varying the optical absorption coefficient in an EAM, relative to the absorption edge illustrated in FIG. 30, or refractive index of a portion of the modulator, such as a Mach-Zehnder modulator (MZM) illustrated in FIG. 28.

In FIG. 25, TxPIC chip 10 comprises an array of DFB lasers 12 respectively coupled to an array of Mach-Zehnder modulators (MZMs) 240. The outputs of MZMs 240 are coupled to an AWG 50 via waveguides 24 as in the case of previous embodiments. As is well known in the art, each MZM 240, such as best shown in FIG. 28, comprises an input leg 240C, which includes DFB laser 270 and may also include an on-chip SOA, which leg forms a Y coupling junction to separate phase legs or arms 240A and 240B and an output leg having a Y coupling junction connecting the arms 240A and 240B to output leg 240C, which includes a waveguide 272 to a multiplexer and also may optionally include an on-chip SOA. As seen in FIGS. 26-28, MZM 240 includes phase altering contacts 264A and 264B. The operation of MZM 240 is well known in the art.

FIGS. 26-28 disclose one example of an InGaAsP/InP-based MZM 240. The structure shown is epitaxially grown using MOCVD and comprises a substrate 242 upon which is epitaxially deposited cladding layer 244 of n-InP, followed by waveguide Q layer 246 of InGaAsP or AlInGaAs, followed by layer 248 of n-InP, which is followed by buffer layer 252 of n-InP. Next is active Q layer 254 of InGaAsP or AlInGaAs, followed by epitaxial growth of layer 256 of NID-InP followed by cladding layer 258 of p-InP. Then, an etchback is performed which is followed by a second selective growth comprising cladding layer 260 of p-InP and contact layer 261 of p$^+$-InGaAs. This is followed by the deposit of a passivation layer 262 which, for example, may be comprised of $SiO_2$. Next, p-side contacts 264A and 264B are formed, after a top portion of passivation layer 262 is selectively etched away, as well as the formation of the n-side contact 266. A similar MZM is shown U.S. Pat. No. 6,278,170, which patent is incorporated herein by reference. The principal difference between the MZM shown in this U.S. patent and the MZM in FIGS. 26 and 27 is the presence in the embodiment herein of waveguide Q layer 246.

By applying a voltage in at least one arm of the MZM, the refractive index is changed, which alters the phase of the light passing through that arm. By appropriate selection of the voltage in one or both arms, a close to 180° relative phase shift between the two light paths may be achieved, resulting in a high extinction ratio at the modulator output. As described below in more detail, MZMs have the advantage that they provide superior control over chirp. However, MZM modulators require more PIC area than EAMs and may require a somewhat more complicated design as well for high-speed modulation, such as 40 Gb/s or more.

Reference is now made to FIG. 29 which illustrates a modified form of the MZM 240 illustrated in FIG. 28. It is desirable in deploying a MZM as the modulator of choice to also provide means to prevent the "extinguished" or stray light from the modulator from deleteriously coupling into other optical components of the TxPIC chip or any other PIC chip for that matter. This is because the "extinguished" light, i.e., light not leaving the exit port of the MZM due to destructive interference at its exit port, may couple into other nearby optical components, resulting in deleterious optical crosstalk. A variety of techniques may be employed to suppress deleterious cross-talk associated with the "extinguished" light. For example, an absorber region may be disposed in the substrate or in an extra arm provided on the MZM output as illustrated in FIG. 29. In FIG. 29, an absorber region 278 is positioned at the end of the extra output arm 276 of MZM 240X coupled at output coupling crosspoint 274. This absorber region 278, for example, may be composed of a semiconductor or non-semiconductor material. Alternatively, a higher order grating or other deflector, such as an angled facet, may be formed at region 278 to direct the "extinguished" light out of the chip or into proximity of a buried absorbing layer or region. Furthermore, the placement of a monitor photodiode (MPD) at 278 may be utilized at the end of extra arm 276 to serve the function of an absorber and which can further provide the additional function of an optical monitor of the optical parameters of the signal output of MZM 240Z.

An EAM or MZM may be characterized by its extinction ratio, which is governed by its on/off ratio. A high extinction ratio increases the signal-to-noise ratio (SNR) at the optical receiver such that a high extinction ratio is generally desirable in order to achieve a low bit error rate (BER) at a downstream optical receiver. A modulator should also possess low insertion loss, $IL_{out}$ (dB)=10 $\log_{10} P_{out}/P_{in}$, corresponding to the loss between its input and output ports. A modulator typically also has a chirp parameter, which expresses the ratio of phase-to-amplitude modulation. The chirp parameter is proportional to the ratio: $\Delta n/\Delta \alpha$, where $\Delta n$ is the differential change in refractive index and $\Delta \alpha$ is the differential change in absorption.

The modulator chirp may be adjusted to compensate for chromatic dispersion in the fiber link. Typically, a modulator having a negative chirp parameter is desirable in order to achieve a maximum transmission distance on standard optical fibers having negative chromatic dispersion. In chirping, the laser wavelength may move to the short-wavelength side (negative chirp) or to the long wavelength side (positive chirp) as the amplitude of the output light is modulated via the modulator. A negative chirp is desirable to suppress dispersion induced broadening of optical pulses that occurs in a conventional optical fiber at certain wavelengths.

An electro-absorption modulator (EAM) has an optical absorption loss that typically increases with an applied voltage. In an EAM, a bias voltage may be selected so that the electro-absorptive material is biased to have a high differential change in absorption loss for microwave voltage inputs.

A Mach Zehnder phase modulator utilizes changes in refractive index in the modulator arms to modulate a light source. A Mach Zehnder modulator, such as MZM 240 in FIG. 25, receives CW light and splits the light between two arms 240A and 240B. An applied electric field in one or both arms creates a change in refractive index due to the shift in absorption edge to longer wavelengths. In general, a band-edge MZ modulator achieves large phase changes due to large absorption changes at the band edge via the Kramers-Kronig relation. However, a non-band edge MZ modulator achieves its phase change via the electro-optic effect or based on the Franz-Keldysh effect. At the output of the modulator, the two split signals are joined back together at the Y-shaped coupling section, shown in FIG. 28, or a directional coupler shown in FIG. 29. Destructive interference results if the relative phase shift between the two signals is 180 degrees. At very high data rates, traveling wave techniques may be used to match the velocity of microwave pulses in the electrodes of a modulator to optical signal pulses.

As illustrated in FIGS. 30 and 31, an EA modulator is designed to have appropriate wavelength shifts from the band edge 283 of the absorption curve 281, shown in FIG. 30, where the absorption shift or loss is a primary consideration change at a given wavelength in achieving the desired modulation effect while any changes in index in the material is important for chirp. This is in comparison to band edge (BE) Mach-Zehnder modulators which have a larger wavelength shift to consider from the band edge and where the change in refractive index in an arm of the modulator can be a significant index change because it is a function of changes in absorption at all wavelengths from the band edge. So in an EAM, the range of operation is designed to be in the region of greater absorption loss changes relative to the band edge whereas the BE-MZM can operate in regions of much less absorption loss changes.

The typical absorption edge curve 281 is shown in FIG. 30. The Y axis parameter of FIG. 30 is the $\alpha$ or absorption of the EAM modulating medium and the X axis of FIG. 30 is the wavelength. The absorption band edge 283 is where the absorption strongly changes with wavelength, i.e., for example, a high increase in absorption over a relative short range of wavelength change, which may be about 20 nm. In operation, the DC bias of the EAM is chosen such that the wavelength of the band edge is close to the wavelength of the DFB laser light so that a small modulating electrical field across the modulator produces a large change in absorption.

As shown in FIG. 31, an electro-absorption modulator may comprise a PIN photodiode structure that is reverse biased to create an electric field across an active region which may be low bandgap material, such as a high refractive index Group III-V compound or may be comprised one or more quantum wells of such material. The applied electric field shifts the absorption edge to longer wavelengths (lower energy). As shown in FIG. 31, the EAM 280 comprises a substrate 282 upon which is epitaxially deposited a cladding layer of n-InP 284, followed by a Q waveguide layer 285, thence a cladding layer 286 of n-InP, followed by Q etch stop layer 288 of InGaAsP or AlInGaAs. This is followed by the epitaxial deposit of a NID-InP layer 290 and thence a multiple quantum well active Q region 292 where the electro-optic effect takes place, followed by a cladding layer of p-InP and contact layer 296 of p+-InGaAs. An etchback is performed to form loaded rib ridge waveguide for EAM 280. The etchback is performed to etch stop layer 288 forming a ridge waveguide that includes layers 290, 292, 294 and 296.

In quantum wells, the shift in absorption edge can be more pronounced than that in bulk layers due to quantum size effects. By appropriately selecting the band edge in the modulator to be above the absorption edge, a large shift in refractive index is possible for quantum well structures. Details of designing quantum well structures for modulators are described in the book by Vladimir V. Mitin, et al., Quantum Heterostructures: Microelectronics and Optoelectronics, Cambridge University Press, NY (1999).

The transmission lines used to couple microwave signals to the optical modulators are preferably impedance matched. This is particularly important for traveling wave modulator embodiments that may require more microwave power due to the increased interaction length. Also, resistors may be integrated into the PIC and are coupled to each microwave transmission lines to achieve impedance matching.

By varying the quantum well structure, the absorption edge may be shifted relative to the lasing wavelength to increase the relative effective absorption and changes in refractive index. An electroabsorption modulator is commonly operated in a regime in which increasing reverse bias voltage increases the absorption. Typically, quantum well electroabsorption modulators must be operated in a high absorption region to obtain a negative chirp, leading to high insertion losses. See, e.g., the article, "Design of InGaAsP Multiple Quantum-Well Fabry-Perot Modulators For Soliton Control," Robert Killey et al., pp 1408-1414, IEEE Journal of Lightwave Technology, Vol. 17(8), August 1999, which is incorporated herein by its reference. Also, an important advantage of an EAM, particularly relative to use in a PIC, is that it occupies less space on a PIC chip than a MZM.

In contrast, in a phase modulator, such as a Mach Zehnder modulator, the reverse bias voltage may be selected for any voltage range over which there is a substantial change in refractive index. This permits the voltage bias and voltage swing of a quantum well Mach Zehnder modulator to be selected to achieve a negative chirp with a low insertion loss compared with an electro-absorption modulator. It will be understood that any known Mach Zehnder modulation technique may be employed, including both single-arm and two-arm modulation. However, using two-arm modulation of MZMs is desirable to control chirp. MQW Mach Zehnder modulators have the benefit that a controllable negative chirp may be achieved at a bias voltage for which insertion losses are acceptable. The modulator, for example, may be a band-edge Mach Zehnder modulator. In a band-edge MZM, the bandgap wavelength of the MZM arm sections is slightly shorter in wavelength than the channel wavelength. The absorption edge of a band-edge MZM is thus near the channel wavelength such that comparatively small voltage swings are required to achieve a large shift in refractive index. An advantage of band-edge MZMs is that comparatively small voltages and/or arm lengths are required due to the large refractive index shifts possible. However, each band-edge MZM modulator requires that its band edge be selected to be close to the channel wavelength of its corresponding laser. Multiple regrowths or selective area growth techniques may be used to adjust the band edge energy of each MZM relative to its corresponding laser.

Also, any known velocity-matched traveling wave modulator configuration may be beneficially employed to improve the efficiency of the modulator for achieving high data rates. In a traveling wave modulator the electrode of the modulator is used as a transmission line. In a traveling wave modulator the velocity of microwave signals traveling along the modulator electrodes is preferably matched to the velocity of light traveling along the optical waveguide of the modulator. A traveling wave modulator has a high 3-dB bandwidth. Additionally, a traveling wave modulator may have a substantial optical interaction length. The long potential interaction length of a traveling wave modulator permits greater freedom in selecting a bias voltage and voltage swing to achieve a controlled chirp, a high extinction ratio, and a low insertion loss.

The bias voltage of the modulator may be selected to achieve a negative chirp appropriate for a particular fiber link relative to its fiber length and fiber type. Also, a different DC bias may be selected for each modulator in the TxPIC chip. For example, an EA modulator preferably has a bandgap that is between about 20 nm to about 80 nm shorter in wavelength than that of its laser for optimal chirp and extinction ratio characteristics. In principle, each modulator could have an active region that is grown (using regrowth or selective area regrowth) to have a predetermined difference in bandgap with respect to its laser. However, in a TxPIC for providing a substantial number of channel wavelengths, this may require a comparatively complicated growth process. It is preferable, in terms of device fabrication, to have a small number of different active layer bandgaps. Consequently, it is within the scope of this invention to independently DC bias each on-chip modulator to adjust its desired chirp characteristics. As an illustrative example, a 1V change in DC bias (e.g., from −2V to −3V) in an EAM can accommodate a DFB laser wavelength variation of about 25 nm.

It should be noted that it may be difficult, in some cases, to achieve the desired chirp, extinction ratio and insertion loss using this biasing technique. Thus, as discussed earlier, it may be necessary to vary both the peak wavelength of the laser array as well as that of each modulator. A preferred technique to realize such a laser array is with selective area growth (SAG), which is disclosed and discussed in U.S. Pat. No. 7,058,246. In a preferred selective area growth approach, a pattern of mask openings is fabricated in $SiO_N$ layer or another suitable dielectric material. The size of the mask openings and or the width of the masks forming the openings for the different DFB lasers, which are to be fabricated, are varied so that there is a resulting wavelength variation across the DFB array. Similarly, the modulator wavelength is varied by having a larger opening (to create a larger bandgap) multiple quantum well region that varies across the array. Note, however, that the DFB wavelength is ultimately determined by the grating pitch. The necessity for selective area growth across the array arises from the need to shift the gain peak across the array. In general, better laser characteristics are obtained if the gain peak is in close proximately, e.g., within about 10 nm, or somewhat longer wavelength than the lasing wavelength selected by the grating. The placement of this peak does not require high precision. Thus, a different SAG window may not need to be employed for each laser. The alignment of the modulator bandgap to that of the laser is the more precise parameter, especially where the chirp, low insertion loss, and high extinction ratio are required. Thus, in almost all cases, the openings of the SAG mask as well as the mask widths will need to be varied across the array of modulators.

The extinction ratio of the modulator may be characterized during an initial testing, such as by employing a PIC optical detection element to form eye diagrams as a function of the bias voltage and voltage swing of the modulator for a simulated series of modulator "ones" and "zeros." The chirp may be characterized at the TxPIC chip level during testing employing known techniques, such as by measuring the linewidth of a particular channel as it is modulated. Calibration data of bias voltages and voltage swings required to achieve a desired extinction ratio for selected chirp levels may be stored on a computer readable medium. Additionally, calibration data of insertion loss as a function of modulator parameters may also be acquired to permit the SOA drive current and/or PIN photodiode bias to be correspondingly adjusted to maintain a desired channel power as the modulator parameters are varied. As previously indicated, the calibration data for controlling modulator and SOA and/or PIN photodiode parameters can be stored in a programmable memory, such as an EPROM, and packaged with the PIC for use by the end user or customer.

The modulator operating parameters of bias voltage and voltage swing may be controlled through feedback data received from an optical receiver via the optical link. In a high data rate channel close to the dispersion limit, a positive chirp increases the BER while a negative chirp decreases the BER.

Similarly, a high extinction ratio tends to decrease the BER while a low extinction ratio tends to increase the BER. A forward error correction (FEC) chip in the optical receiver may be employed to determine the BER of each signal channel. This information may be forwarded to the TxPIC transmitter in a variety of ways, such as through an electrical control line or through an optical service channel. The operating parameters of bias voltage and voltage swing of the modulator of a channel are adjusted using data received back relative to its channel BER. Chirp control of the modulators is derived from information received relative to the BER data from the receiver communicated to the TxPIC transmitter or transceiver via an optical service channel. An electronic controller in the TxPIC transmitter employs this data to tune the bias voltage and/or voltage swing of the modulator to adjust its chirp to achieve the desired BER based upon characteristics of a particular fiber type comprising the optical span or link.

The chirp parameter of a quantum well EA modulator is a function of the change in absorption characteristics and refractive index of the modulator with bias voltage. Typically, a voltage bias may be selected over a range within which the chirp parameter shifts from positive to negative. However, as previously indicated, it is preferred to operate with negative bias voltage and negative swing to produce the best chirp with the highest extinction ratio (ER) as indicated in connection with respect to FIG. 20A.

As previously indicated, it is desirable to have a controlled chirp selected to achieve a maximum fiber transmission length appropriate for the channel wavelength and the fiber type. One way to adjust the characteristics of the optical modulator is to select one or more layers in the absorber section to have a controlled absorption edge with respect to the lasing wavelength. Methods to control the absorption characteristics of the modulator as a function of applied electric field include using regrowth techniques to grow materials with selected composition and thickness in the modulator region and using MOCVD selective growth techniques to grow quantum wells in the modulator having a pre-selected difference in absorption band edge compared with the laser section. Alternatively, the modulator may comprise cascaded or tandem electro-absorption modulators, one of which is illustrated in FIG. 14 of U.S. Pat. No. 7,079,715. A first electro-absorption modulator may be used to generate periodic string of pulses at a clock frequency (e.g., 10 GHz). The pulses may be amplified by an on-chip SOA. A second electro-absorption modulator may be used to provide a gating function to put data on the generated pulses. One benefit of this embodiment is that it permits the use of a RZ signal format. Additionally, by appropriately setting the electro-absorption modulator parameters, a controlled chirp may be achieved. The SOA provides compensation for the insertion loss of the modulator.

In another embodiment, a saturable absorber may be coupled to the output of the modulator. In this case, a first modulator stage, such as a multi-section EA modulator, may be used to generate optical data pulses. An integrated saturable absorber section (SAS) receives the output of the first modulator stage and has non-linear transmission properties. If the output of first modulator stage is low, corresponding to an off-state, the SAS is absorptive, further decreasing the amplitude of the signal in the off-state. However, if the output of the first modulator stage is high, the absorption of the SAS saturates, resulting in comparatively low losses for the on-state. A benefit of employing a SAS is that it increases the extinction ratio of a modulator.

The SAS can be placed along the optical signal source path anywhere after the modulator. For example, the SAS is placed immediately after the modulator or after a following on-chip SOA. An important benefit of placing the SAS downstream from the SOA is that it suppresses SOA ASE noise for "zero" signals, resulting in an improvement of the OSNR. The SAS is preferably fabricated from a quantum well active region that has saturable losses at the channel signal wavelength. The SAS may be a reverse biased, partially unpumped, or completely unpumped region. Any known technique to reduce the recovery time of the SAS may be employed, such as ion implantation. An unpumped SAS has the benefit of simple fabrication. However, a reverse biased SAS may provide more stable operating characteristics for higher data rates and modulation.

Generally speaking, the design of the modulator may include theoretical or empirical studies to select a quantum well structure having an absorption edge that varies with applied voltage relative to the channel wavelength such that a desired extinction ratio and negative chirp may be achieved. The extinction ratio and chirp effects depend also upon the bias voltage of the modulator, which should be set to achieve the desired chirp with an acceptable insertion loss.

It should be understood that in connection with all of the modulator embodiments described herein, a SOA within the optical signal path may be employed to compensate for insertion loss associated with adjusting the bias voltage of the modulator to achieve a desired chirp. The present invention permits simultaneous wavelength locking, selection of output channel power, and tuning of modulator operating characteristics to achieve a desired extinction ratio and chirp. Also, if desired, an electronic controller for the PIC may include calibration data and/or feedback algorithms for regulating these parameters. The chirp parameter may be set in the factory or in the field.

Another feature herein is the employment of SAG for fabrication of band-edge (BE) MZ modulators so that their size can be monotonically changed across the modulators in the modulator array to have appropriate absorption curves relative to its respective laser source. The use of SAG provides an approach where the size of such a modulator is reduced compared to other types of modulators, since they are shorter in length, thereby taking up less area or real estate on the PIC chip. Such BE MZ modulators may be deployed in less costly TxPICs with tunable chirp.

Reference is now made to FIG. 32 which illustrates the temperature tuning of different TxPIC chips 300 and 302 which have the same wavelength grid at room temperature. For the purposes of simplicity, it is assumed that each TxPIC 300 and 302 has been designed, employing SAG growth techniques, to have four DFB lasers with a wavelength grid of $\lambda_1, \lambda_2, \lambda_3,$ and $\lambda_4$. As seen in FIG. 32, the desired wavelength grids of multiple TxPICs 300 and 302 are achieved by providing each TxPIC chip with its own TEC 304 and 306, respectively. The tuning rate for DFB lasers on these TxPIC chips is in the range of about 0.1 nm/° C. The temperature tuning range is typically about 10° C. to about 40° C., with wavelength tuning range, therefore, of about up to 3 nm for each laser source. The tuning rate of the DFB lasers can be compared to AWGs 50 which is about 0.11 nm/° C.

TxPICs 300 and 302 are tuned via TEC at $T_1$ so that the first TxPIC 300 has a wavelength grid of $\lambda_1, \lambda_2, \lambda_3,$ and $\lambda_4$ and tuned via TEC at $T_2$ so that the second TxPIC 302 has a wavelength grid of $\lambda_5, \lambda_6, \lambda_7,$ and $\lambda_8$, forming a total wavelength grid 308 as illustrated in FIG. 33. Thus, the second TxPIC 302 is tuned to a higher temperature ($T_2>T_1$) so that it has a wavelength grid of longer wavelength channels where the wavelength spacing relative to both chips may be at 100 GHz or 200 GHz. An interleaver, such as interleaver 318 shown in FIG. 34, may also be coupled to receive the channel outputs from TxPICs 300 and 302 where the interleaver may have a smaller predetermined grid spacing, such as 50 GHz. Temperature adjustment of the wavelength peaks and corresponding grid of the respective TxPICs may be achieved such that the desired grid spacing is obtained and maintained at the interleaver.

Reference is now made to FIG. 34 which illustrates an example of multiple TxPICs 310 with multiple wavelength outputs optically coupled via waveguides 316 to an 8×1 interleaver 318. Each of the TxPIC chips 310 have a SML array 312 providing plural signal channels to optical combiner 314. As shown in the example of FIG. 34, there are eight TxPIC chips 310 with the respective generated wavelength grids shown in FIG. 34. TxPICs may be heated at different levels to each achieve a desired tuned wavelength grid relative to a standardized wavelength grid. Each one of the chips 310 may have a wavelength grid spacing of 200 GHz whereas the spacing of the interleaver wavelength grid may be 50 GHz. The configuration of heaters on each TxPIC chip 310 comprises individual laser heaters and a PIC TEC cooler (not shown). The individual TxPIC wavelength grids, two of which are shown in FIG. 34A, can then be tuned to have the proper grid spacing relative to the interleaver wavelength grid so there is an interleaved grid spacing for the multiple interleaved grid wavelengths of TxPICs 310 at 50 GHz as illustrated in FIG. 34B. The output from interleaver 318 is provided to link 328 via booster amplifier 326, which may be an EDFA.

The output from interleaver 318 also includes a 2% tap 320 for diverting a portion of the output via fiber 321 to wavelength locker 322. Wavelength locker includes conversion of the optical signal into one or more electrical signals, amplification of the electrical signals and partitioning of the signals into a plurality of separate signals corresponding to individual elements of the modulated sources, such as the source wavelength. The locker 322 deploys signal filters for each of the wavelengths relative to each respective SML array wavelength grid to determine if the respective grid wavelengths are off the desired wavelength grid. If a wavelength deviates from the desired wavelength, a correction signal is generated and transmitted, via a digital to analog converter (DAC), to the respective TxPIC 310 for wavelength change via lines 323. The correction signal is employed at PIC circuitry at the TxPIC chip to either change the current applied to the laser source to change the laser wavelength to the correct operating wavelength or change the current applied to laser source heater to change the wavelength to the correct operating wavelength. Of course, other tuning methods as known in the art may be utilized.

The interleaving as shown in FIG. 34B is discussed in more detail with respect to FIGS. 35A and 35B. Relative to the employment of a plurality of TxPIC chips in a transport network, the output interleaved channel spacing in an interleaver is equal to the initial channel spacing divided by a power of two, depending upon interleaver design. FIGS. 35A and 35B disclose respective systems of interleaving and multiplexing channel signals. In general, the interleaving of different TxPIC chip wavelengths, as shown in FIG. 35A, allows for ease in the DFB tolerances thereby avoiding the close on-chip wavelength spacing across the array spacing resulting in relaxing requirements imposed upon the fabrication of a wavelength selectable combiner. The system illustrated in FIG. 35A permits the fabrication of four channel wavelength-different, four channel TxPICs 10 with grid wavelengths design, as shown from $\lambda_1$ to $\lambda_{16}$. As seen, on-chip grid wavelength spacing is easily achieved using a grid wavelength spacing of 200 GHz. With the deployment of interleaver 318 the wavelength spacing between interleaved optical channels is 50 GHz, as shown in FIG. 35. This is an important feature since it has not been known to utilize a plurality of InP chips with multiple channels per chip, such as the multiple TxPICs 310 in FIG. 34, having a given number of signal channels provided with a larger wavelength spacing, easing the requirements in the manufacture of the integrated combiners. The wavelength grid required for the AWG is now larger, e.g., 200 GHz, instead of 50 GHz, where the number of grating arms of the AWG is inversely proportional to wavelength spacing so that fewer arms on the AWG are required as the wavelength spacing is increased. Fewer arms in an AWG translates to easier fabrication and potentially reduced AWG and chip size. Also, the epitaxial requirements are less stringent such as uniformity relative to composition and layer thickness and targeting requirements in MOCVD growth are reduced. This, in turn reduces the cost of manufacture of TxPICs by virtue of having a higher yield with more acceptable TxPIC chips per wafer. In summary, multiple TxPICs with plural channels can be fabricated with less stringent tolerances, providing for higher chip yields per wafer, by having larger on-chip wavelength spacing between signal channels, such as 200 GHz. The TxPIC chip outputs can sequentially be interleaved at smaller wavelength spacing, such as 50 GHz. This interleaving of FIG. 35A is preferred for long haul networks, having the advantage of tuning individual PICs to the proper wavelength grid while reducing their fabrication tolerances.

The channel multiplexing system in FIG. 35B is possibly preferred for metro networks. Channel multiplexing in FIG. 35B provides for sequentially combined TxPICs. In this application, the wavelengths are typically spaced further apart (e.g., about 200 GHz). This larger spacing results in reduced requirements for the DFB wavelength tolerances required across the array as well as for the AWG tolerances, significantly reducing the cost of the TxPIC. Metro networks typically deploy less channels, and hence utilize wider channel spacing. If interleaved TxPICs were utilized in conjunction with such channel spacing, the ability to fabricate these TxPICs would push the limits of the fabrication processes. For example, an interleaved channel spacing of 200 GHz requires that the channels for each TxPIC be on an 800 GHz grid. Such large channel spacings are difficult for TxPICs that utilize larger channel counts, e.g., 10 channels or more. Furthermore, a simple multiplexing element is considerably less costly than an interleaving element. Thus, a low-cost, low channel count system preferably utilizes multiplexed TxPICs rather than interleaved TxPICs. Note here that the TxPIC costs are also reduced in addition to the cost of the passive optical components. In FIG. 35B the multiple four channel TxPICs are initially fabricated with a 200 GHz wavelength spacing on each chip and are multiplexed to provide wavelengths with 200 GHz spacing.

Reference is now made to FIG. 36 which illustrates an optical transport network deploying a de-interleaver and red/blue demultiplexers. For simplicity of description only a unidirectional network is shown, although the principle explained can also be applied to a bidirectional network. The network of FIG. 36 comprises, on the transmit side, a plurality of TxPICs 310 (eight in the example here) each with an SML channel array (four signal channels shown here), as shown and described in connection with FIG. 34, including feedback wavelength locker 322. The description of FIG. 34 also applies here, except that the multiplexed signal outputs from TxPICs 310 are provided to an 8:1 multiplexer 317, rather than an 8:1 interleaver 314, for combining as an output on optical link 328. For example, the wavelength spacing of the channel signals at TxPIC chips 310 may be 200 GHz for each TxPIC or 4×200 GHz, and on link 328 may be 50 GHz for thirty-two combined channel signals or 32×50 GHz via multiplexer 317.

At the receiver side, there is a group (eight in the example here) of RxPIC chips 340 each comprising, at its input, an optical decombiner 344, such as an AWG, and a plurality (four in the example here) of photodiodes, which may be PIN photodiodes or avalanche photodiodes. To be noted is the lineup of the RxPIC chips 340 on the receiver side is not the same as the lineup of TxPICs 310 on the transmitter side, i.e., the RxPIC chip lineup is RxPIC 1, 5, 2, 6, 3, 7, 4 and 8. Also, at the input from optical link 328, there is a 4×1 de-interleaver 330 that de-interleaves groups of channel signals into pairs of red/blue signal groups corresponding to respective groups of channel signals at TxPICs on the transmitter side. Thus, for example, the output on waveguide 332(1) would be eight channels, or two groups each of four channels, with channel spacing of 200 GHz or 8×200 GHz. By red/blue groups, it is meant groups of shorter and longer signal channels. Thus, again, in the case of waveguide 332(1), the red group (relative to channels from TxPIC 1) is $\lambda_1$-$\lambda_4$ (4×200 GHz) and the blue group (relative to channels from TxPIC 5) is $\lambda_{17}$-$\lambda_{20}$ (4×200 GHz).

The advantage of the network deployment of FIG. 36, particularly on the receiver side is that the employment of de-interleaver 330 reduces the number of grating arms required in the AWG decombiners 344 because the wavelength channels are divided into red/blues groups with large wavelength separations at 200 GHz. This eases the fabrication specifications for RxPIC chips 340 reducing the requirements of the filtering function of the AWGs 344. By reducing the number of AWG grating arms, there is less concern about epitaxial uniformity across the AWG field during MOCVD growth. Also, there is chance of producing phase errors because of greater distribution of the channels signals through a greater number of grating arms. Thus, de-interleaver 330 of FIG. 36 provides a narrow band filter which is of a relatively wide passband AWG 344 on each RxPIC 340. RxPIC AWGs 344 require stringent crosstalk specifications for low noise output channel signals for optimum detection at PD arrays 342. This leads to the use of more grating arms utilized in AWGs 344, usually several more such grating arms. Also with a tightening of channel spacing such as 100 GHz or even 50 GHz requires additional grating arms for optimum filtering of the channel signals. Thus, these two requirements increase the need for additional grating arms. However, the deployment of interleaver 330 in FIG. 36 reduces these requirements on the number of grating arms for AWGs 344 since the channel spacing of channels reaching the AWG or multiplexer is wider. Therefore, the filter passband of the wavelength grid of the AWGs can be wider, easing the fabrication requirements in the design and growth of AWGs 344.

Also, the de-interleaver/channel RxPIC combination significantly reduces costs through the reduction in the number of required demultiplexers 334 (only four instead of eight in the example here) as well as the number of optical fiber connections. Relative to the concept of providing less fiber connections in an optical transmitter module, note that the number of demultiplexers in the embodiment here are cut in half and, correspondingly, also a number of fiber connections are cut in half. Further, four channels being integrated on each RxPIC chip translates to a four to one reduction in necessary fiber connections compared to the conventional deployment of discrete signal channel components presently deployed throughout today's optical transport networks.

The interleaver 317 and de-interleaver 330 are currently available in different forms such as from JDS Uniphase, e.g., their IBC interleaver, e.g., 50/100 GHz or 100/200 GHz passive interleavers.

It is within the scope of this invention that the optical transport network of FIG. 36 service, for example, both the L band as well as the C band. In this case, a C/L band demultiplexer would precede de-interleaver 330 to direct, for example, the C band channels to this de-interleaver, while the L band channels would be directed to a corresponding L band de-interleaver (not shown) and a corresponding array of RxPICs 340. Also an optical amplifier, such as a EDFA, may be positioned between the C/L demultiplexer and the respective C band and L band de-interleavers to provide gain to the channel signals. Such an optical amplifier may also be utilized in the network of FIG. 36, being positioned just before the input of de-interleaver 330.

Reference is now made to FIG. 37 which illustrates a TxPIC 10 coupled to a low-cost wavelength locking system 350. As shown in FIG. 37, each DFB laser source 12 has a laser driver 364. The approach of FIG. 37 is characterized by employing AWG 50 to wavelength lock the laser source array 12, i.e., matching the wavelength grid of the passband of AWG 50 to the operating wavelengths of DFB lasers 12. The embodiment here disclosed illustrates a TxPIC chip 10 with ten signal channels. Wavelength locking will allow for tighter signal wavelength channel spacing and more efficient use of the available optical spectrum. The method here utilizes unique identifying tags, such as different dither or tone frequencies, associated with each DFB laser source 12. These tags can also be deployed for other purposes, such as, very low cost per-channel power monitoring.

While tones have been chosen to illustrate a particular form of optical modulation useful for channel identification and signal processing for wavelength locking, other modulation formats such as multitone, spread spectrum, square wave, tone burst, etc. are envisioned, depending on specific signal processing requirements. Similarly, while the variable optical attenuator role of the photodetectors has been discussed in connection with equalization of optical channel powers emerging from the Tx PIC, more general relationships among individual optical channel powers are envisioned. In particular, pre-emphasis, i.e., the deliberately arranging unequal individual optical channel powers from the transmitter to compensate for channel-dependent unequal losses in transmission links, is envisioned and enabled by the variable optical attenuator function on individual optical channels.

It should be further noted that on-chip photodiodes can be deployed to encode the signal channel with additional information useful for signal channel identification, wavelength locking, or data transmission additional to that encoded by modulators 14. As an illustration, one such photodiode can have its bias voltage modulated by a sine wave or square waves, unique to the particular optical channel, to label the optical channel for use in channel identification and wavelength locking without demultiplexing the optical channels. Other modulations (tone burst, spread spectrum, multitone, etc.) can be used similarly for these purposes. On-chip photodiodes can also be used as voltage variable optical attenuators, useful for controlling individual optical channel powers.

The passband of an optical component, such as an AWG, a WDM filter or fiber grating(s), in a transmitter TxPIC 10 can be employed also as a way of directly locking the laser source wavelength or multiple laser source wavelengths in the TxPIC transmitter to the passband of such an optical component.

An AWG, for example, has a Gaussian passband for each laser source wavelength, and can be employed as a frequency differentiator in order to lock the laser source wavelength directly to the AWG passband. The locking can be achieved by dithering the drive currents of the corresponding laser sources at a low frequency, such as 1 KHz, 2 KHz . . . 10 KHz, one of which is illustrated at 370 in FIG. 38. A different dither or tone frequency is provided for each DFB laser source 12 via tone frequency driver or generator 366 in each drive current path to DFB lasers 12. In FIG. 38, the frequency of the dither is indicated at 372 and its amplitude is indicated at 374. The modulation depth 376 is controlled such that the laser source frequency shift is appropriate for the AWG passband and control loop electronics of system 350, i.e. the resulting amplitude variations are just sufficient for the loop electronics at 350 to comfortably distinguish the laser source tags from one another.

The amplitude variations 374 resulting from dithering are low frequency (low KHz range) which can be ignored or may be filtered out at the network optical receiver end and will have negligible impact on BER or jitter specifications, beyond the impact of lowering the average optical power at the receiver. The slow wavelength variations will not impact the system performance since the instantaneous linewidth appears fixed for any given large bit pattern, e.g., approximately $10^6$ bits for OC-192.

It is possible to utilize the method of stabilization of FIG. 37 to assign a different dither frequency to each laser source 12 on TxPIC chip 10 so that a single tap 320 and photodetector 351 can provide sufficient feedback for all DFB laser sources 12. Here, 1% tap coupler 320 is placed after the output of TxPIC chip 10 and a single photodetector 351 is employed to simultaneously detect all ten signal channels. The detected electrical signal is amplified via electrical amplifier 352. The ten different signal channels are then separated by electronic filters 358(1) . . . 358(10), comprising 1 KHz filter 358(1), 2 KHz filter 358(2) . . . 10 KHz filter 358(10), centered around each of the laser source tone frequencies. Low speed feedback circuitry 360 then completes the loop via feedback lines 362 to the respective DFB laser source current drivers 364. Circuit 360 determines if the peak wavelength of the respective laser sources is off peak, and by how much, from a predetermined peak or off-peak wavelength desired for the respective laser sources. The information relating to predetermined peak or off-peak wavelengths is stored in memory in circuit 360 and is obtained through initial factory testing of the wavelengths of the individual laser sources 12 relative to the passband of the wavelength grid of AWG 50. The digital values obtained for differences between the off-set from the desired wavelength values for each laser source are converted from digital format to analog format, via a digital-to-analog converter (DAC), within circuitry 360, and provided to laser source current drivers 364 for changing the drive current levels to DFB lasers 12 to correspondingly tune and optimize their operating wavelengths to substantially match the wavelength grid of AWG 50. As mentioned in several previous embodiments, a TEC unit may be utilized with chip 10 and/or a local heater may be employed for AWG 50. Also, instead of, or in addition to, adjusting driver current to laser sources 12, each of the laser sources 12 may be provided with an adjacent heater strip (not shown) to be employed to tune the wavelengths of the individual laser sources 12. In general, any known conventional tuning elements or method may be employed instead of heating. Other wavelength tuning elements include: adding multiple sections to the laser and varying the current in each section (including, phase tuning, which is the provision of a phase section in a DFB or DBR laser), vernier tuning where the best passband response is chosen from multiple outputs of the optical multiplexer, the use of coolers to tune the wavelength grid or individual elements of the PIC, including TECs which are also shown in connection with the embodiments herein, and stress tuning such as through the use of bi-metals. Thus, any wavelength tuning contemplated herein comprises wavelength tuning controlled by changes in temperature, voltage and current, or bandgap.

The use of unique dither frequency "identifying tags" for each laser source 12 also allows a single photodetector 351 and circuitry 360 to perform diagnostics on the transmitter TxPIC chip 10, such as insuring uniformity in power per channel. In the embodiment shown in FIG. 37, the PIC output power for each signal channel can be determined employing a single photodetector as is used for the wavelength locking. The average power seen on each dither frequency "identifying tag" can be calibrated to the associated channel output power and the overall DC photocurrent can be calibrated to the total PIC output power. The PIC per channel launch power is one of the most important optical link diagnostics.

The concept of employing unique identifying tags for each laser source may also be extended to cover multiple TxPICs, such as, to the array of TxPIC chips 310 shown in FIG. 36, by employing different sets of dither frequencies for different PIC chips. The dither frequencies may, for example, be in the range of low frequencies of about 10 KHz to about 100 KHz, although this range can extend on either side of this specific range as exemplified in the embodiment of FIG. 37 where the range of tone frequencies is from 1 KHz to 10 KHz. These channel tags are also highly useful in allowing monitoring of any channel in the transmitter network, particularly at the optical receiver side, with a single tap, photodetector, and accompanying low-speed electronic circuitry to detect and monitor incoming individual channels signals.

Thus, in partial summary of the embodiment shown in FIG. 37, an external tap coupler 320 at the output of TxPIC 10 couples a small portion of the multiplexed signal to external photodetector 351. An integrated photodetector on chip 10, such as either PD 235A or 235B, may also be used for the same purpose. Each DFB laser 12 has its driver current modulated by a dither current, a low frequency AC component having a modulation depth 376 and frequency at 374. The AC modulation current causes a corresponding low frequency variation in laser wavelength which is sufficiently small in intensity as to not affect the detection quality of photodiode arrays in Receiver RxPIC chips. Electronic frequency filters 358 permit the response at each dither frequency to be measured from the photodetector response. Feedback electronic circuitry 360 also provides a control loop for adjusting the dither modulation depth 376 and bias point of the frequency dither. Since each laser 12 has its own unique dither frequency, its wavelength and power response may be identified by using a lock-in technique to analyze the frequency response of the photodetector at the dither frequency.

A controller may monitor the change in power output at the dither frequency and employ a control loop to approach an operating point centered on the peak of the AWG passband. It should also be understood that dithering for purposes of monitoring can be performed relative to only one laser on the TxPIC 10 while the wavelength of the other on-chip lasers are initially locked to a standardized grid wavelength. In the case here, it is preferred that all of the laser sources have been characterized to substantially have the same wavelength shift response so that any determined wavelength change for the one monitoring laser may also be may made to the other on-chip lasers. Alternatively, more than one laser with different tone frequencies may be used for this purpose. Thus, every laser may be dithered and independently locked or just a few lasers, like two or more lasers, may be dithered and locked, or only one laser, sequentially one at a time on the TxPIC, is dithered and wavelength locked. In this latter mentioned alternative, one channel may be locked, and the other channels adjusted based on the offset in temperature/current required to lock the one laser. Alternatively, the locking may be cycled sequentially among lasers. If the array locking is cycled, an interpolation method may be used for some of the channels. It should be understood that in all of the foregoing cases, where one or more or all of lasers are locked to the peak of the AWG passband response, the laser wavelength may, as well, be locked to either side edge of the passband response rather than the peak.

Other embodiments for detection of a small portion of the AWG multiplexed signal output include an integrated optical detector on chip 10 for detecting the dithered output of AWG 50 using an integrated waveguide tap or other on-chip coupling means. Alternatively, a detector or photodiode may be directly coupled to the second slab waveguide region to receive a $2^{nd}$ order output signal directly from output slab 54. In general, AWG 50 is designed to couple multiplexed signal channels into its $0^{th}$ order Brillouin zone. Some power is always coupled to higher order Brillouin zones, e.g., $1^{st}$ and $2^{nd}$ order Brillouin zones. The light focused in slab 54 on the higher order Brillouin zones is a replica of the $0^{th}$ order cone. As an illustrative example for an AWG with an output star coupler loss of approximately 1 dB, the total power in the $1^{st}$ Brillouin zone is approximately 10 dB lower than the power in the $0^{th}$ Brillouin zone. The power coupled to higher order Brillouin zones may be tapped for on-chip optical detection. An integrated optical detector, e.g., a PIN photodiode, may be located at the focal point of a higher order Brillouin zone as previously indicated. Alternatively, a waveguide may be placed at the focal point of a higher order Brillouin zone to couple the higher order Brillouin zone power to an optical detector, such as waveguide 234A to Brillouin zone 234 or waveguide 236A to Brillouin zone 236 and photodetector 235A or 235B.

The advantages of wavelength locking system 350 in FIG. 37 are: (1) Wavelengths can be locked in a low cost manner using a minimum of additional components (a 1% tap, photodetector, and some very low speed electronic circuitry) due to the deployment of an already existing on chip AWG 50 providing for filtered frequency differentiation, (2) The laser source wavelength grid is automatically aligned substantially to the AWG wavelength grid, (3) The same setup can be employed for any arbitrary channel spacing which is set by the AWG parameters and (4) The use of unique identifying tags for each channel can be utilized for other purposes such as per-channel power diagnostics at substantially no added cost.

Alternatively relative to the embodiment shown in FIG. 37, AWG 50 may be designed to also include an additional channel and the TxPIC may be fabricated to include an extra on-chip laser source employed for wavelength locking all of the laser sources relative to the wavelength grid of AWG 50. A TxPIC may have a first order Brillouin zone, an extra set of waveguides in the AWG where the light is tapped directly off at the second free space region or slab via a integrated detector or is provided with a passive waveguide from each extra waveguide output from the second free space region to a PD integrated on the TxPIC. In either case, a pair of on-chip photodetectors, such as PDs 235A and 235B in FIG. 37, is arranged with a respective photodetector positioned on adjacent sides of the passband center of a particular wavelength being monitored or the passband wavelength center of the AWG itself. In either case, the amount of wavelength offset from the wavelength grid of the AWG can be measured and utilized to re-center the laser wavelength grid to the AWG grid. In the particular embodiment of FIG. 37, PIN photodiodes 235A and 235B are fabricated in the higher order +/−Brillouin zones, e.g., the −1 and +1 Brillouin zones 234 and 236, of AWG 50. The two photodiodes 235 are disposed to detect on opposite sides of the AWG passband. Each DFB laser may be dithered at the same frequency or a different frequency. A DFB laser 12 is aligned to the AWG passband when its wavelength is tuned such that the two photodiodes 235A and 235B have a balanced AC output, i.e., outputs of the same magnitude. More generally, a balanced ratio between these AC photodiodes can be deployed as a setpoint for a reference. For the purposes of making this passband test for each DFB laser 12 on TxPIC chip 10, the DFB lasers may be each dithered sequentially, one at the time, at the same tone frequency or at different tone frequencies, i.e., all at once.

Additional output waveguides and/or detectors may be placed off-center at the output edge of the slab waveguide region to receive light, for example, from a dummy channel formed on the TxPIC chip. Two photodetectors may be arranged adjacent to the passband center of the dummy channel wavelength. In this approach, a dummy laser, comprising the dummy channel, is coupled as an input to first slab 52 of AWG 50. AWG 50 may include two dummy channel output waveguides and corresponding dual photodiodes positioned to receive light at wavelengths, for example, $\lambda_d + \Delta\lambda$, and $\lambda_d - \Delta\lambda$, where $\lambda_d$ is a dummy channel target wavelength and $\Delta\lambda$ is a wavelength offset from the target dummy wavelength. When the dummy channel wavelength is tuned to its target wavelength, both optical detectors will have a desired ratio of power levels. The dummy laser may be tuned in wavelength until the power ratio is correctly set in the two spatially disposed photodiodes at $\lambda_0 + \Delta\lambda$ and $\lambda_0 - \Delta\lambda$, where $\lambda_0$ is center wavelength. When the power ratio is correctly set, the center wavelength $\lambda_0$ is aligned to, for example, the passband center frequency of the AWG. The detector scheme of employing two discrete, spatial photodiodes is known in the art but the use, as explained herein, in connection with TxPIC chips disclosed in this application has not been previously disclosed as far as the applicants know.

In all of the foregoing AWG dithering embodiments, a single on-chip laser out of a plurality of such on-chip laser sources may include a dither tone for the purpose of wavelength locking of all of the other laser sources.

The passband response of the AWG will depend upon the refractive index of the AWG. For example, the refractive index of each AWG may be adjusted by temperature tuning, as previously explained. The passband response of the AWG may be characterized in the factory to set an operating temperature of the AWG for which the passband response of the AWG is aligned to the ITU wavelength channel grid, i.e., the peak transmissivity of the AWG is approximately aligned with the desired wavelength channels to achieve acceptable insertion loss level.

The output of TxPIC 10 may include an inline optical amplifier 326 to boost the multiplexed signal launched onto optical fiber link 328. Amplifier 326 may, for example, be an EDFA. The output of TxPIC chip 10 may also include variable optical attenuator (VOA) 327 to attenuate or otherwise extinguish any output signal on optical link 328 during the startup and calibration phase of chip 10 and feedback system 350 until a steady, stabilized operating state is reached. This calibration phase includes the checking and tuning of the individual wavelengths of DFB lasers 12 on chip 12 for their optimized operating wavelengths substantially matching the wavelength grid of AWG 50. When the calibration phase is complete, VOA 327 is turned off to permit the normal transmission of multiplexed channel signals on optical link 328. In this way, an optical receiver will not receive calibration data confusing to the operation of such an optical receiver. It should be carefully understood that VOA 327 is not the only component to perform such a shut-off function, as there are other optical components that could also perform this function, such as an optical switch or a Mach-Zehnder interferometer, to switch out any optical power during the calibration phase.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A photonic integrated circuit chip comprising:
   a substrate;
   a plurality of optical sources provided on the substrate, each of the plurality of optical sources providing a corresponding one of a plurality of modulated first optical signals, each of the plurality of modulated first optical signals having a corresponding one of a plurality of wavelengths;
   an optical combiner provided on the substrate, the optical combiner having a first side including a plurality of inputs and a plurality of outputs and a second side including an input and an output, each of the plurality of inputs of the first side of the optical combiner configured to receive a corresponding one of the plurality of modulated first optical signals, the optical combiner configured to combine the plurality of modulated first optical signals and supply a first WDM channel signal at the output of the second side of the optical combiner, the input of the second side of the optical combiner configured to receive a second WDM signal, the optical combiner configured to decombine the second WDM signal into a plurality of second optical signals; and
   a plurality of photodetectors provided on the substrate, each of the plurality of photodetectors configured to receive a respective one of the plurality of second optical signals and generate a corresponding one of a plurality of electrical signal.

2. The photonic integrated circuit chip of claim 1 further comprising a plurality of optical amplifiers provided on the substrate, each of the plurality of optical amplifiers having an input configured to receive a corresponding one of the plurality of second optical signals, each of the plurality of optical amplifiers having an output coupled to a corresponding one of the plurality of photodetectors.

3. The photonic integrated circuit chip of claim 2 wherein each of the plurality of optical amplifiers is a semiconductor optical amplifier.

4. The photonic integrated circuit chip of claim 1 wherein each of the plurality of photodetectors is a PIN photodiode, an avalanche photodiode, or a metal-semiconductor-metal photodiode.

5. The photonic integrated circuit chip of claim 1 wherein the optical combiner comprises a star coupler, a multimode interference coupler, an arrayed waveguide grating or an Echelle grating.

6. The photonic integrated circuit chip of claim 1 wherein the plurality of second optical signals are coupled to first order Brillouin zones at the first side of the optical combiner.

7. A photonic integrated circuit chip comprising:
   a substrate:
   a plurality of optical sources provided on the substrate, each of the plurality of optical sources providing a corresponding one of a plurality of modulated optical signals, each of the plurality of modulated optical signals having a respective one of a plurality of wavelengths, the plurality of wavelengths conforming to a first wavelength transmission grid;
   an optical combiner provided on the substrate and having a plurality of inputs and an output, each of the plurality of modulated optical signals being supplied to a corresponding one of the plurality of inputs of the optical combiner, the optical combiner configured to supply a WDM signal at the output of the optical combiner; and
   a wavelength tuner provided on the substrate, the wavelength tuner being configured to tune each of the plurality of wavelengths, such that the plurality of wavelengths conform to a second wavelength transmission grid.

8. The photonic integrated circuit chip of claim 7 wherein the wavelength tuner includes a heater configured to adjust a temperature of the photonic integrated circuit chip.

9. The photonic integrated circuit chip of claim 7 wherein the wavelength tuner includes a circuit configured to adjust one of a voltage and a current supplied to the plurality of optical sources.

10. An optical transport network comprising:
    a first photonic integrated circuit chip including a first plurality of optical sources and a first optical combiner, each of the first plurality of optical sources providing a corresponding one of a first plurality of optical signals, each of the first plurality of optical signals having a respective one of a first plurality of wavelengths, the first plurality of optical signals being supplied to the optical combiner and combined into a first optical signal group;
    a second photonic integrated circuit chip including a second plurality of optical sources and a second optical combiner, each of the second plurality of optical sources providing a corresponding one of a second plurality of optical signals, each of the plurality of second optical signals having a respective one of a second plurality of wavelengths, the second plurality of second optical signals being supplied to the second optical combiner and combined into a second optical signal group;
    an optical multiplexer configured to receive the plurality of first and second optical signal groups and combine the plurality of first and second optical signal groups into a WDM signal supplied at an output of the optical multiplexer;
    a de-interleaver coupled to receive the WDM signal, the de-interleaver having a first de-interleaver output and a second de-interleaver output, such that the first optical signal group and the second optical signal group are output from the first de-interleaver output;
    a first demultiplexer having a first output and a second output, the first demultiplexer being configured to supply the first optical signal group from the first output of the first demultiplexer and supply the second optical signal group from the second output of the first demultiplexer;

a third photonic integrated circuit chip having a second demultiplexer, the second demultiplexer having a plurality of outputs, the second demultiplexer being configured to receive the first optical signal group and demultiplex the first optical signal group such that each of the first plurality of optical signals is supplied from a corresponding one of the plurality of outputs of the second demultiplexer; and a fourth photonic integrated circuit chip having a third demultiplexer, the third demultiplexer having a plurality of outputs, the third demultiplexer being configured to receive the second optical signal group and demultiplex the second optical signal group, such that each of the second plurality of optical signals is supplied from a corresponding one of the plurality of outputs of the third optical demultiplexer.

11. The optical transport network of claim 10 wherein the first plurality of wavelengths and the second plurality of wavelengths are in the C band or the L band.

12. The optical transport network of claim 10 wherein the first plurality of wavelengths and the second plurality of wavelengths are in the C band and the L band, respectively.

13. A photonic integrated circuit chip comprising:
a substrate;
a first plurality of optical sources provided on the substrate, each of the first plurality of optical sources providing a corresponding one of a first plurality of optical signals each of the first plurality of optical signals having a respective one of a plurality of wavelengths;
a second plurality of optical sources provided on the substrate, each of the second plurality of optical sources providing a corresponding one of a second plurality of optical signals, each of the second plurality of optical signals having a respective one of the plurality of wavelengths; and
an optical combiner provided on the substrate, each of the first and second pluralities of optical sources being coupled to the optical combiner.

14. The photonic integrated circuit chip of claim 13 wherein each of the first plurality of optical sources and each of the second plurality of optical sources includes a modulated semiconductor laser, or a combination of a semiconductor laser and an electro-optic modulator.

15. A photonic integrated circuit chip comprising:
a substrate;
a plurality of optical sources, each of the plurality of optical sources comprises a first semiconductor laser, a second semiconductor laser, and an electro-optic modulator, the first semiconductor laser providing a first continuous wave output to the electro-optic modulator, the second semiconductor laser providing a second continuous wave output to the electro-optic modulator, the first and second semiconductor lasers independently operated to provide one of the first or the second continuous wave outputs to the electro-optic modulator; and
an optical combiner provided on the substrate, each of the plurality of optical sources being coupled to the optical combiner.

16. A photonic integrated circuit chip comprising:
a substrate;
a plurality of optical sources provided on the substrate, each of the plurality of optical sources including a corresponding one of a plurality of semiconductor lasers and a corresponding one of a plurality of Mach-Zehnder modulators, each of the plurality of optical sources providing a corresponding one of a plurality of optical signals, each of the plurality of optical signals having a corresponding one of a plurality of wavelengths;
an optical combiner provided on the substrate, the optical combiner combining the plurality of optical signals into a WDM signal supplied at an output of the optical combiner;
a plurality of epitaxial semiconductor layers formed on the substrate wherein one of the plurality of epitaxial semiconductor layers includes an active layer and another of the plurality of epitaxial semiconductor layers is a signal waveguide layer, the signal waveguide layer being spatially separated from the active layer;
each of the plurality of Mach-Zehnder modulators including a corresponding one of a plurality of ridge waveguides, each of the plurality of waveguides including a corresponding portion of the active layer.

17. The photonic integrated circuit chip of claim 16 wherein the signal waveguide layer is buried beneath each of the plurality of ridge waveguides.

18. The photonic integrated circuit chip of claim 16, further comprising a saturable absorber provided on the substrate, wherein each of the plurality of Mach-Zehnder modulators has a first and a second output, the first output coupled to the optical combiner and the second output coupled to the saturable absorber.

19. The photonic integrated circuit chip of claim 16, further comprising a photodiode provided on the substrate, wherein each of the plurality of Mach-Zehnder modulators has a first and a second output, the first output coupled to optical combiner and the second output coupled to the photodiode.

* * * * *